US011011970B2

(12) United States Patent
Okawauchi et al.

(10) Patent No.: US 11,011,970 B2
(45) Date of Patent: May 18, 2021

(54) GATE DRIVE CIRCUIT

(71) Applicant: ROHM CO., LTD., Kyoto (JP)

(72) Inventors: Yuta Okawauchi, Kyoto (JP); Yusuke Nakakohara, Kyoto (JP); Ken Nakahara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/900,336

(22) Filed: Jun. 12, 2020

(65) Prior Publication Data
US 2020/0313537 A1 Oct. 1, 2020

Related U.S. Application Data

(63) Continuation of application No. 16/771,995, filed as application No. PCT/JP2018/042479 on Nov. 16, 2018.

(30) Foreign Application Priority Data

Dec. 12, 2017 (JP) ................... 2017-237685
Apr. 16, 2018 (JP) ................... 2018-078349

(51) Int. Cl.
H03K 17/687 (2006.01)
H02M 1/08 (2006.01)
H02M 3/158 (2006.01)

(52) U.S. Cl.
CPC ............. *H02M 1/08* (2013.01); *H02M 3/158* (2013.01); *H03K 17/6871* (2013.01)

(58) Field of Classification Search
CPC .......... H02M 7/42; H02M 7/48; H02M 7/487; H02M 7/501; H02M 7/4826; H02M 7/497; H02M 7/49; H02M 7/4807; H02M 7/537; H02M 7/5387; H02M 7/53; H02M 7/533; H02M 7/53871; H02M 5/40; H02M 5/42; H02M 5/44; H02M 5/443; H02M 5/45; H02M 5/4505; H02M 5/451; H02M 5/452; H02M 5/458; H02M 5/4585; H02M 5/293; H02M 5/297; H02M 5/275; H02M 5/22;
(Continued)

(56) References Cited

U.S. PATENT DOCUMENTS 5,402,052 A 3/1995 Cheng et al.
2005/0001659 A1 1/2005 Inoshita
(Continued)

FOREIGN PATENT DOCUMENTS

CN 1065960 11/1992
DE 102004031369 2/2005
(Continued)

OTHER PUBLICATIONS

Japan Patent Office, International Search Report for PCT/JP2018/042479 dated Feb. 19, 2019 with English translation.

*Primary Examiner* — Bryan R Perez
(74) *Attorney, Agent, or Firm* — Fish & Richardson P.C.

(57) ABSTRACT

A gate drive circuit, which drives a gate of a first transistor, includes a first switch on a high potential side and a second switch on a low potential side connected in series at a second connection node between a high potential end and a low potential end of a series connection structure, constituted of a first voltage source and a second voltage source connected in series at a first connection node; and a third switch and an inductor connected in series between the first connection node and the second connection node. The gate of the first transistor can be electrically connected to the second connection node.

13 Claims, 46 Drawing Sheets

(58) Field of Classification Search
CPC .. H03K 17/161; H03K 17/302; H03K 17/56; H03K 17/567; H03K 17/60; H03K 17/687; H03K 17/6871; H03K 17/16; H03K 17/30; H03K 17/601; H03K 17/64; H03K 17/691; H03K 17/731; H03K 17/10; H03K 17/102; H03K 17/107; H03K 17/12; H03K 17/122; H03K 17/127; H03K 19/00346; H03K 19/00353; H03K 19/00361; H03K 19/003; H03K 19/00307; H03K 19/00315
See application file for complete search history.

(56) References Cited

U.S. PATENT DOCUMENTS

2008/0150858 A1* 6/2008 Nishi ................... G09G 3/20
345/87

2013/0222042 A1 8/2013 Kikuchi et al.
2014/0285241 A1 9/2014 Umetani

FOREIGN PATENT DOCUMENTS

| | | |
|---|---|---|
| FR | 2857177 | 1/2005 |
| JP | H04359697 | 12/1992 |
| JP | 2005039988 | 2/2005 |
| JP | 2007282326 | 10/2007 |
| JP | 2008042633 | 2/2008 |
| JP | 2009200891 | 9/2009 |
| JP | 2010051165 | 3/2010 |
| JP | 4804142 | 8/2011 |
| JP | 2013099181 | 5/2013 |
| JP | 2013179390 | 9/2013 |
| JP | 2014027345 | 2/2014 |
| JP | 2014068326 | 4/2014 |
| JP | 2014187479 | 10/2014 |
| JP | 2017183979 | 10/2017 |

* cited by examiner

GATE DRIVE CIRCUIT

TECHNICAL FIELD

The present invention relates to a gate drive circuit.

BACKGROUND ART

Conventionally, various gate drive circuits that drive the gate of a transistor such as a MOS field-effect transistor (MOSFET) have been developed.

For instance, Patent Document 1 discloses one example of a conventional gate drive circuit. The gate drive circuit of Patent Document 1 includes a switching circuit that switches three levels of output voltages, and a reactor is connected between the switching circuit and the gate of a transistor. The switching circuit switches zero level, medium level, and double medium level that is a power level.

When the transistor is turned on, the switching circuit switches the output voltage from zero level to medium level. Then a resonance occurs due to the reactor and a gate-source capacitance of the transistor. In this case, a gate voltage rapidly increases to the power level, and a variation point of the gate voltage becomes zero at a certain time point. At this time point, the switching circuit switches the output voltage to the power level, so that the gate voltage is kept at the power level. When being turned off the operation is performed in the opposite order to when being turned on.

Further, conventionally, there is proposed a method of temporarily changing a gate voltage of a switching element only for an instant of switching so as to achieve high speed switching, in a gate drive circuit that switches a switching element of a switching power supply, a motor driver, or the like (see, for example, Patent Documents 2 to 4).

LIST OF CITATIONS

Patent Literature

Patent Document 1: JP-A-2007-282326
Patent Document 2: JP-A-2009-200891
Patent Document 3: Japanese Patent No. 4804142
Patent Document 4: JP-A-2010-51165
Patent Document 5: JP-A-2017-183979

SUMMARY OF THE INVENTION

Technical Problem

Here, a transistor has an internal gate resistor (parasitic resistor), and when the transistor is driven by a gate drive circuit, a gate current that charges and discharges the gate of the transistor is limited by the internal gate resistor. In particular, a transistor using a semiconductor material such as SiC has a large internal gate resistor, which limits more the gate current. This causes a problem that a switching speed of the transistor is decreased and a switching loss is increased.

However, the gate drive circuit of Patent Document 1 described above is aimed at suppressing an overshoot of the gate voltage when being turned on and an undershoot of the gate voltage when being turned off, and a decrease in the switching speed due to the internal gate resistor of the transistor as described above has not been considered.

In view of the above-mentioned circumstances, it is expected to achieve higher switching speed of the transistor to be driven.

Further, in Patent Document 2, so many passive elements are necessary as means for temporarily increasing the gate voltage, and hence there is a problem that a circuit scale is increased.

Further, in Patent Document 3, a gate voltage is temporarily increased by switching a plurality of power supplies, and hence in addition to the problem of increasing a circuit scale, there is a problem that, complicated control is also required.

Further, in Patent Document 4, the drive target is a current drive type switching element (junction-type FET), in which a gate current is required to flow also in a steady ON state. Therefore, the capacitor proposed in this document should be connected in parallel to a gate resistor that is an essential circuit element, and it is not supposed that the capacitor is used solely. In this viewpoint, the conventional technique of Patent Document 4 looks similar to but is clearly different from the present invention in essential structure.

Note that the applicant of this patent application proposes in Patent Document 5, in view of the problems described above, a gate drive circuit that can easily achieve high speed switching. However, this conventional technique still needs more consideration concerning variations of the capacitor and an input capacitance.

In view of this situation, it is also expected to provide a gate drive circuit that can achieve high speed switching easily and appropriately even if the capacitor or the input capacitance has a variation.

Means for Solving the Problem

A gate drive circuit according to an aspect of the present invention, which is a gate drive circuit arranged to drive a gate of a first transistor, includes a first switch on a high potential side and a second switch on a low potential side, connected in series at a second connection node between a high potential end and a low potential end of a series connection structure, constituted of a first voltage source and a second voltage source connected in series at a first connection node: and a third switch and an inductor connected in series between the first connection node and the second connection node. The gate of the first transistor can be electrically connected to the second connection node.

Further, a gate drive circuit according to another aspect of the present invention includes a first transistor having a first terminal connected to an application terminal of a first voltage and a second terminal connected to a gate of a switching element via a capacitor; a second transistor having a first terminal connected to the gate of the switching element via the capacitor and a second terminal connected to an application terminal of a second voltage lower than the first voltage, the second transistor being driven in the opposite phase to the first transistor; a third transistor having a first terminal connected to an application terminal of a third voltage higher than the second voltage and a second terminal connected to the gate of the switching element via a first rectifier element, the third transistor being driven in the same phase as the first transistor and a fourth transistor having a first terminal connected to the gate of the switching element via a second rectifier element and a second terminal connected to an application terminal of a fourth voltage lower than the third voltage, the fourth transistor being driven in the same phase as the second transistor. The first voltage is higher than the third voltage and the second voltage is equal to the fourth voltage, or the second voltage is lower than the fourth voltage and the first voltage is equal to the third voltage, or the first voltage is higher than the third voltage and the second voltage is lower than the fourth voltage.

Advantageous Effects of the Invention

According to the gate drive circuit of the present invention, switching speed can be appropriately increased.

BRIEF DESCRIPTION OF DRAWINGS

FIG. 4A is a circuit diagram illustrating a first operating state when being turned on.

FIG. 4B is a circuit diagram illustrating a second operating state when being turned on.

FIG. 4C is a circuit diagram illustrating a third operating state when being turned on.

FIG. 4D is a circuit diagram illustrating a fourth operating state when being turned on.

FIG. 8 is a timing chart showing various waveforms when the transistor is turned on.

DESCRIPTION OF EMBODIMENTS

An embodiment of the present invention is described below with reference to the drawings.

1. Structure of Gate Drive Circuit

Figure 1:
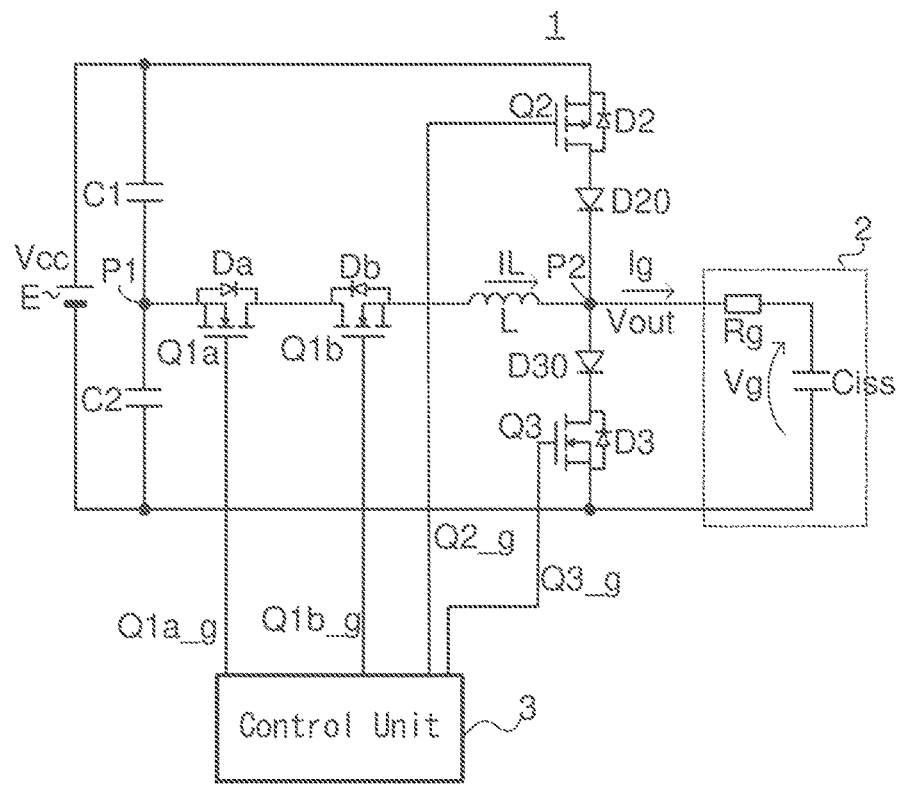
FIG. 1 is a circuit diagram illustrating a structure of a gate drive circuit according to one embodiment of the present invention.
Figure 9:
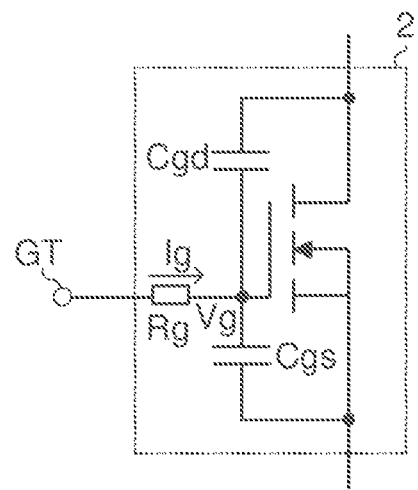
FIG. 9 is a model diagram of the transistor (MOSFET).

FIG. 1 is a circuit diagram illustrating a structure of a gate drive circuit according to one embodiment of the present invention. A gate drive circuit 1 illustrated in FIG. 1 drives a transistor 2. The gate drive circuit 1 and the transistor 2 can constitute various power conversion devices (such as a converter and an inverter). The transistor 2 is, for example, an N-channel type MOSFET using SiC as a semiconductor material. In FIG. 1 and FIGS. 2, 4A to 4D, 5A to 5D, 6, and 7 that are described later, a main equivalent circuit of the transistor 2 is illustrated. Here, FIG. 9 illustrates a model diagram of the transistor 2. As illustrated in FIG. 9, the transistor 2 includes an internal gate resistor Rg, a gate-source capacitance Cgs as a parasitic capacitance, and a gate-drain capacitance Cgd as a parasitic capacitance. The internal gate resistor Rg is connected between a gate terminal GT and a connection node between the gate-source capacitance Cgs and the gate-drain capacitance Cgd. In the transistor 2 illustrated in FIG. 1 and the like, there are shown the internal gate resistor Rg and an input capacitance Ciss, which is a combined capacitance of the gate-source capacitance Cgs and the gate-drain capacitance Cgd. The input capacitance Ciss is a total capacitance of the transistor 2 viewed from the input side.

The gate drive circuit 1 includes capacitors C1 and C2, transistors Q1a and Q1b, transistors Q2 and Q3, an inductor L, and diodes D20 and D30. The transistors Q1a and Q1b constitute a bidirectional switch. Further, the diodes D20 and D30 function as a current blocking unit.

The capacitor C1 and the capacitor C2 are connected in series, and a power supply E applies a power supply voltage Vcc across both ends of the series connection structure. In other words, one terminal of the capacitor C1 (high potential end) is connected to an application terminal of the power supply voltage Vcc, and one terminal of the capacitor C2 (low potential end) is connected to an application terminal of a reference potential. The capacitors C1 and C2 function as voltage sources, each of which generates a voltage of Vcc/2. Note that a voltage ratio of the capacitors C1 and C2 is not limited to this, but can be arbitrarily set.

A connection node P1 of the capacitor C1 and the capacitor C2 (first connection node) is connected to a source of the transistor Q1a constituted of an N-channel type MOSFET. A drain of the transistor Q1a is connected to a drain of the transistor Q1b constituted of an N-channel type MOSFET. A source of the transistor Q1b is connected to one terminal of the inductor L. Note that the transistor Q1a has a body diode Da, and the transistor Q1b has a body diode Db.

A source of the transistor Q2 (first switch) constituted of a P-channel type MOSFET is connected to the one terminal of the capacitor C1. An anode of the diode D20 (first current blocking unit) is connected to a drain of the transistor Q2. A cathode of the diode 20 is connected to an anode of the diode D30 (second current blocking unit). A cathode of the diode D30 is connected to a drain of the transistor Q3 (second switch) constituted of an N-channel type MOSFET. A source of the transistor Q3 is connected to the one terminal of the capacitor C2. Note that the transistor Q2 has a body diode D2, and the transistor Q3 has a body diode D3.

The other terminal of the inductor L is connected to a connection node P2 (second connection node) of the diode D20 and the diode D30. In other words, the inductor L and the bidirectional switch (third switch) constituted of the transistors Q1a and Q1b are connected in series between the connection node P1 and the connection node P2.

The connection node P2 is connected to a gate of the transistor 2. The transistor 2 includes the internal gate resistor Rg and the input capacitance Ciss. One terminal of the internal gate resistor Rg is connected to the connection node P2, and the other terminal of the internal gate resistor Rg is connected to one terminal of the input capacitance Ciss. Note that an additional resistor may be connected between the connection node P2 and the internal gate resistor Rg. In other words, it is sufficient that the gate of the transistor 2 can be electrically connected to the connection node P2.

The control unit 3 controls driving the gate drive circuit 1. The control unit 3 outputs a gate drive signal Q1a_g to a gate of the transistor Q1a and outputs a gate drive signal Q1b_g to a gate of the transistor Q1b. Further, the control unit 3 outputs a gate drive signal Q2_g to a gate of the transistor Q2 and outputs a gate drive signal Q3_g to a gate of the transistor Q3. The gate drive signal Q2_g and the gate drive signal Q3_g are a pulse-like signal, and the transistors Q2 and Q3 are complementarily driven.

2. Operation of Gate Drive Circuit

Figure 3:
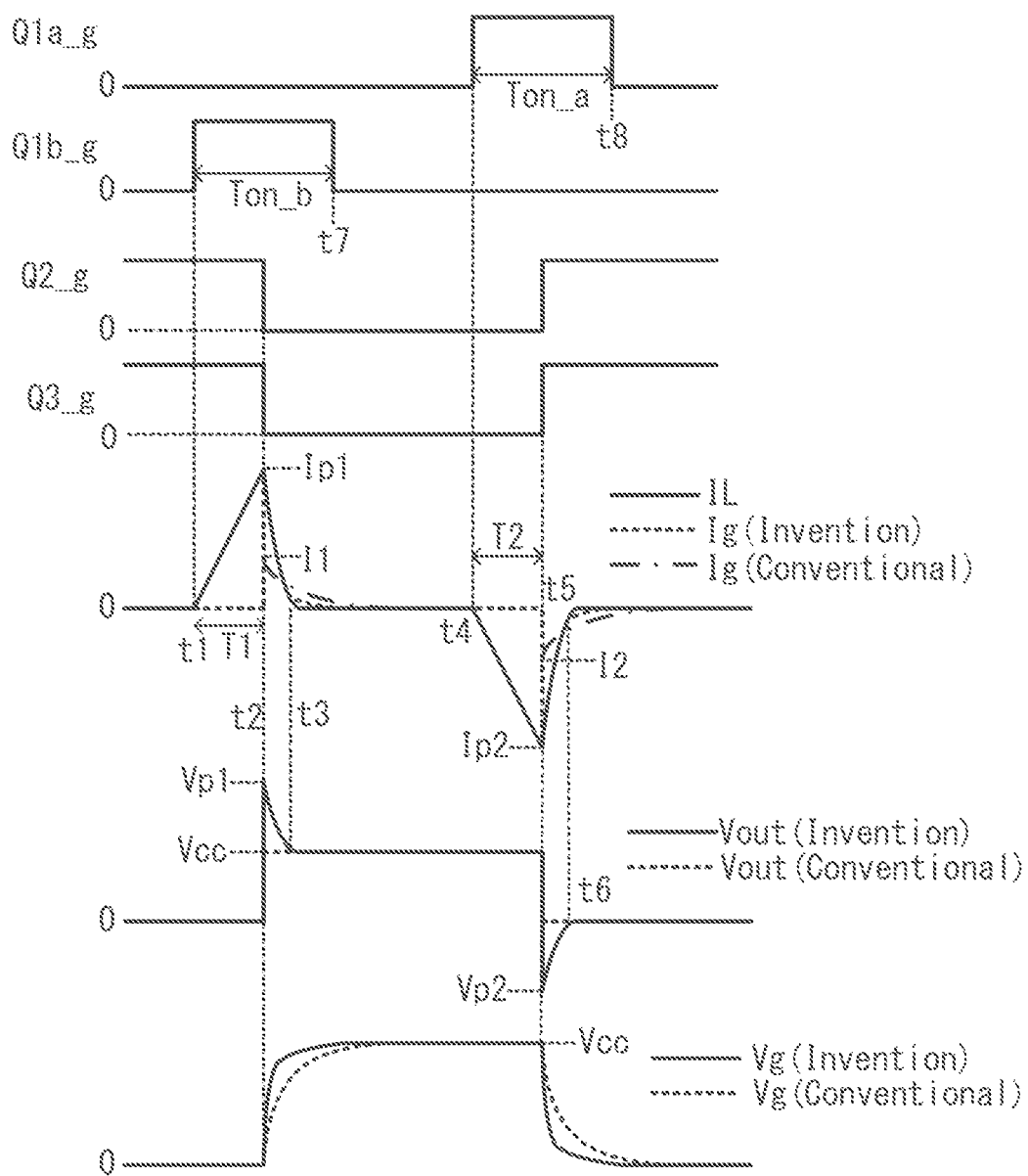
FIG. 3 is a timing chart of operations when a transistor is turned on and when it is turned off.

Next, an operation of the gate drive circuit 1 having the above-described structure according to this embodiment is described. Here, the timing chart of FIG. 3 is used for description. FIG. 3 is the timing chart of operations when the transistor 2 is turned on and when it is turned off. In FIG. 3, the gate drive signal Q1a_g, the gate drive signal Q1b_g, the gate drive signal Q2_g, the gate drive signal Q3_g, an inductor current IL, a gate current Ig, an output voltage Vout, and a gate voltage Vg are shown in order from top to bottom.

As illustrated in FIG. 1, the inductor current IL is current flowing in the inductor L, the gate current Ig is current flowing in the internal gate resistor Rg, the output voltage Vout is a voltage generated at the connection node P2, and the gate voltage Vg is a voltage generated in the input capacitance Ciss.

<<When Turned On>>

First, an operation when the transistor 2 is turned on is described with reference to FIGS. 3 and 4A to 4D. In a state where the gate drive signal Q1a_g is low so that the transistor Q1a is OFF, the gate drive signal Q2_g is high so that the transistor Q2 is OFF, and the gate drive signal Q3_g is high so that the transistor Q3 is ON, the gate drive signal Q1b_g is switched from low to high at timing t1, and the transistor Q1b is turned on.

Figure 4A:
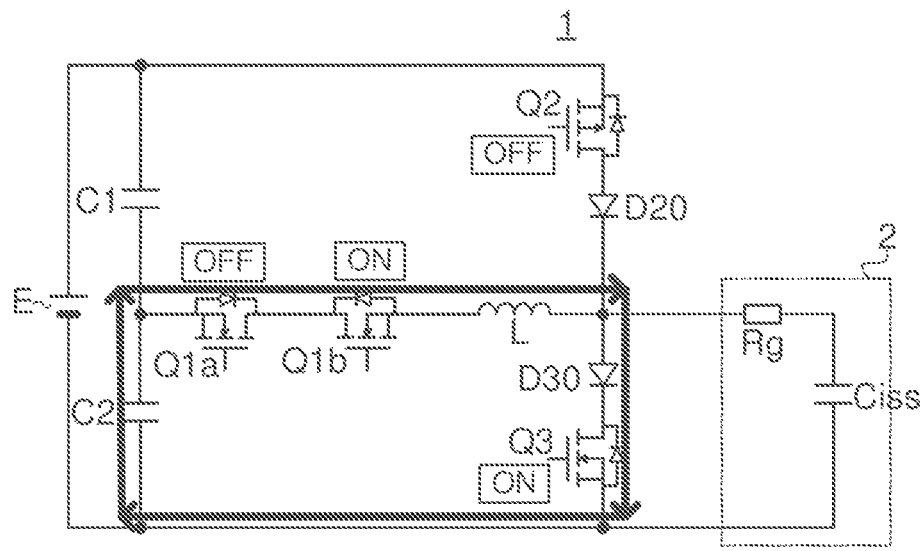

Then, as illustrated in FIG. 4A, the current begins to flow in the path of the capacitor C2, the body diode of the transistor Q1a, the transistor Q1b, the inductor L, the diode D30, and the transistor Q3 in order (solid line arrow). In this way, the inductor current IL gradually increases from zero to a positive side. In this case, the gradient of increase depends on the inductance of the inductor L.

Figure 4B:
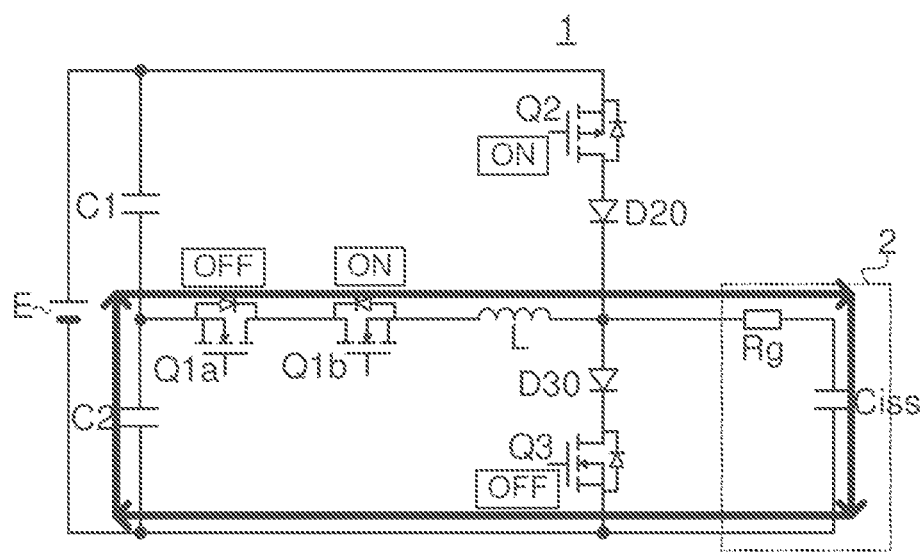

At timing t2 when a predetermined period T1 elapses from timing t1, the gate drive signal Q2_g is switched to low, and the gate drive signal Q3_g is switched to low. Then, as shown in FIG. 4B, the current begins to flow in the path of the capacitor C2, the body diode of the transistor Q1a, the transistor Q1b, the inductor L, the internal gate resistor Rg, and the input capacitance Ciss in order (solid line arrow).

At timing t2, the inductor current IL (a solid line) becomes a peak current value Ip1, and the gate current 1g shown by a broken line increases steeply from zero to the peak current value Ip1. In other words, the gate current Ig begins to flow. Further, at timing t2, the output voltage Vout (a solid line) increases steeply from zero to a peak voltage value Vp1. The peak voltage value Vp1 is higher than the power supply voltage Vcc. However, the diode D20 blocks the current from flowing to the power supply E side through the body diode of the transistor Q2, and hence it is possible to prevent the output voltage Vout from being clamped to the power supply voltage Vcc.

At timing t2, charging of the input capacitance Ciss is started, and the gate voltage Vg (a solid line) begins to increase from zero.

Figure 4C:
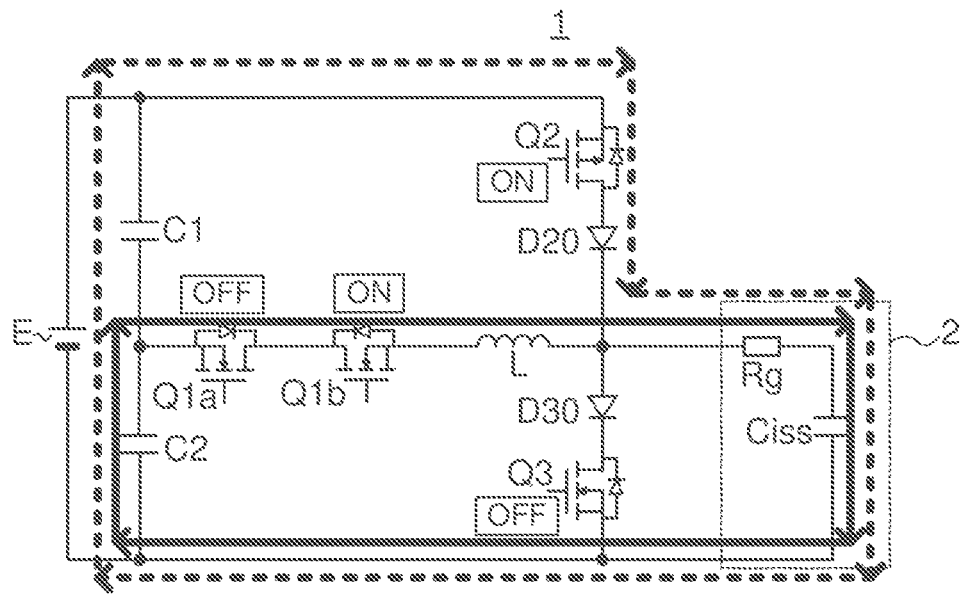

After timing t2, the inductor current IL and the gate current Ig are identical to each other and gradually decrease. In accordance with this, the output voltage Vout is gradually decreased. At timing t3 when the output voltage Vout reaches the power supply voltage Vcc, as illustrated in FIG. 4C, the current begins to flow in the path (a solid line arrow in FIG. 4C) in the same manner as the path illustrated in FIG. 4B, and in the path of the capacitor C2, the capacitor C1, the transistor Q2, the diode D20, the internal gate resistor Rg, and the input capacitance Ciss in order a broken line arrow in FIG. 4C). Therefore, the gate current Ig is a combined current of the inductor current IL, and the current supplied from the transistor Q2.

Figure 4D:
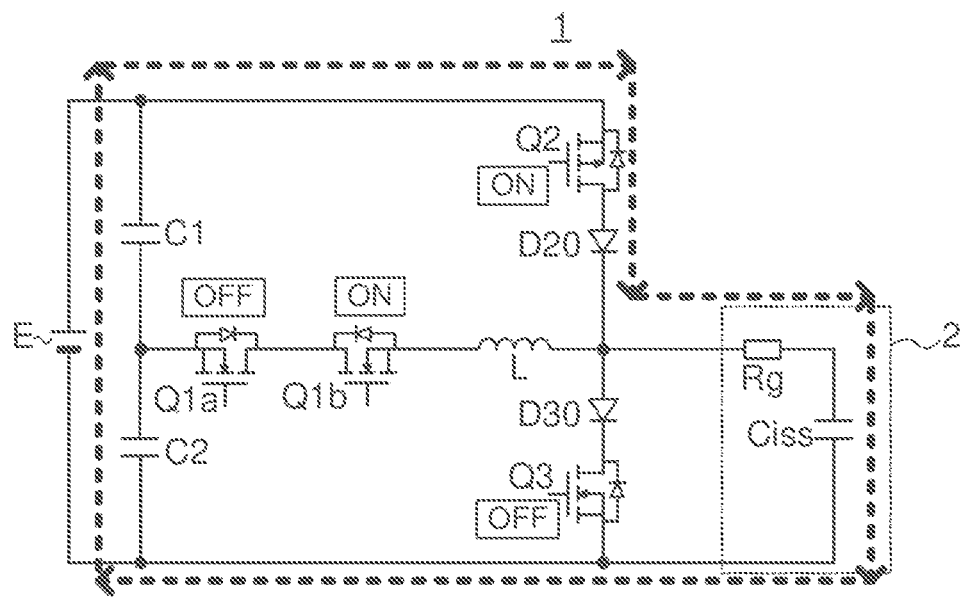

After timing t3, the inductor current IL decreases and when it reaches zero, the body diode of the transistor Q1a (backflow prevention unit) prevents backflow of the inductor current IL. Then, as illustrated in FIG. 4D, the current flows only in the path (a broken line arrow in FIG. 4D) in the same manner as the path through the transistor Q2 illustrated in FIG. 4C after that. In other words, the gate current Ig flows as the current flowing only in this path, and when the gate voltage Vg reaches the power supply voltage Vcc, the gate current Ig becomes zero. In this way, charging of the input capacitance Ciss is finished.

<<When Turned Off>>

Next, an operation when the transistor 2 is turned off is described with reference to FIGS. 3 and 5A to 5D. In a state where the gate drive signal Q1b_g is low so that the transistor Q1b is OFF, the gate drive signal Q2_g is low so that the transistor Q2 is ON, and the gate drive signal Q3_g is low so that the transistor Q3 is OFF, the gate drive signal Q1a_g is switched from low to high at timing t4, and the transistor Q1a is turned on.

Figure 5A:
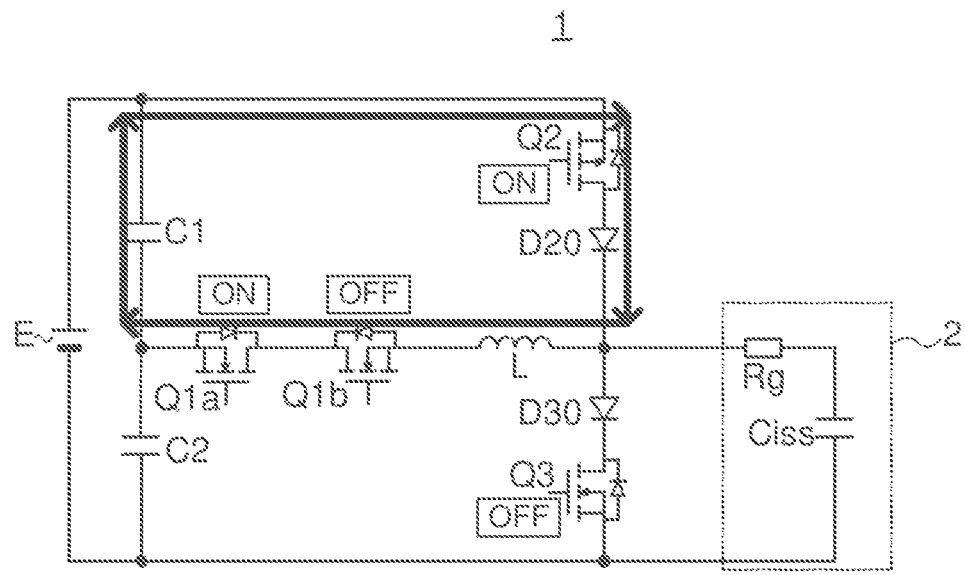
FIG. 5A is a circuit diagram illustrating a first operating state when being turned off.

Then, as illustrated in FIG. 5A, the current begins to flow in the path of the capacitor C1, the transistor Q2, the diode D20, the inductor L, the body diode of the transistor Q1b, and the transistor Q1a in order (solid line arrow). In this way, the inductor current IL (a solid line) gradually increases from zero to a negative side. In this case, the gradient of increase depends on the inductance of the inductor L.

Figure 5B:
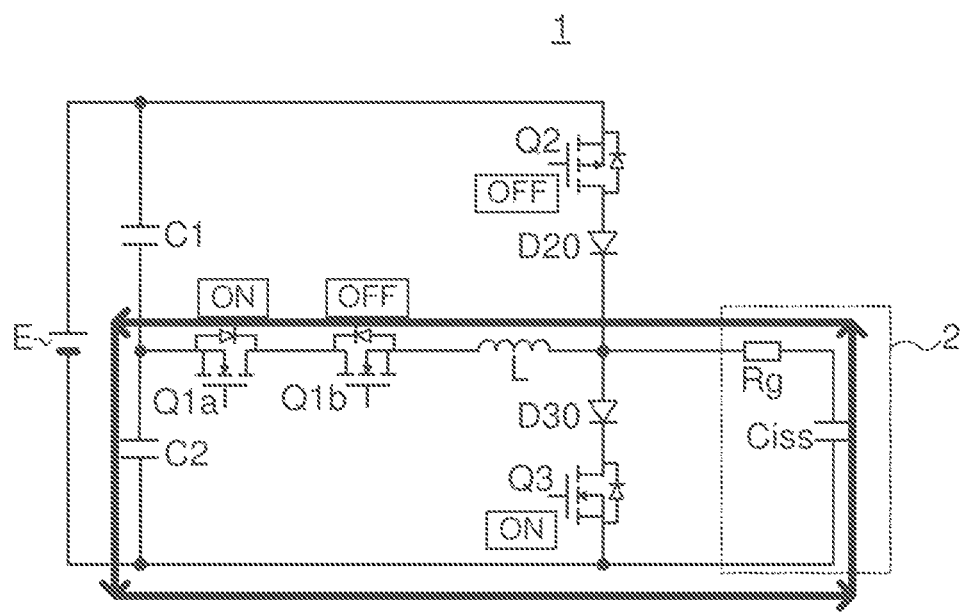
FIG. 5B is a circuit diagram illustrating a second operating state when being turned off.

In FIG. 3, at timing t5 when a predetermined period T2 elapses from timing t4, the gate drive signal Q2_g is switched to high, and the gate drive signal Q3_g is switched to high. Then, as illustrated in FIG. 5B, the current begins to flow in the path of the input capacitance Ciss, the internal gate resistor Rg, the inductor L, the body diode of the transistor Q1b, the transistor Q1a, and the capacitor C2 in order (solid line arrow).

At timing t5 in FIG. 3, the inductor current IL (a solid line) becomes a peak current value Ip2, and the gate current Ig shown by a broken line increases steeply from zero to the peak current value Ip2. In other words, the gate current Ig begins to flow. Further, at timing t5, the output voltage Vout increases steeply from zero to a peak voltage value Vp2. The peak voltage value Vp2 is lower than 0 V. However, the diode D30 blocks the current from flowing to the connection node P2 side through the body diode of the transistor Q3, and hence it is possible to prevent the output voltage Vout from being clamped to 0 V.

At timing t5 in FIG. 3, discharge of the input capacitance Ciss is started, and the gate voltage Vg (a solid line) begins to decrease from the power supply voltage Vcc.

Figure 5C:
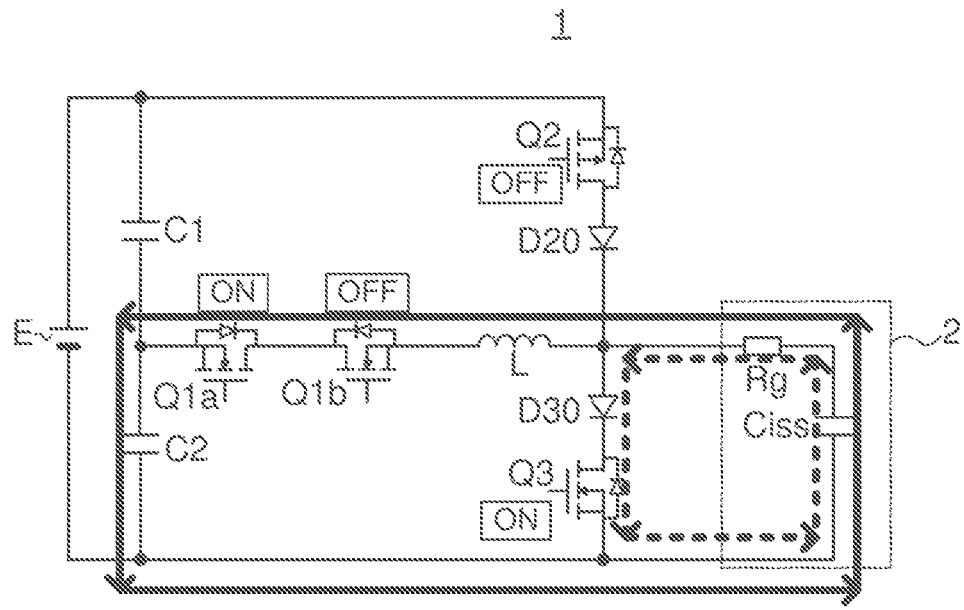
FIG. 5C is a circuit diagram illustrating a third operating state when being turned off.

After timing t5 in FIG. 3, the inductor current IL and the gate current Ig are identical to each other and gradually decrease. In accordance with this, the output voltage Vout is gradually decreased toward 0 V. At timing t6 when the output voltage Vout reaches 0 V, as illustrated in FIG. 5C, the current begins to flow in the path (a solid line arrow in FIG. 5C) in the same manner as the path illustrated in FIG. 5B, and in the path of the input capacitance Ciss, the internal gate resistor Rg, the diode D30, and the transistor Q3 in order (a broken line arrow in FIG. 5C). Therefore, the gate current Ig is a combined current of the inductor current IL and the current flowing in the transistor Q3.

Figure 5D:
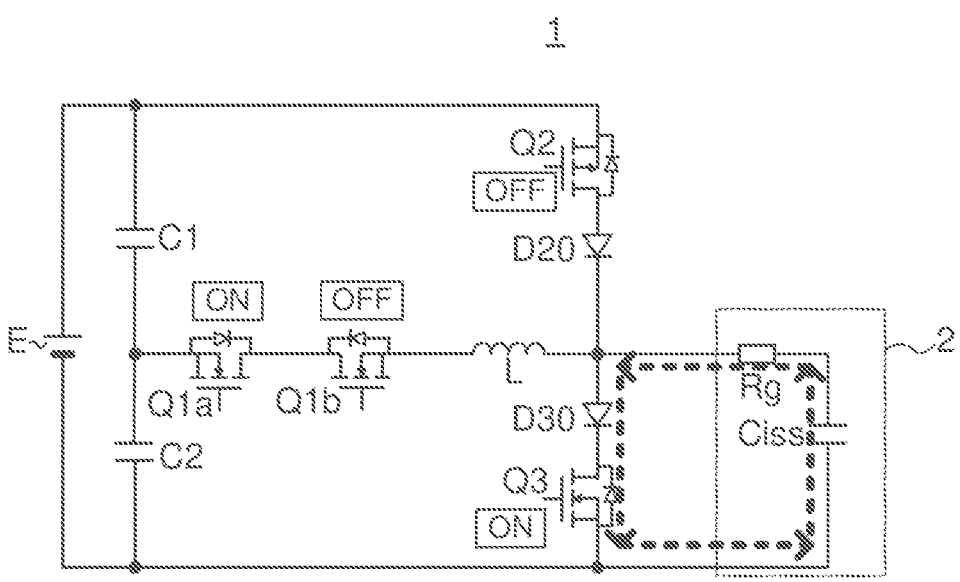
FIG. 5D is a circuit diagram illustrating a fourth operating state when being turned off.

After timing t6, the inductor current IL decreases and when it reaches zero, the body diode of the transistor Q1b (backflow prevention unit) prevents backflow of the inductor current IL. Then, as illustrated in FIG. 5D, the current flows only in the path (a broken line arrow in FIG. 5D) in the same manner as the path through the transistor Q3 illustrated in FIG. 5C after that. In other words, the gate current Ig flows as the current flowing only in this path, and when the gate voltage Vg reaches 0 V, the gate current Ig becomes zero. In this way, discharge of the input capacitance Ciss is finished.

3. Comparison with Conventional Structure

Figure 2:
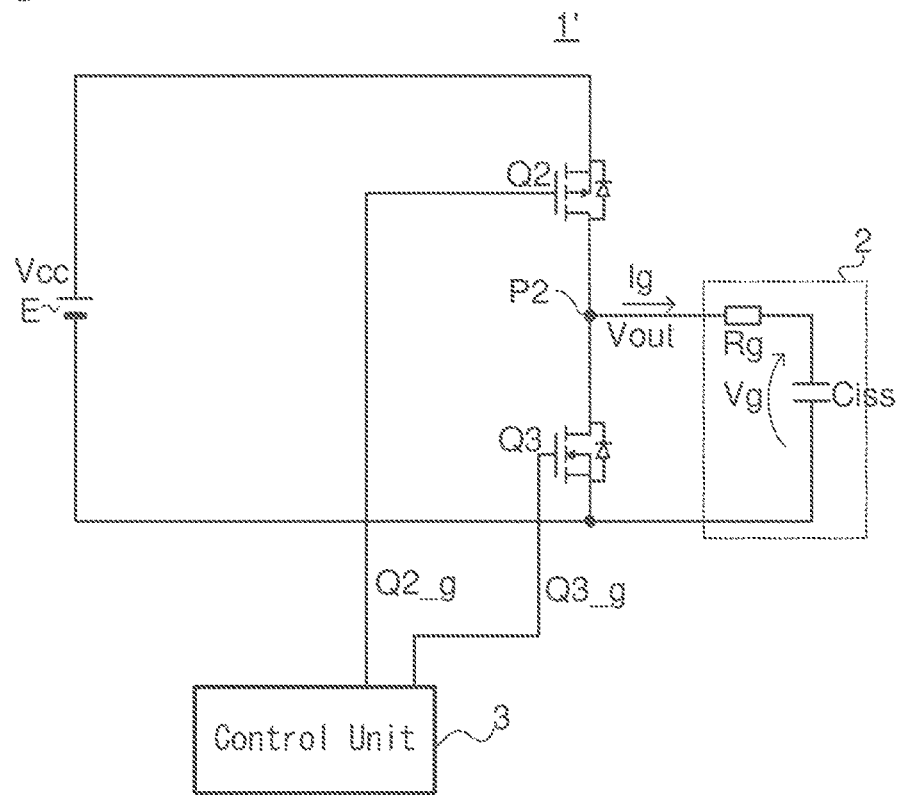
FIG. 2 is a circuit diagram illustrating one example of a conventional gate drive circuit.

Here, FIG. 2 is a circuit diagram illustrating a structure of a conventional gate drive circuit that is used for comparison with the present invention. A structure of a conventional gate drive circuit 1' illustrated in FIG. 2 is obtained by eliminating the capacitors C1 and C2, the transistors Q1a and Q1b, the diodes 120 and 030, and the inductor L from the structure of the gate drive circuit 1 illustrated in FIG. 1 according to this embodiment.

An operation of this conventional gate drive circuit 1' is shown in FIG. 3 together with the operation of this embodiment described above. As an operation when the transistor 2 is turned on, when the transistor Q2 is switched to ON and the transistor Q3 is switched to OFF at timing t2, the output voltage Vout (a broken line) increases steeply from zero to the power supply voltage Vcc, and the gate current Ig (a dashed-dotted line) increases steeply from zero to a predetermined current value I1. Here, the predetermined current value I1 is a value expressed as Vcc/Rg. When the gate current Ig begins to flow, charging of the input capacitance Ciss is started. In this way, the gate voltage Vg (broken line) begins to increase from zero. Then, the charging proceeds and when the gate voltage Vg reaches the power supply voltage Vcc, the gate current Ig becomes zero. In this way, charging of the input capacitance Ciss is finished.

As an operation when the transistor 2 is turned off, when the transistor Q2 is switched to OFF and the transistor Q3 is switched to ON at timing t5, the output voltage Vout (broken line) decreases steeply to 0 V, and the gate current Ig (dashed-dotted line) increases steeply from zero to a predetermined current value I2. Here, the predetermined current value I2 is a value expressed as Vcc/Rg. When the gate current Ig begins to flow, discharge of the input capacitance Ciss is started. In this way, the gate voltage Vg (broken line) begins to decrease from the power supply voltage Vcc. Then, the discharge proceeds and when the gate voltage Vg reaches 0 V, the gate current Ig becomes zero. In this way, discharge of the input capacitance Ciss is finished.

In this way, in the conventional gate drive circuit 1', an initial value of the gate current Ig when starting charge and discharge is limited by the current value I1, I2. In particular, if the internal gate resistor Rg is large because the transistor 2 is made of a semiconductor material such as SiC, the current value I1, I2 is limited more. In contrast, according to the gate drive circuit 1 of this embodiment, the initial value of the gate current Ig when starting charge and discharge can be the peak current value Ip1, Ip2 larger than the current value I1, I2. Therefore, the speed of charge and discharge can be higher than the conventional structure. In other words, the switching speed of the transistor 2 can be increased, and a switching loss can be reduced.

Further, in this embodiment, when being turned on, the period T1 after the transistor Q1b is switched to ON until the transistors Q2 and Q3 are switched is variable, and hence the peak current value Ip1 is adjusted, so that the turn-on speed can be changed. Similarly, when being turned off, the period T2 after the transistor Q1a is switched to ON until the transistors Q2 and Q3 are switched is variable, and hence the peak current value Ip2 is adjusted, so that the turning off speed can be changed.

Note that the timing t7 for switching the transistor Q1b from ON to OFF when being turned on can be set with high flexibility, because the body diode of the transistor Q1a can prevent backflow of the inductor current IL even if the transistor Q1b stays ON. However, it is preferred to set the timing t7 to be before the timing t4 at which the inductor current IL is made to flow in the negative direction when being turned off after turning on.

Further, the timing t8 for switching the transistor Q1a from ON to OFF when being turned off can be set with high flexibility, because the body diode of the transistor Q1b can prevent backflow of the inductor current IL even if the transistor Q1a stays ON. However, it is preferred to set the timing t8 to be before the timing t1 at which the inductor current IL is made to flow in the positive direction when being turned on after turning off.

4. Variation of Gate Drive Circuit

Figure 6:
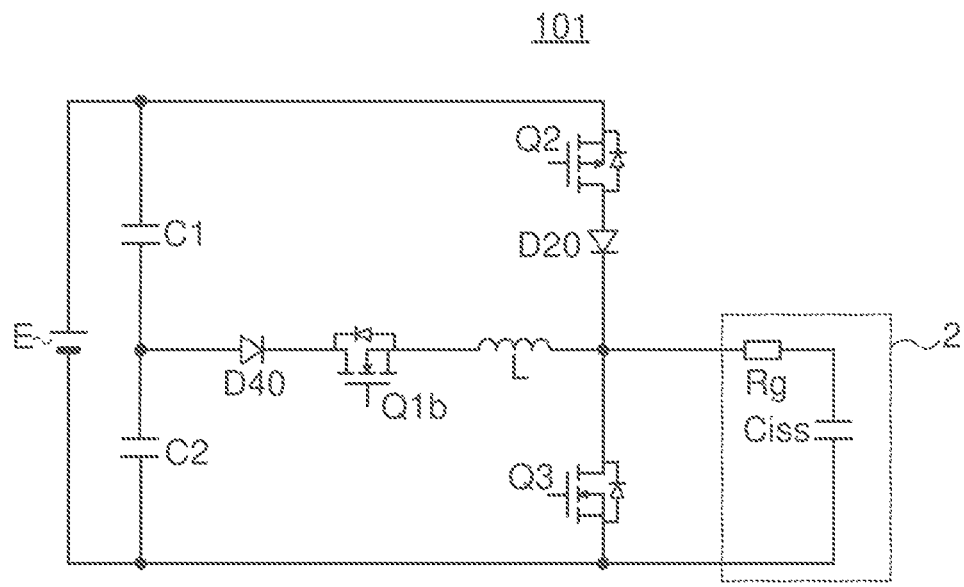
FIG. 6 is a circuit diagram illustrating a structure of the gate drive circuit according to a variation.

FIG. 6 is a circuit diagram illustrating a structure of a gate drive circuit 101 according to a variation. The gate drive circuit 101 is different from the structure of FIG. 1 described above in that a diode D40 is substituted for the transistor Q1a, and the diode D30 is not disposed.

In the gate drive circuit 101, when being turned on, in a state where the transistor Q2 is OFF and the transistor Q3 is ON, the transistor Q1b is switched to ON, and after that the transistors Q2 and Q3 are switched. In this way, with the same operation as the gate drive circuit 1 described above, the input capacitance Ciss can be charged at high speed. Further, when being turned off, the transistor Q3 is ON, and hence discharge of the input capacitance Ciss can be performed in the same manner as the conventional structure. Therefore, according to the gate drive circuit 101, if high speed is required only when being turned on, elements can be made simpler so that cost can be reduced.

Figure 7:
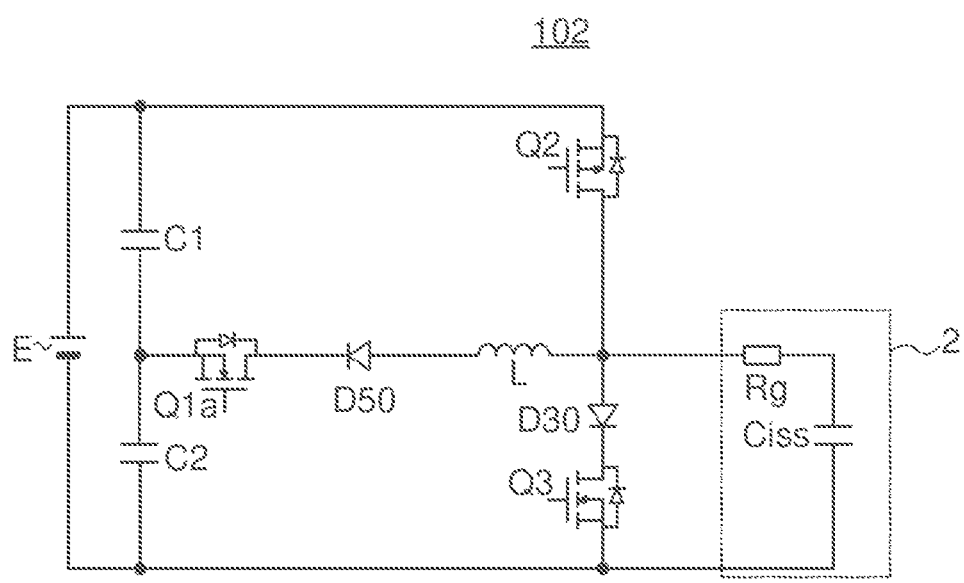
FIG. 7 is a circuit diagram illustrating a structure of the gate drive circuit according to another variation.

Further, FIG. 7 is a circuit diagram illustrating a structure of a gate drive circuit 102 according to another variation. The gate drive circuit 102 is different from the structure of FIG. 1 described above in that a diode D50 is substituted for the transistor Q1b, and the diode D20 is not disposed.

In the gate drive circuit 102, when being turned on, the transistor Q2 is ON so that the input capacitance Ciss can be charged in the same manner as the conventional structure. Further, when being turned off, in a state where the transistor Q2 is ON and the transistor Q3 is OFF, the transistor Q1a is switched to ON, and after that the transistors Q2 and Q3 are switched. In this way, with the same operation as the gate drive circuit 1 described above, the input capacitance Ciss can be discharged at high speed. Therefore, according to the gate drive circuit 102, if high speed is required only when being turned off, elements can be made simpler so that cost can be reduced.

5. ON Time Control of Transistor According to Load

Figure 8:
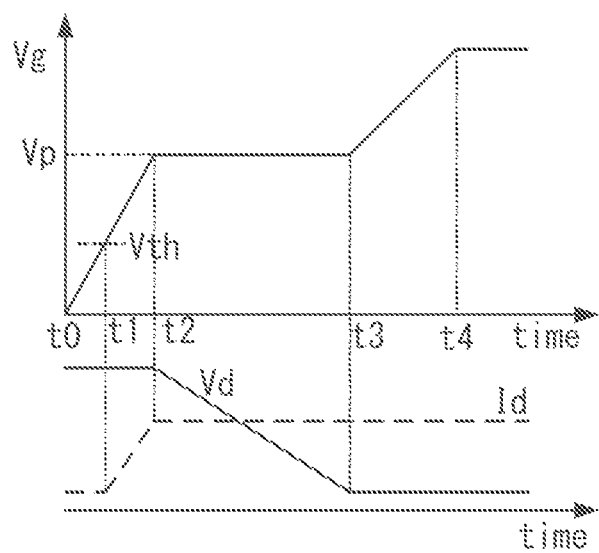

FIG. g is a timing chart showing various waveforms when the transistor 2 illustrated in FIG. 9 is turned on. FIG. 8 shows temporal changes of the gate voltage Vg, a drain voltage Vd, and a drain current Id.

At timing t0, a predetermined voltage is applied to the gate terminal GT of the transistor 2 illustrated in FIG. 9. Then, charging of the gate-source capacitance Cgs is started, and the gate voltage Vg begins to increase. Then, at timing t1 when the gate voltage Vg reaches a threshold voltage Vth, the drain current Id begins to flow. In the period from timing t1 to timing t2, the gate voltage Vg increases, and in proportion to this, the drain current Id increases.

At timing t2, charging of the gate-source capacitance Cgs is finished, so that the gate voltage Vg becomes constant at a plateau voltage Vp, and the drain current Id becomes constant. Further, at timing t2, charging of the gate-drain capacitance Cgd is started, and the drain voltage Vd begins to decrease.

The decrease in the drain voltage Vd continues until timing t3 when charging of the gate-drain capacitance Cgd is finished. The gate voltage Vg increases again from timing t3, and the gate voltage Vg reaches the predetermined voltage described above at timing t4.

After timing t2 when charging of the gate-source capacitance Cgs is finished and the gate voltage Vg reaches the plateau voltage Vp, the gate current Ig when charging the gate-drain capacitance Cgd until timing t3 is expressed by Ig=(VGT−Vp)/Rg, where VGT is a voltage applied to the gate terminal GT. Here, the plateau voltage Vp depends on the drain current Id as a load. A change in the drain current Id causes a change in the gate current Ig, and hence the charging speed of the gate-drain capacitance Cgd is changed.

Therefore, by changing the voltage VGT to be applied to the gate terminal GT in accordance with the drain current Id, it is possible to suppress a change in the gate current Ig and to suppress a change in the charging speed of the gate-drain capacitance Cgd. In this way, a turning on speed can be stabilized.

Thus, in the gate drive circuit described above, by changing an ON time Ton_b of the transistor Q1b shown in FIG. 3 in accordance with a load, the output voltage Vout (corresponding to the voltage VGT) can be changed, and the turning on speed can be stabilized.

Further, when being turned off, the behavior is temporally opposite to that shown in the timing chart of FIG. 8. When the gate voltage Vg reaches the plateau voltage Vp, the gate current Ig when discharging the gate-drain capacitance Cgd after that is expressed by Ig=Vp/Rg. Here, the plateau voltage Vp depends on the drain current Id as a load. A change in the drain current Id causes a change in the gate current g, and hence the discharging speed of the gate-drain capacitance Cgd is changed.

Therefore, by changing the voltage VGT to be applied to the gate terminal GT in accordance with the drain current id, it is possible to suppress a change in the gate current Ig and to suppress a change in the discharging speed of the gate-drain capacitance Cgd. In this way, the turning off speed can be stabilized.

Thus, in the gate drive circuit described above, by changing an ON time Ton_a of the transistor Q1a shown in FIG. 3 in accordance with a load, the output voltage Vout (corresponding to the voltage VGT) can be changed, and the turning off speed can be stabilized.

6. Others

Although the embodiment of the present invention is described above, the embodiment can be variously modified within the spirit of the present invention.

Figure 10:
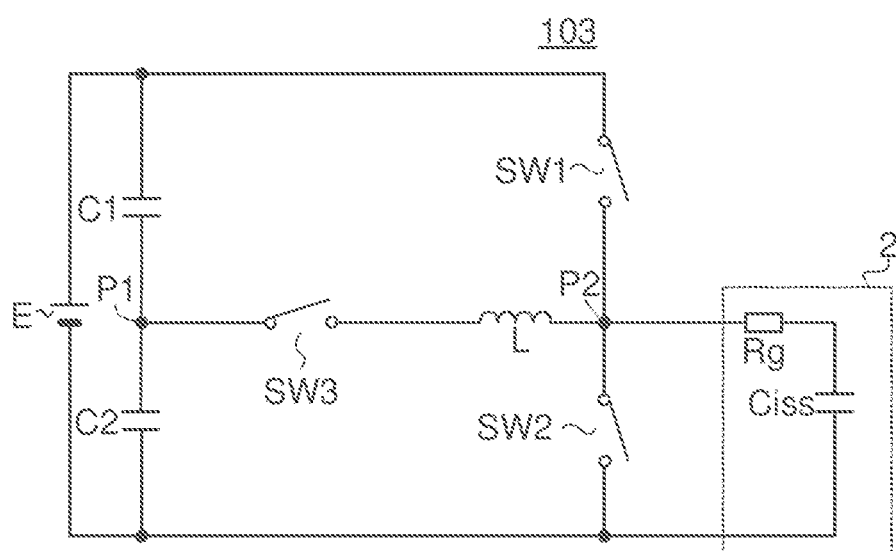
FIG. 10 is a circuit diagram illustrating a structure of the gate drive circuit according to another variation.

For instance, like a gate drive circuit 103 illustrated in FIG. 10, if the transistors Q2 and Q3 are ideal switches SW1 and SW2 that can be turned off in a bidirectional manner, the diodes D20 and D30 are not necessary. In this case, each of the switches SW1 and SW2 has both functions of a switch unit and a current blocking unit. Further, as illustrated in FIG. 10, it may be possible to dispose, as a substitute for the transistors Q1a and Q1b, a bidirectional switch SW3 that is turned on and then turned off at the timing when the inductor current IL flows backward. In this case, the bidirectional switch SW3 has both functions of a switch unit and a backflow prevention unit.

Further, the transistors Q2, Q3, Q1a, and Q1b may be constituted of an N-channel type MOSFET or may be constituted of a P-channel type MOSFET. Furthermore, without limiting to a MOSFET, other transistor may constitute them. For instance, a bipolar transistor (either NPN or PNP) may constitute them. In this case, an external diode should be connected in parallel to a bipolar transistor as each of the transistors Q1a and Q1b, but it is not required to connect a diode in parallel to a bipolar transistor as each of the transistors Q2 and Q3.

Further, the gate drive circuit of the present invention may be configured as an IC to which the inductor L and the capacitors C1 and C2 can be externally connected.

Next, an embodiment according to another aspect of the present invention is described.

Reference Example

Figure 11:
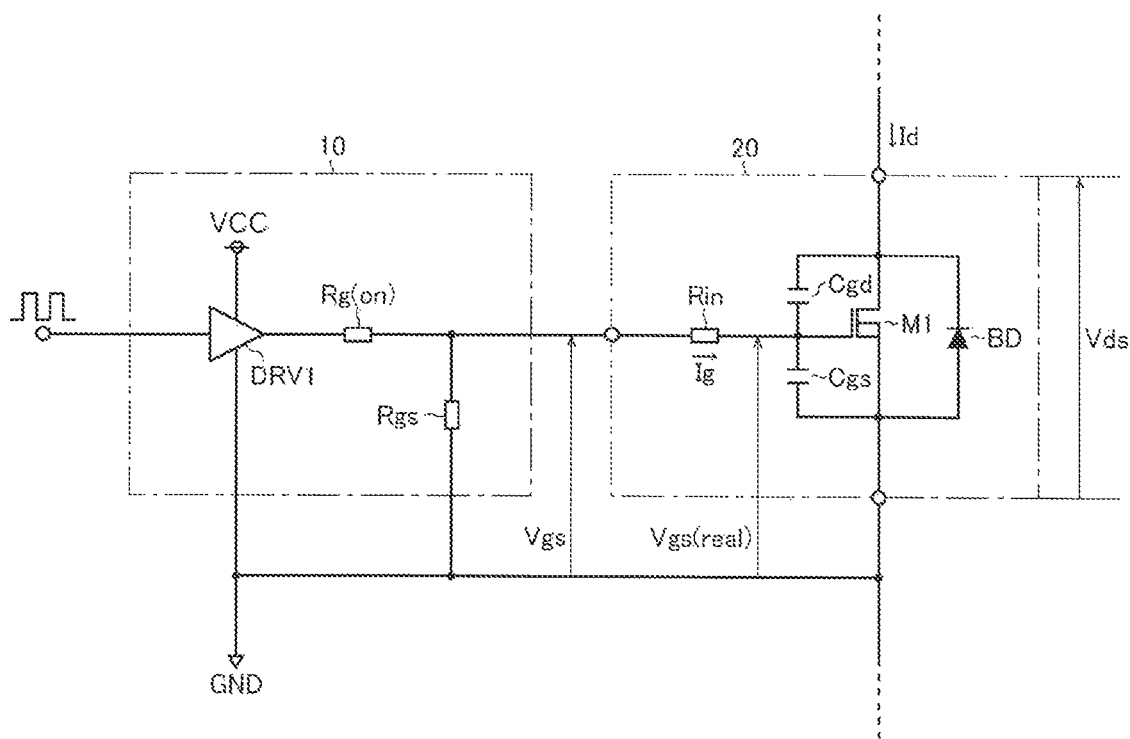
FIG. 11 is an equivalent circuit diagram illustrating a reference example of the gate drive circuit to be compared with the present invention.

Before describing the present invention, a reference example of the gate drive circuit to be compared with the present invention is described. FIG. 11 is an equivalent circuit diagram illustrating a reference example of the gate drive circuit. A gate drive circuit 10 of this reference example is an analog circuit for driving a discrete switching element 20, and includes a drive unit DRV1, an external gate resistor Rg(on), and a discharge resistor Rgs.

The drive unit DRV1 outputs a binary voltage (a power supply voltage VCC or a ground voltage GND) from its output terminal in accordance with a logic level of the control signal input to the drive unit DRV1, so as to voltage-drive a gate terminal of the switching element 20.

The eternal gate resistor Rg(on) is connected between an output terminal of the drive unit DRV1 and the gate terminal of the switching element 20. The discharge resistor Rgs is connected between the gate terminal of the switching element 20 and a ground (GND). Note that the external gate resistor Rg(on) and the discharge resistor Rgs satisfies a relationship of Rg(on)<<Rgs.

The switching element 20 is a semiconductor switching element that is switched by the gate drive circuit 10, and in this example an N-channel type metal oxide semiconductor (MOS) field-effect transistor M1 is used.

Note that as illustrated in this diagram in an equivalent manner, a gate-source parasitic capacitance Cgs is added between gate and source of the transistor M1, and the gate-drain parasitic capacitance Cgd is added between gate and drain of the transistor M1. The input capacitance Ciss of the transistor M1 can be expressed as a sum of the gate-source parasitic capacitance Cgs and the gate-drain parasitic capacitance Cgd (=Cgs+Cgd).

Further, an internal gate resistor Rio is added to a gate of the transistor M1, and a body diode BD is added between drain and source of the transistor M1 in an illustrated polarity. Further, although a parasitic inductance is also added to the transistor M1, it is not shown in the diagram and is not described here for convenience sake of illustration.

Concerning voltages and the currents of individual portions of the switching element 20, Vgs is a gate-source voltage, Vgs(real) is a voltage across both ends of the gate-source parasitic capacitance Cgs, Vds is a drain-source voltage, Id is a drain current, and Ig is a gate current. Note that when the gate current Ig is flowing, a voltage (=Ig×Rin) is generated across both ends of the internal gate resistor Rin, and hence Vgs≠Vgs(real) holds. In contrast, when the gate current Ig is not flowing, the voltage across both ends of the internal gate resistor Rin becomes zero, and hence Vgs=Vgs(real) holds, ignoring the parasitic inductance.

Figure 12:
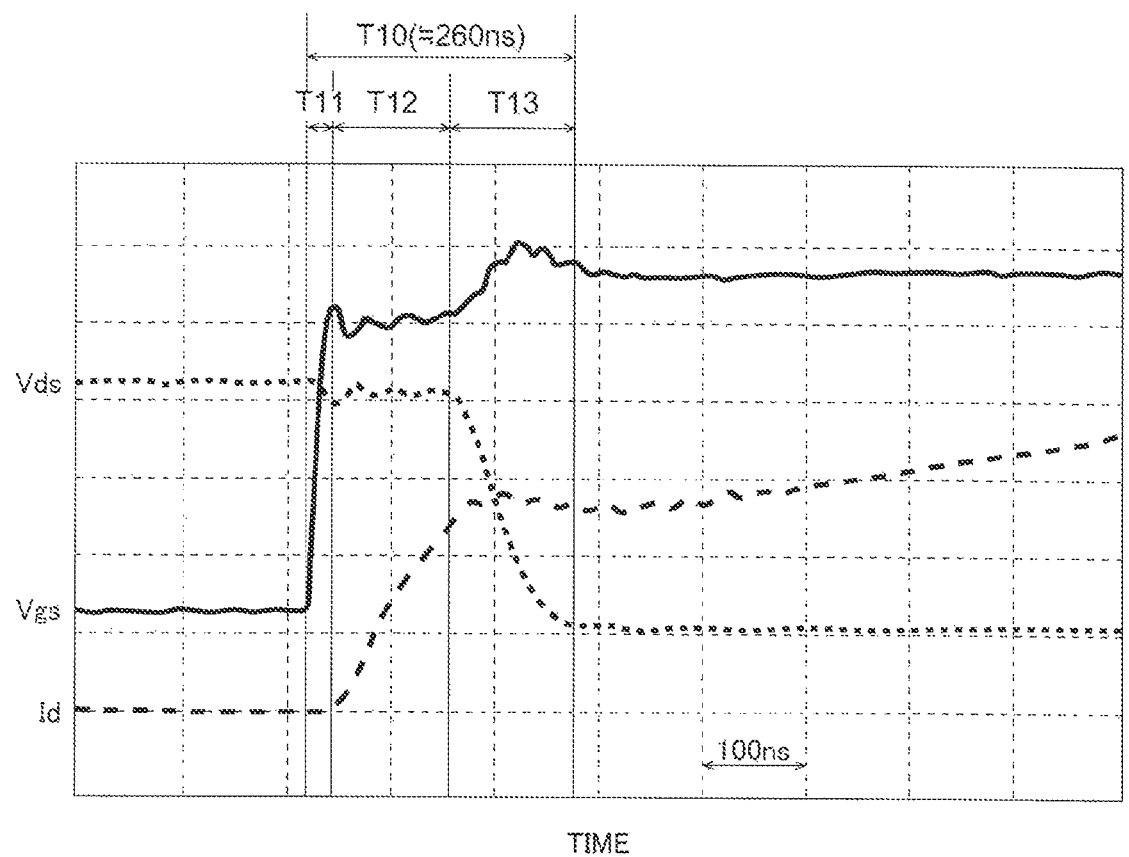
FIG. 12 is a switching waveform diagram of turn-on transient characteristics in this reference example.

FIG. 12 is a switching waveform diagram showing turn-on transient characteristics of the switching element 20 in this reference example. In this diagram, a solid line indicates the gate-source voltage Vgs, a short dashed line indicates the drain-source voltage Vds, and a long dashed line indicates the drain current Id. Further, the horizontal axis is scaled by 100 ns/div, and the vertical axis is scaled by 5 V/div for Vgs, 200 V/div for Vds, and 20 A/div for Id.

Note that this diagram shows transient characteristics when the switching element 20 is turned on in a n application where a high-voltage SiC-MOSFET (rating 1200 V) is used as the switching element 20, to which an inductive load (such as a coil) is connected, under a condition of VCC=18 V, Rg(on)=0.01Ω, and Rgs=4.7 kΩ (i.e. a condition in which the switching speed is increased by decreasing the Rg(on) to a lower limit).

Under the conditions described above, it is confirmed by actual measurement that a torn-on period T10 of the switching element 20 (i.e, a period necessary for the switching element 20 to switch from an OFF stale to an ON state) is approximately 260 ns. In the following description, this turn-on period T10 is roughly classified into three periods T11 to T13 in a temporal order, and each of them is described in detail.

First, the period T11 is described. The period T11 corresponds to a period during which Vgs(real)<Vth (where Vth is an on threshold voltage of the transistor M1) is satisfied. During this period T11, the drain current Id is kept at zero while the gate-source voltage Vgs (=Vgs(real)) is being increased at a predetermined time constant τ (=(Rg(on)+Rin)×Ciss).

Next, the period T12 is described. The period T12 corresponds to a period during which Vth≤Vgs(real)<Vp (where Vp is a plateau voltage at a steady state value of the dram current Id in the transistor M1) is satisfied. Here, the steady state value of the drain current Id indicates a current value flowing in the inductive load after switching. During this period T12, the drain-source voltage Vds is maintained while the drain current Id is being increased. Note that the period T12 ends when the drain current Id reaches the steady state value.

Here, a SiC-MOSFET has a mutual conductance smaller than that of a Si-MOSFET in general, and has a tendency that the plateau voltage Vp is higher as the drain current Id is larger. This point is described in detail with reference to FIG. 13.

Figure 13:
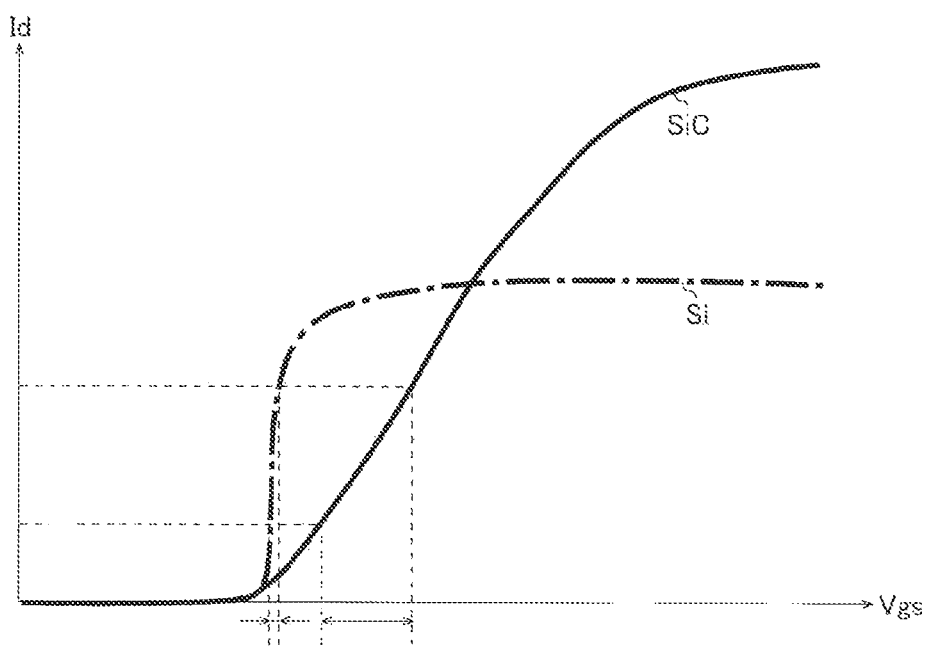
FIG. 13 is an Id-Vgs characteristic diagram.

FIG. 13 is an Id-Vgs characteristic diagram in which the ventrical axis indicates the drain current Id and the horizontal axis indicates the gate-source voltage Vgs. Note that the solid line indicates Id-Vgs characteristics of the SiC-MOSFET, and the dashed-dotted line indicates Id-Vgs characteristics of the Si-MOSFET.

As described above, a mutual conductance of a SiC-MOSFET is smaller than that of a Si-MOSFET in general. Therefore, the Id-Vgs characteristics of the SiC-MOSFET (a solid line) has a smaller gradient (=d(Id)/d(Vgs)) than the Si-MOSFET.

Thus, the gate-source voltage Vgs of the Si-MOSFET (dashed-dotted line) changes little when the drain current Id changes, but the gate-source voltage Vgs of the SiC-MOSFET (a solid line) changes largely when the drain current Id changes.

In this way, in the SiC-MOSFET, the plateau voltage Vp is higher as the drain current Id is larger. As a result, a transition timing to a plateau region (i.e, a transition timing from the period T12 to the period T13) is delayed, and hence the turn-on period T10 of the switching element 20 is increased.

With reference to FIG. 12 again, the period T13 (i.e., the plateau region) is described. The period T13 corresponds to a period during which Vgs(real)=Vp is satisfied. During this period T13, the gate-source voltage Vgs is maintained while the drain-source voltage Vds is being decreased.

Here, in a SiC-MOSFET, the plateau voltage Vp is higher as the drain current Id is larger as described above, and hence a difference between the gate-source voltage Vgs (=VCC) applied to the switching element 20 and the plateau voltage Vp (=Vgs(real)) is smaller. As a result, the gate current Ig (=(Vgs−Vp)/(Rg(on)+Rin)) is decreased, and charging time of the gate-drain parasitic capacitance Cgd is increased, resulting in an increase of the period T13 (therefore the turn-on period T10). In particular, as the internal gate resistor Rin has a larger resistance, the gate current Ig is smaller, and thus the periods T12 and T13 are longer.

For instance, when applying the switching element 20 to a switching power supply, high frequency driving of the switching element 20 contributes to downsizing of passive elements. However, as the turn-on period T10 of the switching element 20 and a turn-off period thereof (a period after the gate-source voltage Vgs begins to fall until the drain current Id reaches 0 A) are longer, a switching loss is larger or it is necessary to secure a larger dead time. Therefore, in order to perform the high frequency driving of the switching element 20, it is very important to achieve high speed switching of the switching element 20.

Note that it is possible to decrease the periods T12 and T13 (therefore the turn-on period T10) by increasing the gate-source voltage Vgs that is applied when the switching element 20 is turned on, because the gate current Ig is increased. However, in order to prevent breakdown of the element, a gate-source voltage Vgs higher than a DC rated voltage (e.g. 22 V) cannot be applied to the switching element 20 continuously in the steady on state of the switching element 20.

Therefore, in the embodiment described below, there is proposed the gate drive circuit 10 that can achieve high speed switching by temporarily increasing the gate-source voltage Vgs of the switching element 20 only for an instant of turning on.

Note that, among first to sixteenth embodiments described below, the former part, i.e. the first to ninth embodiments have the same structure as Patent Document 5 filed by this applicant, and are understood as comparative examples to be compared with the tenth to sixteenth embodiments (having a structure in which a capacitance variation of a capacitor is taken into account).

First Embodiment

Figure 14:
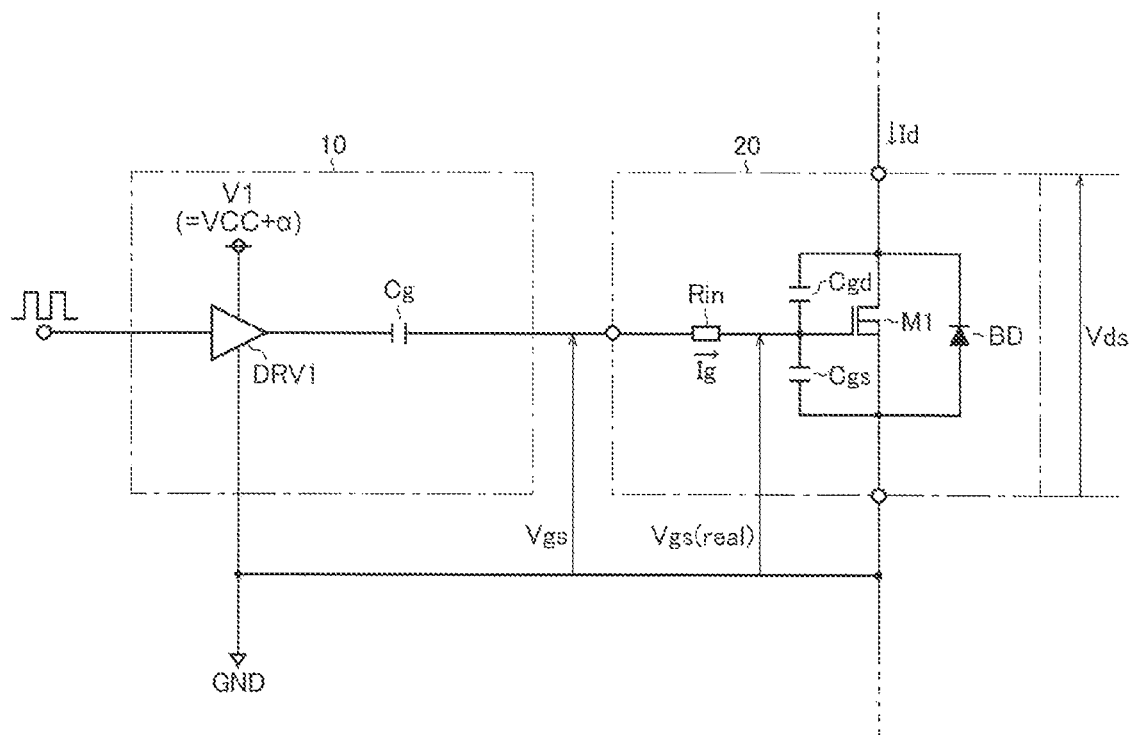
FIG. 14 is an equivalent circuit diagram illustrating a first embodiment of the gate drive circuit.

FIG. 14 is an equivalent circuit diagram illustrating the first embodiment of the gate drive circuit 10. The gale drive circuit 10 of this embodiment is an analog circuit for driving a voltage drive type switching element 20 (such as a SiC-MOSFET) in the same manner as the reference example (FIG. 11) described above, and includes, in addition to the drive unit DRV1 described above, a capacitor Cg connected an series to the gate terminal of the switching element 20, and a gate drive voltage source V1.

The drive unit DRV1 outputs a binary pulse voltage (a gate drive voltage (VCC+α) or the ground voltage GND) from its output terminal in accordance with a logic level of a pulse control signal input to the drive unit DRV1, so as to voltage drive the gate terminal of the switching element 20.

The capacitor Cg is connected between the output terminal of the drive unit DRV1 and the gate terminal of the switching element 20. In particular, a drive target of the gate drive circuit 10 of this embodiment is the voltage drive type switching element 20, and it is not necessary to continuously supply the gate current in the steady ON state of the switching element 20. Therefore, only the capacitor Cg is sufficient as an essential circuit element connected directly to the gate terminal of the switching element 20.

Note that the voltage applied to the gate-source parasitic capacitance Cgs in the steady ON state is determined by a capacitance ratio between the capacitor Cg and the gate-source parasitic capacitance Cgs. Therefore, concerning the capacitor Cg, it is preferred to design element thereof so that the voltage applied to the gate-source parasitic capacitance Cgs in the steady ON state is the DC rated voltage or lower. Taking an example of SiC-MOSFET, the gate-source parasitic capacitance Cgs thereof has a capacitance value of approximately 2 nF, and hence it is preferred to design so that the capacitor Cg has a capacitance value of approximately 30 nF, for example.

The gate drive voltage source V1 supplies a gate drive voltage (VCC+α) (e.g. 23 V) higher than the power supply voltage VCC (e.g. 18 V) to the drive unit DRV1.

More specific description is as follows. Vx represents a voltage applied across both ends of the gate-source parasitic capacitance Cgs in the steady ON state of the switching element 20. Vy represents a voltage applied to a circuit element other than the capacitor Cg (such as an upper side transistor forming an output stage of the drive unit DRV1) among circuit elements disposed between the gate drive voltage source V1 and the gate terminal of the switching element 20. Then, it is sufficient that the gate drive voltage source V1 supplies a voltage that is substantially higher than the sum of the above two voltages (=Vx+Vy), as the gate drive voltage (VCC+α).

In other words, in the gate drive voltage source V1, a voltage value of the gate drive voltage (VCC+α) should be appropriately set so that a voltage across both ends of the capacitor Cg does not become substantially zero also in the steady ON state of the switching element 20.

Note that, in the conventional gate drive circuit, a speedup capacitor is connected in parallel to the gate resistor (see Rg(on) in FIG. 11) in many cases. However, in the steady ON state of the switching element, the gate current does not flow in the gate resister, and hence the voltage across both ends of the speedup capacitor is zero. In this point of view, it can be said that the capacitor Cg and the conventional speedup capacitor are completely different from each other. As a matter of course, the voltage across both ends of the speedup capacitor cannot be completely zero due to an influence of a leak current and the like, but this can be regarded to be substantially zero.

When performing the switching drive of the switching element 20 using the gate drive circuit 10 having the structure described above, the gate current Ig flows from the gate drive voltage source V1 through the capacitor Cg immediately after turning on of the switching element 20. Here, when the operation begins, no voltage is applied across both ends of the capacitor Cg, and hence the gate drive voltage (VCC+α) is applied as the gate-source voltage Vgs of the switching element 20 substantially as it is. As a result the gate input capacitance Ciss is charged using the gate drive voltage (VCC+α), and thus it is possible to turn on the switching element 20 at high speed.

After that, when the switching element 20 teaches the steady ON state (i.e, a state where the gate current Ig does not flow), the gate-source voltage Vgs of the switching element 20 (=Vgs(real)) is converged to a voltage value that is determined by the capacitance ratio between the capacitor Cg and the gate-source parasitic capacitance Cgs.

For instance, the capacitance ratio between the capacitor Cg and the gate-source parasitic capacitance Cgs should be appropriately set, so that the power supply voltage VCC is applied across both ends of the gate-source parasitic capacitance Cgs in the steady ON state of the switching element 20, and that a voltage α is applied across both ends of the capacitor Cg.

Figure 15:
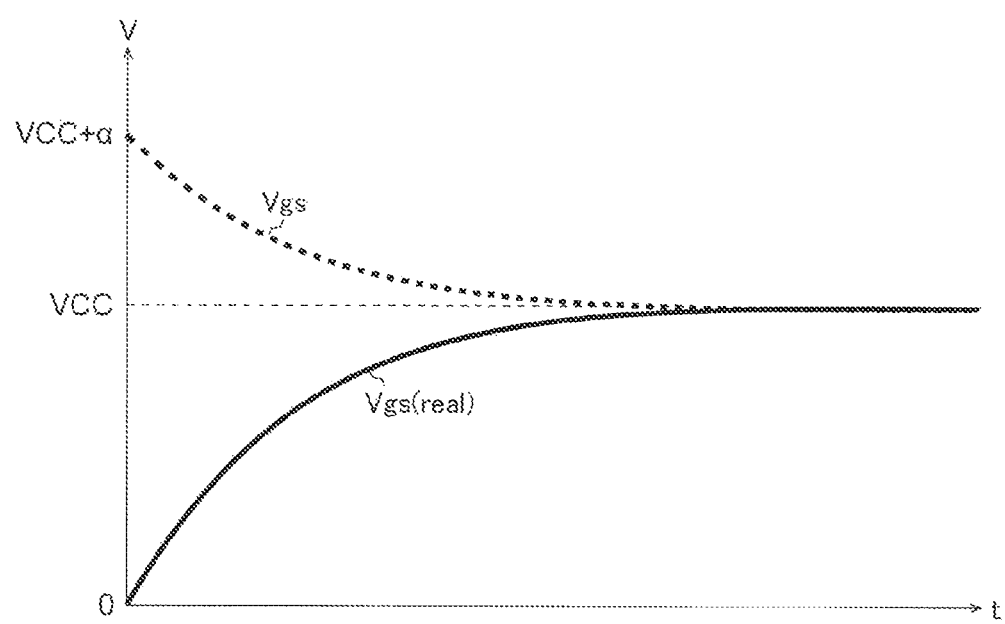
FIG. 15 is a voltage waveform diagram showing turn-on behaviors of Vgs and Vgs(real).

FIG. 15 is a voltage waveform diagram illustrating turn-on behaviors of Vgs and Vgs(real) described above. Note that a broken line in this diagram indicates a turn-on behavior of the gate-source voltage Vgs, and a solid line indicates a turn-on behavior of the voltage Vgs(real) across both ends of the gate-source parasitic capacitance Cgs.

As described above, the gate drive voltage (VCC+α) is applied as the gate-source voltage Vgs substantially as it is, immediately after turning on of the switching element 20. In contrast, the voltage Vgs(real) across both ends of the gate-source parasitic capacitance Cgs is being increased from zero. After that, when the switching element 20 reaches the steady ON state, each of the both voltages is converged to the power supply voltage VCC.

In this way, the gate drive circuit 10 of this embodiment can temporarily increase the gate-source voltage Vgs of the switching element 20 only for an instant of turning on without increasing a circuit scale or needing a complicated control. Thus high speed switching of the switching element 20 can be realized with a very simple structure.

Note that, in order to prevent breakdown of the element, a DC rated voltage VA (i.e. a voltage that can be regularly applied) and a rated surge voltage VB (i.e, a voltage that can be instantaneously applied) are defined between gate and source of the switching element 20. In view of this, it is preferred to set the gate drive voltage (VCC+α) to be a voltage value that is higher than the DC rated voltage VA and lower than the rated surge voltage VB (VA<VCC+α<VB). For instance, if VA is 22 V and VB is 26 V, VCC+α should be set to be 23 to 25 V.

Further, in the steady ON state of the switching element 20, the voltage Vgs(real) across both ends of the gate-source parasitic capacitance Cgs (e.g. Vgs(real) VCC) should be set to a voltage value that is lower than the DC rated voltage VA and can sufficiently decrease an on-resistance value of the switching element 20 (e.g. 1 V).

By setting in this way, the switching speed can be increased as much as possible within a rated operating range of the switching element 20.

Figure 16:
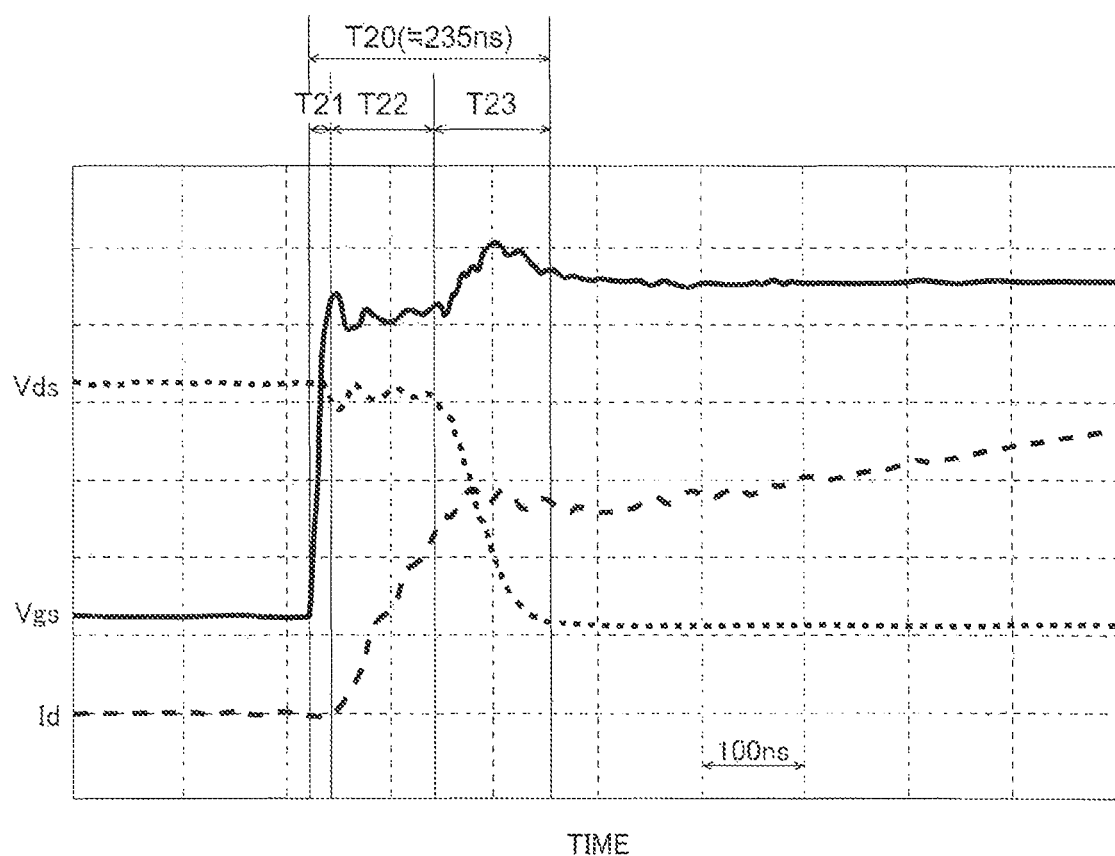
FIG. 16 is a switching waveform diagram showing turn-on transient characteristics in the first embodiment.

FIG. 16 is a switching waveform diagram showing turn-on transient characteristics of the switching element 20 in the first embodiment, in the same manner as in FIG. 12 described above, a solid line in this diagram indicates the gate-source voltage Vgs, a short dashed line indicates the drain-source voltage Vds, and a long dashed line indicates the drain current Id. Further, the horizontal axis is scaled by 100 ns/div, and the vertical axis is scaled by 5 V/div for Vgs, 200 V/div for Vds, and 20 A/div for Id.

Note that this diagram shows transient characteristics when the switching element 20 is turned on in an application where a high-voltage SiC-MOSFET (rating 1200 V) as used as the switching element 20, to which an inductive load (such as a coil) is connected, under a condition of VCC+α=23 V and Cg=30 nF.

Further, a turn-on period T20 in this diagram is roughly classified into three periods T21 to T23 in a temporal order, in the same manner as the turn-on period T10 in FIG. 12, and the periods T21 to 723 in this diagram correspond to the periods T11 to T13 in FIG. 12, respectively.

Under the conditions described above, it is confirmed by actual measurement that the turn-on period T20 of the switching element 20 is approximately 235 ns. In other words, according to the gate drive circuit 10 of the first embodiment, the turn-on period of the switching element 20 can be decreased by 10% compared with the reference example (see FIGS. 1 and 12) described above (decreased from T10=260 ns to T20=235 ns).

Note that a SiC-MOSFET is used as the switching element 20 in the example described above, but the effect described above does not depend on a material or a structure of the switching element 20. For instance, using a Si-MOSFET, a Si-IGBT (Insulated Gate Bipolar Transistor), or a SiC-IGBT, improvement of the switching speed can be expected in the same manner, and there are wide applications to general gate drive circuits for a voltage drive type switching element as a drive target. When an IGBT is a drive target, as terminal names of the transistor M1 in the above description, "source" should be replaced with "emitter", and "din" should be replaced with "collector".

However, as described above, a SiC-MOSFET has a smaller mutual conductance than a Si-MOSFET, and hence a turn-on period thereof is increased in an application where the drain current Id is large. Therefore, it is considered that the effect of improving the switching speed with the structure described above is high in the SiC-MOSFET.

In view of this, it can be said that the structure of this embodiment is suitable particularly for a gate drive circuit that drives SiC-based switching element.

Second Embodiment

Figure 17:
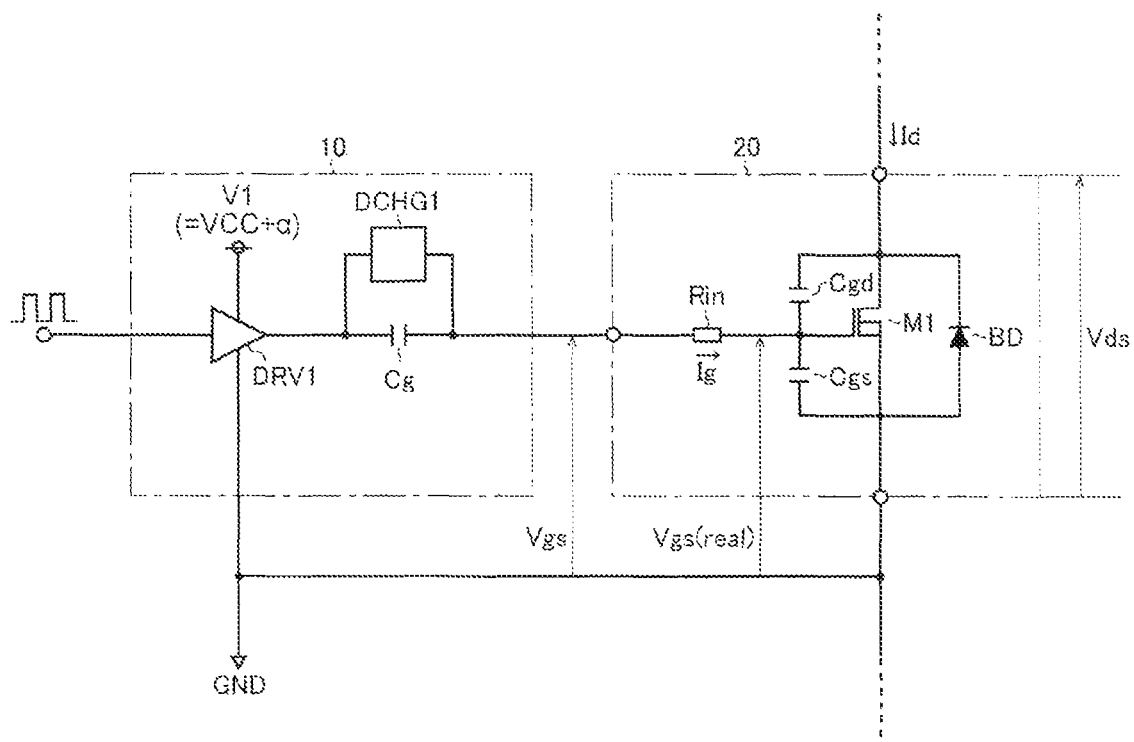
FIG. 17 is an equivalent circuit diagram illustrating a second embodiment of the gate drive circuit.

FIG. 17 is an equivalent circuit diagram illustrating a second embodiment of the gate drive circuit. The gate drive circuit 10 of this embodiment is based on the first embodiment (FIG. 14) and further includes a discharge unit DCHG1. The discharge unit DCHG1 is connected in parallel to the capacitor Cg, and discharges the capacitor Cg when the switching element 20 is turned off. With this structure, when the switching element 20 is turned off, it is possible to prevent application of a negative voltage to the gate terminal of the switching element 20 or to adjust the voltage applied to the gate terminal of the switching element 20 as necessary.

Third Embodiment

Figure 18:
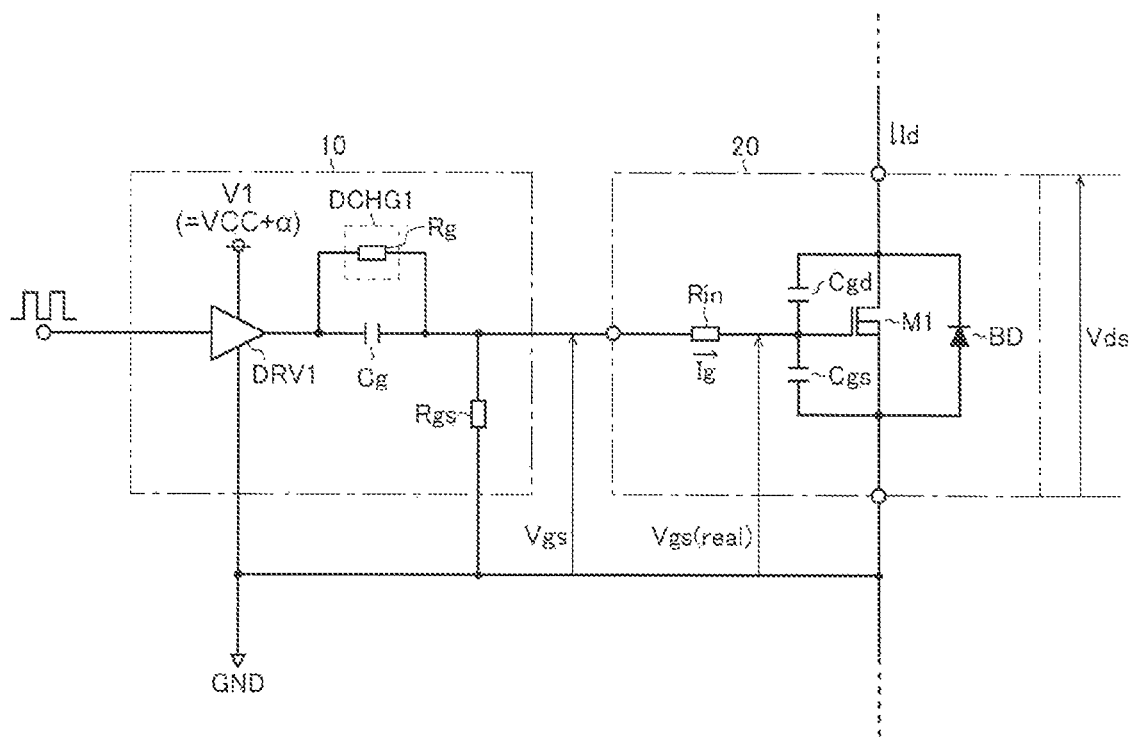
FIG. 18 is an equivalent circuit diagram illustrating a third embodiment of the gate drive circuit.

FIG. 18 is an equivalent circuit diagram illustrating a third embodiment of the gate drive circuit. The gee drive circuit 10 of this embodiment is based on the second embodiment (FIG. 17) with the resistor Rg as the discharge unit DCHG1 and further includes the resistor Rgs connected between gate and source of the switching element 20.

In this case, a resistance of the resistor Rg and a resistance of the Rgs are adjusted so that Rg<Rgs holds. Then, a most part of the gate-source voltage Vgs that is applied when the switching element 20 is in the steady ON state can be applied across both ends of the gate-source parasitic capacitance Cgs. Further, with this structure, charge stored in the capacitor Cg when being turned on enables to apply a negative bias to the gate when being turned off only for an instant of switching, and hence higher speed switching can be realized not only when turning on but also when turning off. In the plateau region when being turned off, the voltage applied to the gate-source parasitic capacitance Cgs is Vp (>Vth), which cannot be negative, and hence this effect has a large influence on a device in which the DC rated voltage between gate and source on the negative side is close to zero, and a large negative bias cannot be applied regularly.

In particular, if Rg>>Rin and Rgs>>Rin is satisfied so that Rin can be substantially ignored on the circuit, physical property values of circuit elements are adjusted so that the relationship of Cg:(Cg+Cgs)=(Rg//Rgs):Rg is satisfied. Then, a capacitive division ratio between the capacitor Cg and the gate-source parasitic capacitance Cs can be constant without depending on a drive condition (such as a drive frequency) of the switching element 20 and without causing an unwanted voltage fluctuation due to an imbalance among circuit constants. Note that even if Rg>>Rin and Rgs>>Rin is not satisfied, the same effect can be obtained by appropriately adjusting Rg, Rgs, and Cg in consideration of Rin and Cgs.

For instance, if Cgs=2 nF and Cg=30 nF, Rg is se to 1 kΩ, and Rgs is set to 15 kΩ. Thus, without depending on a drive condition of the switching element 20, in the steady ON state thereof, the power supply voltage VCC is applied across both ends of the gate-source parasitic capacitance Cgs, and the voltage α is applied across both ends of the capacitor Cg.

Fourth Embodiment

Figure 19:
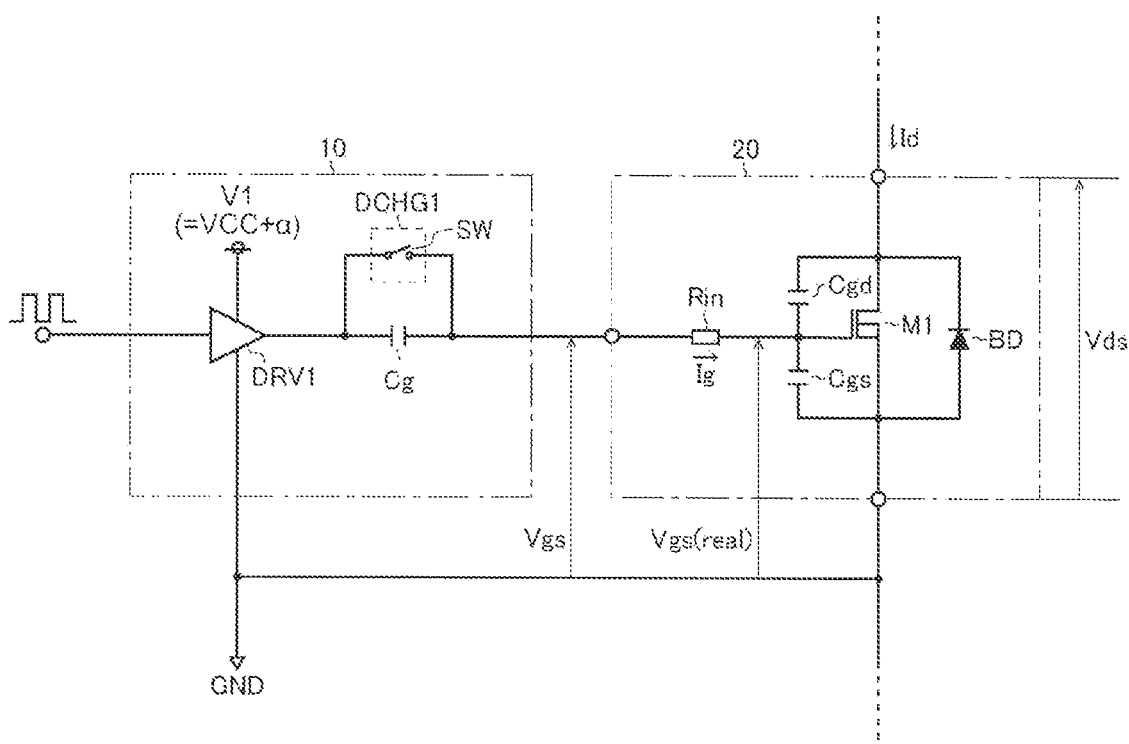
FIG. 19 is an equivalent circuit diagram illustrating a fourth embodiment of the gate drive circuit.

FIG. 19 is an equivalent circuit diagram illustrating a fourth embodiment of the gate drive circuit. The gate drive circuit 10 of this embodiment is based on the second embodiment (FIG. 17) and includes a switch SW as the discharge unit DCHG1. With this structure, by setting the switch SW in OFF state in a period other than a period during which the switching element 20 is turned off, charge stored in the capacitor Cg can be maintained without being discharged, while when the switching element 20 is turned off, the switch SW is switched to ON state, so that the charge stored in the capacitor Cg can be quickly discharged.

Fifth Embodiment

Figure 20:
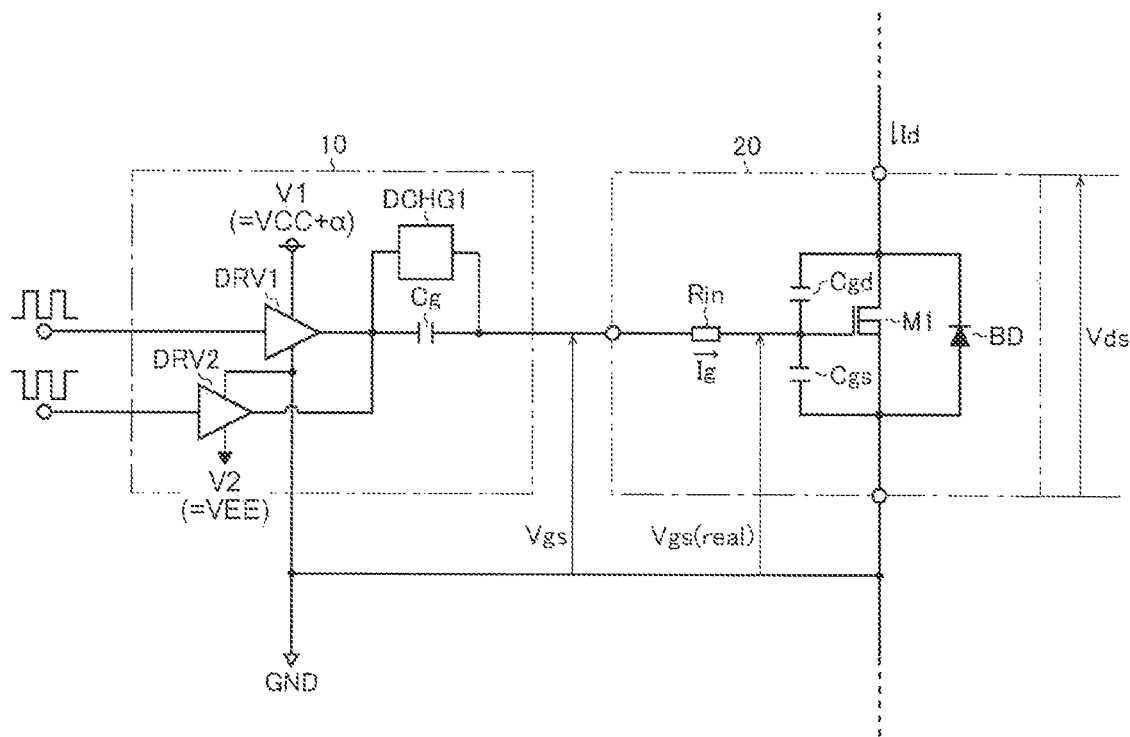
FIG. 20 is an equivalent circuit diagram illustrating a fifth embodiment of the gate drive circuit.

FIG. 20 is an equivalent circuit diagram illustrating a fifth embodiment of the gate drive circuit. The gate drive circuit 10 of this embodiment is based on the second embodiment (FIG. 17) and further includes a drive unit DRV2. Further, along with addition of the circuit elements, operation of the drive unit DRV1 is partially changed, too.

The drive unit DRV1 switches its output state between a first state (i.e, a (VCC+α) output state) and a second state (i.e, a Hi-Z state) in accordance with a logic level of the input control signal. Further, the drive unit DRV2 switches its output state between a first state (i.e, a Hi-Z state) and a second state (i.e, a VEE output state) in accordance with a logic level of the input inverted control signal (corresponding to a logically inverted signal of the control signal). Note that a 3-state buffer, a 3-state inverter, or the like can be used as the drive units DRV1 and DRV2 realizing the above-mentioned operation.

The gate drive voltage source V2 supplies a negative side gate drive voltage VEE (e.g. −2 V) to the drive unit DRV2. Note that the negative side gate drive voltage VEE should be higher than a negative side DC rated voltage between gate and source and lower than or equal to GND.

Adopting this structure, a turn-on driving path and a turn-off driving path can be separated from each other, and hence the gate-source voltage Vgs when the switching element 20 is turned off can be set to a voltage value that does not depend on a positive side gate drive voltage (VCC+α) (i.e, a voltage value that is not "−α"). In this way, an application of a large reverse bias can be prevented, and hence the gate voltage drive can be performed in consideration of the negative side DC rated voltage.

Sixth Embodiment

Figure 21:
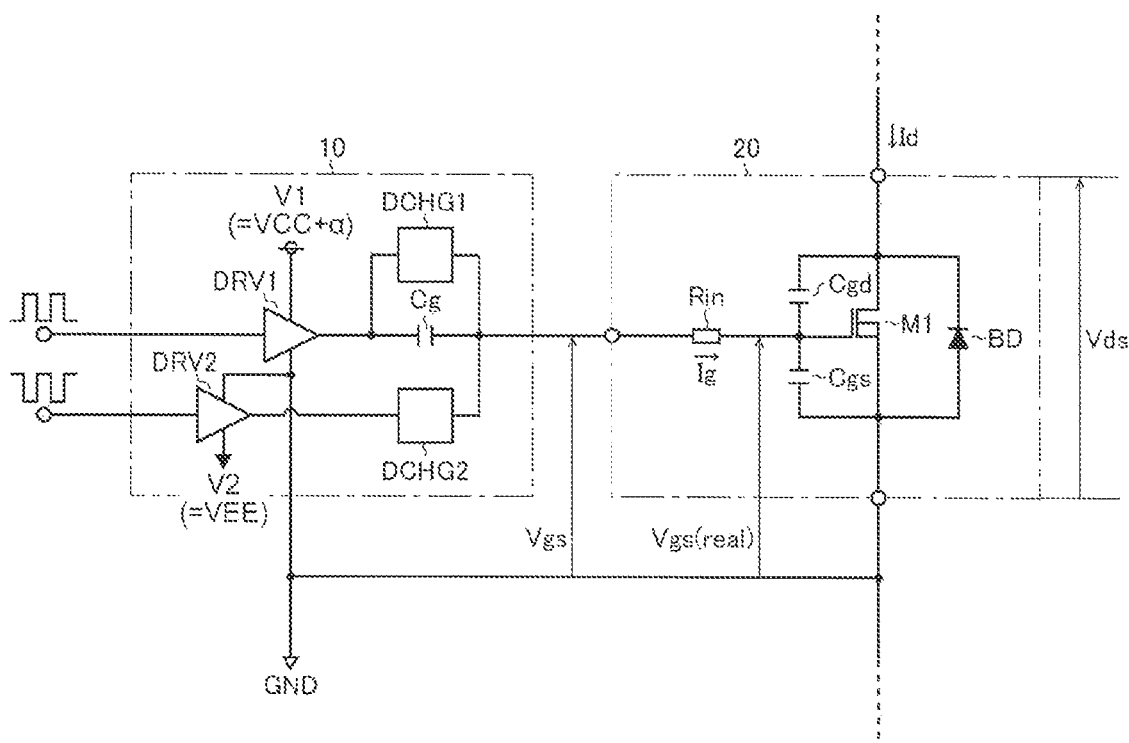
FIG. 21 is an equivalent circuit diagram illustrating a sixth embodiment of the gate drive circuit.

FIG. 21 is an equivalent circuit diagram illustrating a sixth embodiment of the gate drive circuit. The gate drive circuit 10 of this embodiment is based on the fifth embodiment (FIG. 20) and further includes a discharge unit DCHG2. The discharge unit DCHG2 is connected between an output terminal of the drive unit DRV2 and the gate terminal of the switching element 20.

Adopting this structure, a discharge condition when being turned off can be designed separately from that when being turned on.

Seventh Embodiment

Figure 22:
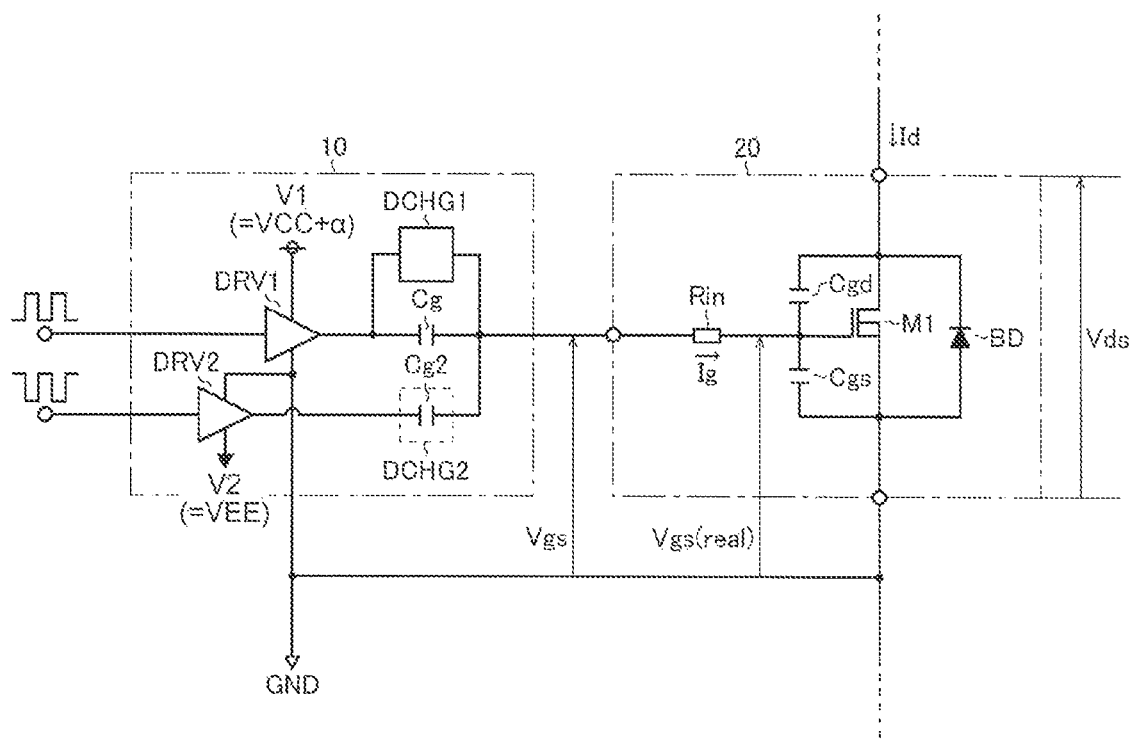
FIG. 22 is an equivalent circuit diagram illustrating a seventh embodiment of the gate drive circuit.

FIG. 22 is an equivalent circuit diagram illustrating a seventh embodiment of the gate drive circuit. The gate drive circuit 10 of this embodiment is based on the sixth embodiment (FIG. 21) and includes a capacitor Cg2 as the discharge unit DCHG2. In this way, as the discharge unit DCHG2 is the capacitor Cg2, higher speed can be realized also in a turning off operation of the switching element 20.

Eighth Embodiment

Figure 23:
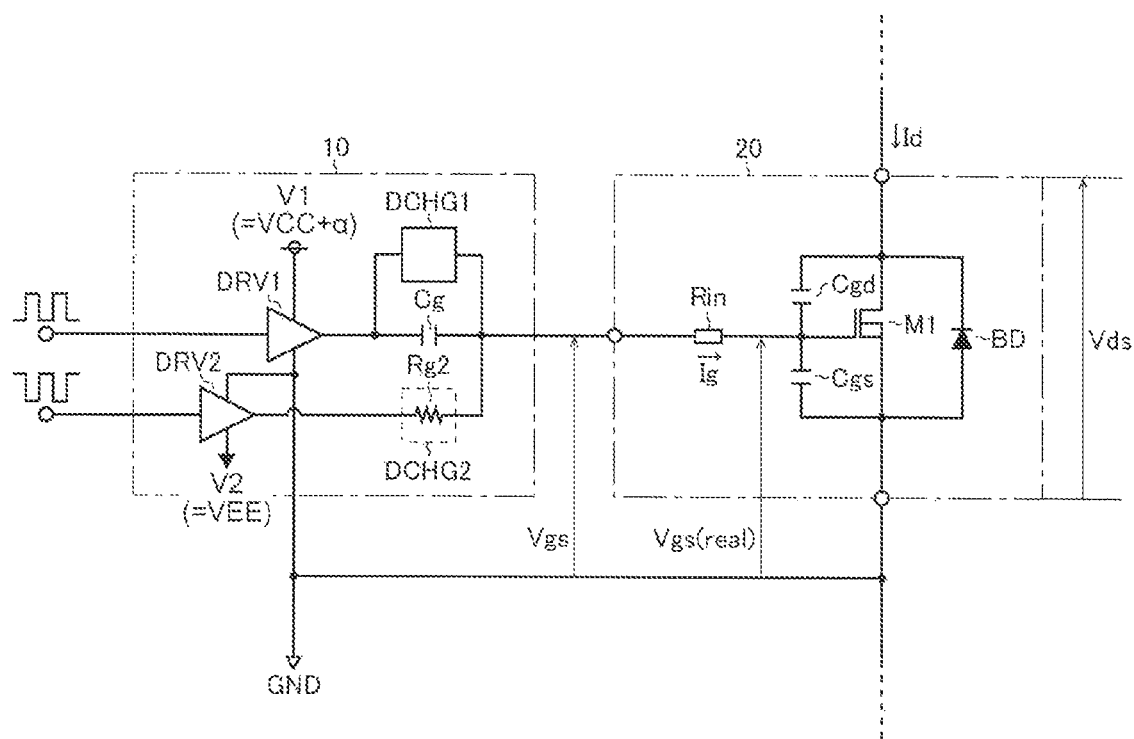
FIG. 23 is an equivalent circuit diagram illustrating an eighth embodiment of the gate drive circuit.

FIG. 23 is an equivalent circuit diagram illustrating an eighth embodiment of the gate drive circuit. The gate drive circuit 10 of this embodiment is based on the sixth embodiment (FIG. 21) and includes a resistor Rg2 as the discharge unit DCHG2. In this way, if it is not necessary to realize higher speed of the turning off operation of the switching element 20, the resistor Rg2 can be used as the discharge unit DCHG2.

Ninth Embodiment

Figure 24:
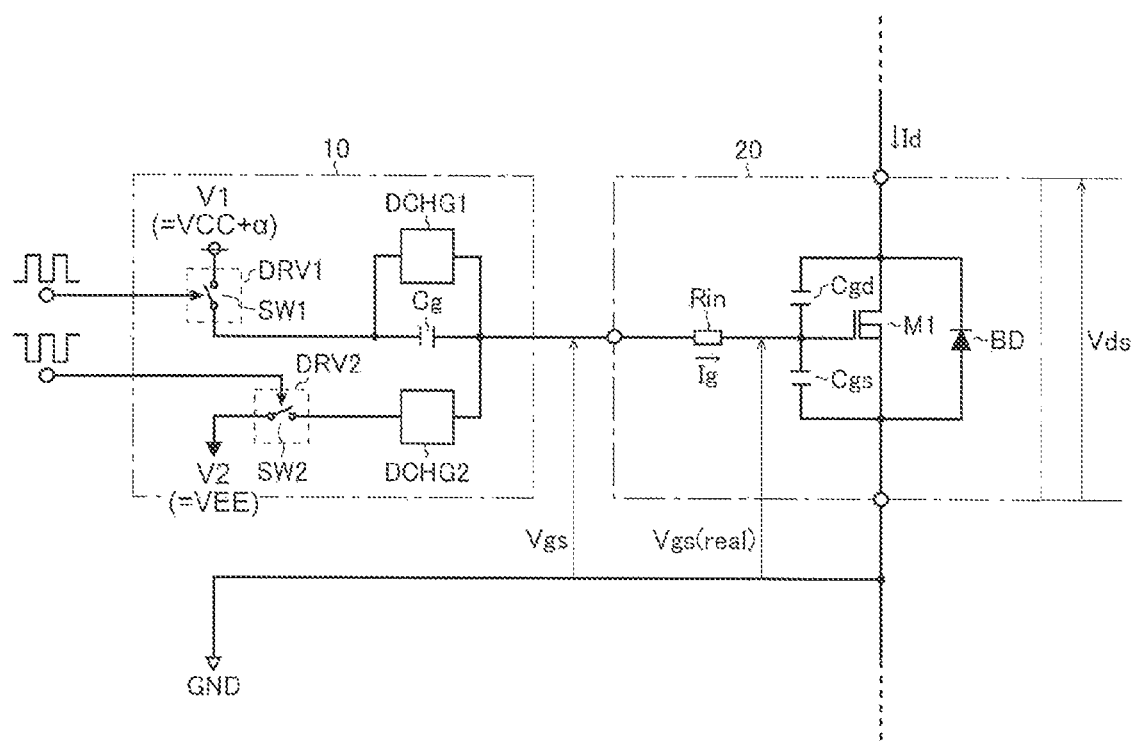
FIG. 24 is an equivalent circuit diagram illustrating a ninth embodiment of the gate drive circuit.

FIG. 24 is an equivalent circuit diagram illustrating a ninth embodiment of the gate drive circuit. The gate drive circuit 10 of this embodiment is based on the sixth embodiment (FIG. 21) and includes switches SW1 and SW2 as the drive units DRV1 end DRV2.

As described above, it is sufficient that the drive unit DRV1 can switch its output state between the first state (i.e, the VCC+α output state) and the second state (i.e, the Hi-Z state) in accordance with the input control signal. Therefore, using the switch SW1 that is turned on and off between the gate drive voltage source V1 and the capacitor Cg as well as the discharge unit DCHG1, the drive unit DRV1 can be easily realized.

In the same manner, it is sufficient that the drive unit DRV2 can switch its output state between the first state (i.e, the Hi-Z state) and the second state (i.e, the VEE output state) in accordance with the input inverted control signal. Therefore, using the switch SW2 that is turned on and off between the gate drive voltage source V2 and de discharge unit DCHG2, the drive unit DRV2 can be easily realized.

<Consideration about Capacitance Variation>

As described above, the gate driving devices 10 of the first to ninth embodiments can easily realize high speed switching of the switching element 20. However, if the capacitance ratio of Cg:Ciss varies, the gate voltage of the switching element 20 (i.e. the voltage Vgs(real) across both ends of the gale-source parasitic capacitance Cgs accompanying the transistor M1) varies, and hence the variation may cause an increase in a switching loss or an excess of the gate voltage over a rated value.

Therefore, as a countermeasure against capacitance ratio variation, voltage division resistors (see, for example, the resistor Rg and the resistor Rgs in FIG. 18) are necessary. In order to decrease a loss in the voltage division resistors, resistance values of them should be set to high values. However, as resistance values of the voltage division resistors are higher, time until the gate voltage is stabilized is longer, and hence the effect of the countermeasure with the voltage division resistors becomes smaller.

In the following description, various proposals are given for a novel embodiment that can easily and appropriately realize high speed switching of the switching element 20, even if there is a variation in the capacitor Cg or the input capacitance Ciss.

Tenth Embodiment

Figure 25:
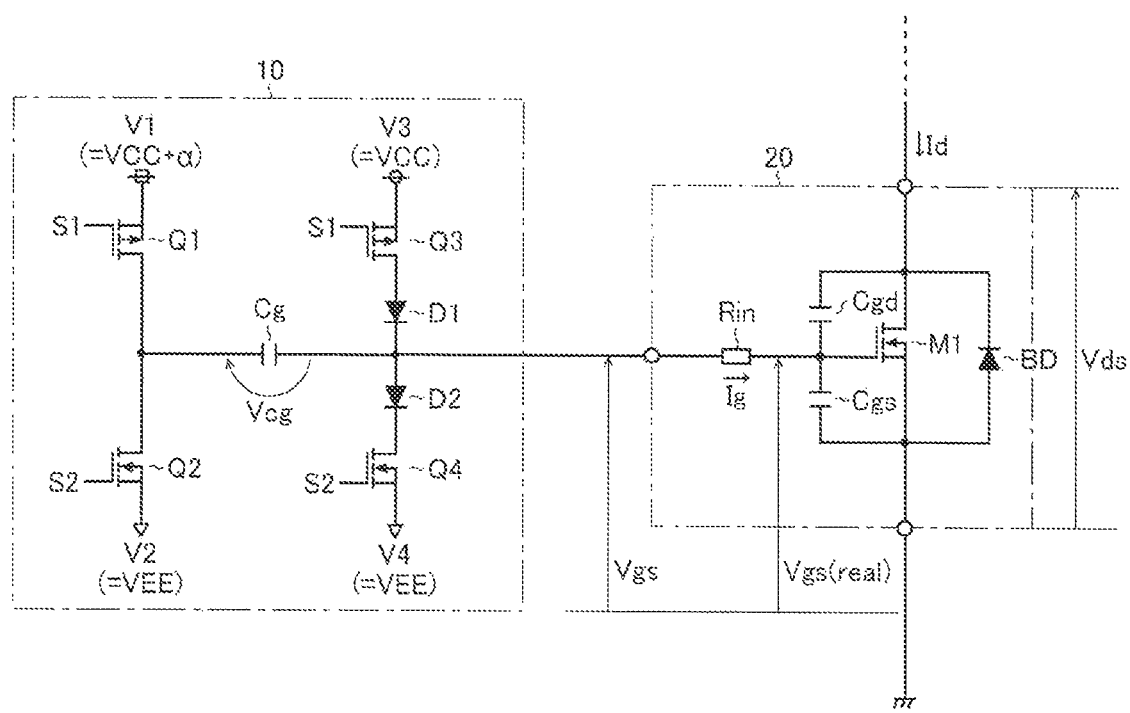
FIG. 25 is an equivalent circuit diagram illustrating a tenth embodiment of the gate drive circuit.

FIG. 25 is an equivalent circuit diagram illustrating a tenth embodiment of the gate drive circuit. The gate drive circuit 10 of this embodiment includes a P-channel type MOS field-effect transistor Q1, an N-channel type MOS field-effect transistor 92, a P-channel type MOS field-effect transistor Q3, an N-channel type MOS field-effect transistor Q4, a capacitor Cg, a diode D1, and a diode D2. Note that in this diagram, a MOS field-effect transistor is used for each of the transistors Q1 to Q4, but this is not a limitation.

A source of the transistor Q1 (corresponding to a first transistor) is connected to an application terminal of a first voltage V1 (=VCC+α, where VCC=18 V and α=6 V, for example). A drain of the transistor Q1 is connected to a first terminal of the capacitor Cg. A second terminal of the capacitor Cg is connected to a gate of the switching element 20. A gate of the transistor Q1 is connected to an application terminal of a control signal S1. Therefore, the transistor Q1 is ON when the control signal S1 is low level, while it is OFF when the control signal S1 is high level.

A drain of the transistor Q2 (corresponding to a second transistor) is connected to the first terminal of the capacitor Cg. A source of the transistor Q2 is connected to an application terminal of a second voltage V2 (=VEE, where VEE=0 V, for example). A gate of the transistor Q2 is connected to an application terminal of a control signal S2. Therefore, the transistor Q2 is ON when the control signal S2 is high level, while it is OFF when the control signal S2 is low level.

Note that the control signals S1 and S2 are pulse signals having basically the same logic level, and the transistor Q2 is driven in anti-phase (complementarily) with respect to the transistor Q1. In other words, the transistor Q2 is OFF when the transistor Q1 is ON, while it is ON when the transistor Q1 is OFF. However, the above "driven in anti-phase" includes a case where a simultaneous OFF period of the transistors Q1 and Q2 (a so-called dead time) is provided to prevent a shoot-through current.

Further, if each of the transistors Q1 and Q2 is an N-channel type, it is also possible to use a logically inverted signal of the control signal S1 as the control signal S2, for example (the simultaneous OFF period is added separately).

A source of the transistor 3 (corresponding to a third transistor) is connected to an application terminal of a third voltage V3 (VCC). The third voltage V3 should be set to a recommended operation voltage of the switching element 20 (i.e, a voltage lower than a maximum rated value of the gate-source voltage Vgs(real), e.g. 18 V). A drain of the transistor Q3 is connected to an anode of the diode D1 (corresponding to a first rectifier element). A cathode of the diode D1 is connected to a second terminal of the capacitor Cg. A gate of the transistor Q3 is connected to an application terminal of the control signal S1. Therefore, the transistor Q3 is ON when the control signal S1 is low level, while it is OFF when the control signal S1 is high level.

In this way, as the common control signal S1 is input to the transistors Q1 and Q3, the transistor Q3 is driven in the same phase as the transistor Q1. In other words, the transistor Q3 is ON when the transistor Q1 is ON, while it is OFF when the transistor Q1 is OFF. However, the above "driven in the same phase" includes a case where the ON liming of the transistor Q1 is delayed from the ON timing of the transistor Q3, as shown in a twelfth embodiment (FIG. 35) or a thirteenth embodiment (FIG. 38), which are described later.

Note that the third voltage V3 (=VCC) should be generated from the first voltage V1 (=VCC+α). In this case, as the DC voltage conversion means, a regulator (see FIG. 45 described later) may be used, or a simpler voltage division resistor circuit or voltage division capacitor circuit may be used.

A drain of the transistor Q4 (corresponding to a fourth transistor) is connected to a cathode of the diode D2 (corresponding to a second rectifier element). An anode of the diode D2 is connected to a second terminal of the capacitor Cg. A source of the transistor Q4 is connected to an application terminal of a fourth voltage V4 (=VEE, e.g. VEE=0 V). A gate of the transistor Q4 is connected to an application terminal of the control signal S2. Therefore, the transistor Q4 is ON when the control signal S2 is high level, while it is OFF when the control signal S2 is low level.

In this way, as the common control signal S2 is input to the transistors Q2 and Q4, the transistor Q4 is driven in the same phase as the transistor Q2. In other words, the transistor Q4 is ON when the transistor Q2 is ON, while it is OFF when the transistor Q4 is OFF. However, the above "driven in the same phase" includes a case where the ON timing of the transistor Q2 is delayed from the ON timing of the transistor Q4, as shown in an eleventh embodiment (FIG. 32) or a thirteenth embodiment (FIG. 38), which are described later.

Note that resistors (see resistors R1 and R2 in FIG. 43 described later) may be connected in series to the diodes D1 and D2, respectively.

The gate drive circuit 10 of this embodiment can increase the gate current Ig in a transient manner immediately after turning on of the switching element 20 and immediately after turning off of the same. Therefore, in the same manner as the first to ninth embodiments described above, high speed switching of the switching element 20 can be realized, and a switching loss can be reduced.

Further, the gate drive circuit 10 of this embodiment can fu the voltage Vgs(real) across both ends of the gate-source parasitic capacitance Cgs accompanying the transistor M1 immediately after turning on at the recommended operation voltage (=VCC), without providing the voltage division resistors (see FIG. 18). Therefore, it is possible to avoid an increase in a switching loss due to a variation of the capacitance ratio of Cg:Ciss or an excess of the gate-source voltage Vgs(real) over a rated value. A detailed description is given below with reference to the drawings.

Figure 26:
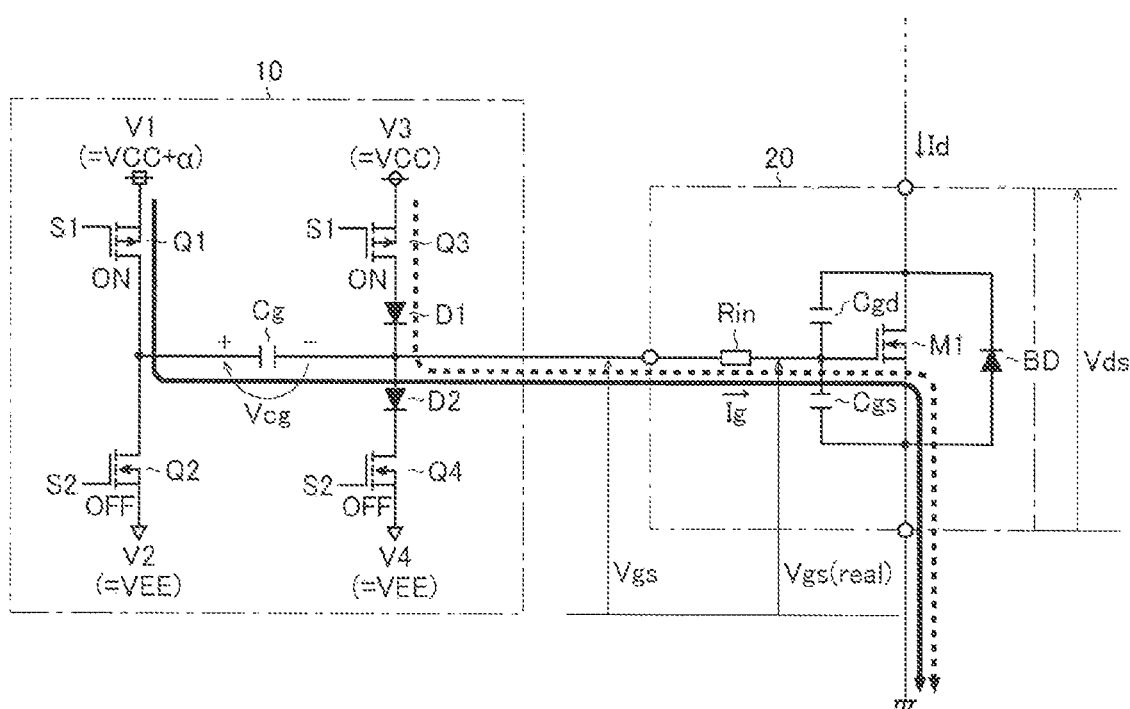
FIG. 26 is a current path diagram for explaining a principle of operation (when being turned on) of the tenth embodiment.

First, a principle of operation when the switching element 20 is turned on is described in detail with reference to FIGS. 26 and 27. FIG. 26 is a current path diagram for explaining a principle of operation of the tenth embodiment (when being turned on).

Figure 27:
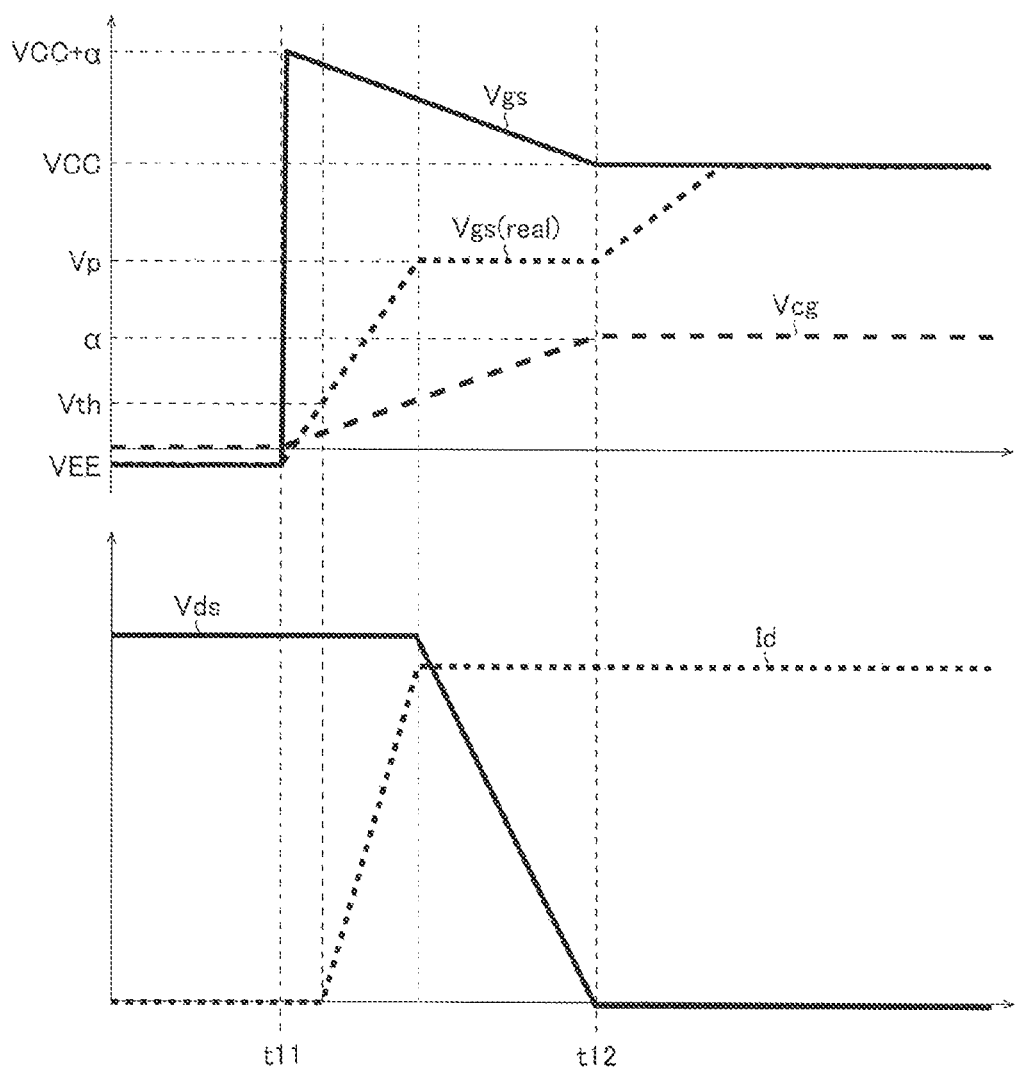
FIG. 27 is a switching waveform diagram showing turn-on transient characteristics in the tenth embodiment.

Further, FIG. 27 is a switching waveform diagram showing turn-on transient characteristics in the tenth embodiment. Note that the upper part of this diagram shows the gate-source voltages Vgs (a solid line) and Vgs(real) (a short dashed line), and a charged voltage Vcg (a long dashed line). On the other hand, the lower part of this diagram shows the drain-source voltage Vds (a solid line) and the drain current Id (a broken line). Further, on the vertical axis in the upper part of this diagram, Vp represents the plateau voltage, and Vth represents the on threshold voltage of the transistor M1.

In the following description, for simple description, forward drop voltage voltages Vf of the diodes D1 and D2 and voltage drops of the transistors Q1 to Q4 are ignored for consideration.

When the switching element 20 is turned on, as illustrated in FIG. 26, the transistors Q1 and Q3 are ON, and the transistors Q2 and Q4 are OFF. Note that immediately after turning on of the switching element 20 (from time t11 to time t12 in FIG. 27), the current flows in a current path indicated by a solid line arrow (V1 to Q1 to Cg to Rio to M1 to GND). Therefore, during this period, the input capacitance Ciss of the transistor M1 is charged by the first voltage V1 (=VCC+α). In this case, Vgs is higher than VCC so that the diode D1 is reversely biased, and hence current does not flow to the application terminal of the third voltage V3.

Further, a capacitance value of the capacitor Cg should be set so that VCC>(VCC+α)×Cg/(Cg+Ciss) is satisfied. By this setting, the gate-source voltage Vgs(real) is increased only to a voltage lower than a the recommended operation voltage of the switching element 20 (=VCC) in a charging period of the input capacitance Ciss using the first voltage V1 (from time t11 to time t12 in FIG. 27). Therefore, even if the capacitance ratio of Cg:Ciss is varied, the gate-source voltage Vgs(real) does not exceed the rated value.

After that, charging of the capacitor Cg proceeds, and when Vgs=VCC is satisfied at time t12 in FIG. 27, the diode D1 is forwardly biased, and the current begins to flow in a current path indicated by a broken line arrow in FIG. 26 (V3 to Q3 to D1 to Rin to M1 to GND). Therefore, in the period after this, charging of the input capacitance Ciss is continued using the third voltage V3 (=VCC).

Further, the gate current Ig does not flow ultimately, and then the gate-source voltage Vgs(real) is fixed to the third voltage V3 (=VCC). Then, Vcg=α holds.

In other words, even if the capacitance ratio of Cg:Ciss is varied, the gate drive circuit 10 of this embodiment is not affected by the variation, and the gate-source voltage Vgs (real) can be fixed to a desired value (i.e, the recommended operation voltage of the switching element 20 (=VCC)). Therefore, an increase in the switching loss or an excess of the gate-source voltage Vgs(real) over a rated value can be prevented.

In this way, considering a variation of the capacitance ratio of Cg:Css, concerning the charging operation of the input capacitance Ciss when being turned on, it is very important to rapidly charge until a midpoint using the first voltage V1 (=VCC+α) and then to securely charge using the third voltage V3 (=VCC) until the desired value.

Next, a principle of operation when the switching element 20 as turned off is described in detail with reference to FIGS. 28 and 29. FIG. 214 is a current path diagram for explaining a principle of operation according to the tenth embodiment (when being turned off).

Further. FIG. 29 is a switching waveform diagram showing turn-off transient characteristics in the tenth embodiment. Note that, in the same manner as FIG. 27 described above, the upper part of this diagram shows the gate-source voltages Vgs (a solid line) and Vgs(real) (a short dashed line), and the charged voltage Vcg (a long dashed line). On the other hand, the lower part of this diagram shows the drain-source voltage Vds (a solid line) and the drain current Id (broken line).

Figure 28:
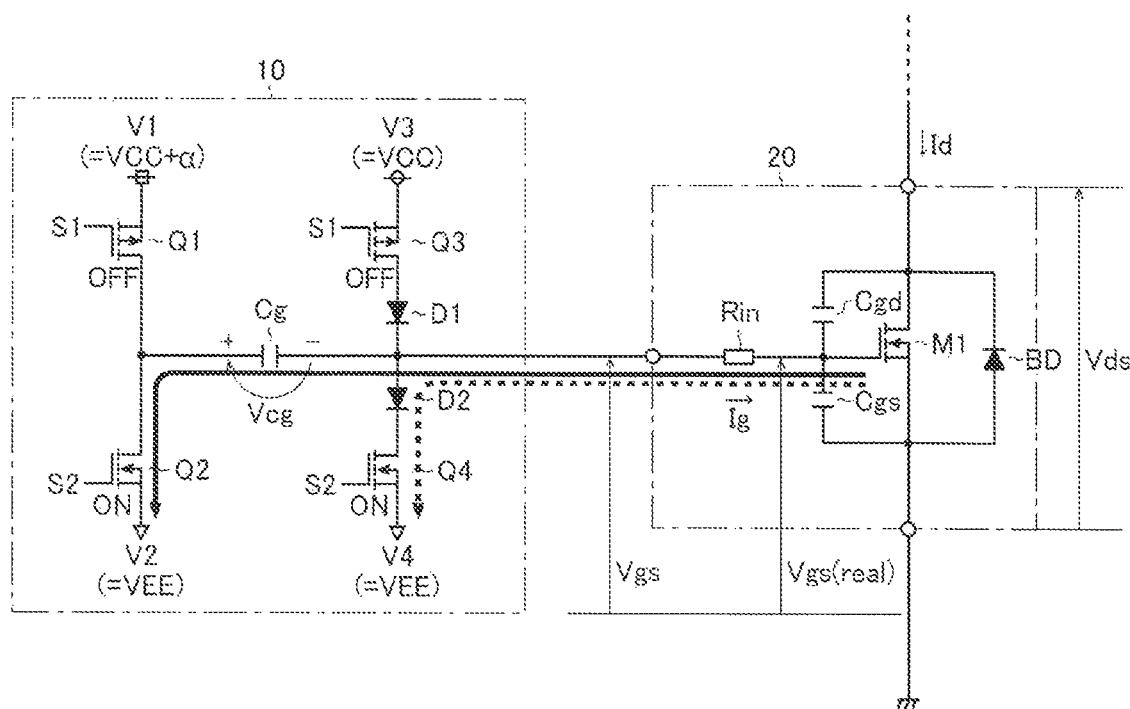
FIG. 28 is a current path diagram for explaining a principle of operation (when being turned off) of the tenth embodiment.

When the switching element 20 is turned off, as illustrated in FIG. 28, the transistors Q1 and Q3 are OFF, and transistors Q2 and Q4 are ON. Note that immediately after turning off of the switching element 20 (from time t21 to time t22 in FIG. 29), the current flows in a current path indicated by a solid line arrow (M1 to Rin to Cg to Q2 to V2). In other words, in this period, using the charged voltage Vcg of the capacitor Cg charged while the switching element 20 is tuned on, the input capacitance Ciss of the transistor M1 is discharged. Therefore, the input capacitance Ciss can be discharged more rapidly than a case where the gate of the switching element 20 is directly short-circuited to the VEE node. Further, in this case, Vgs=VEE-Vcg holds so that the diode D2 is reversely biased, and hence current does not flow to an application terminal of the fourth voltage V4.

Figure 29:
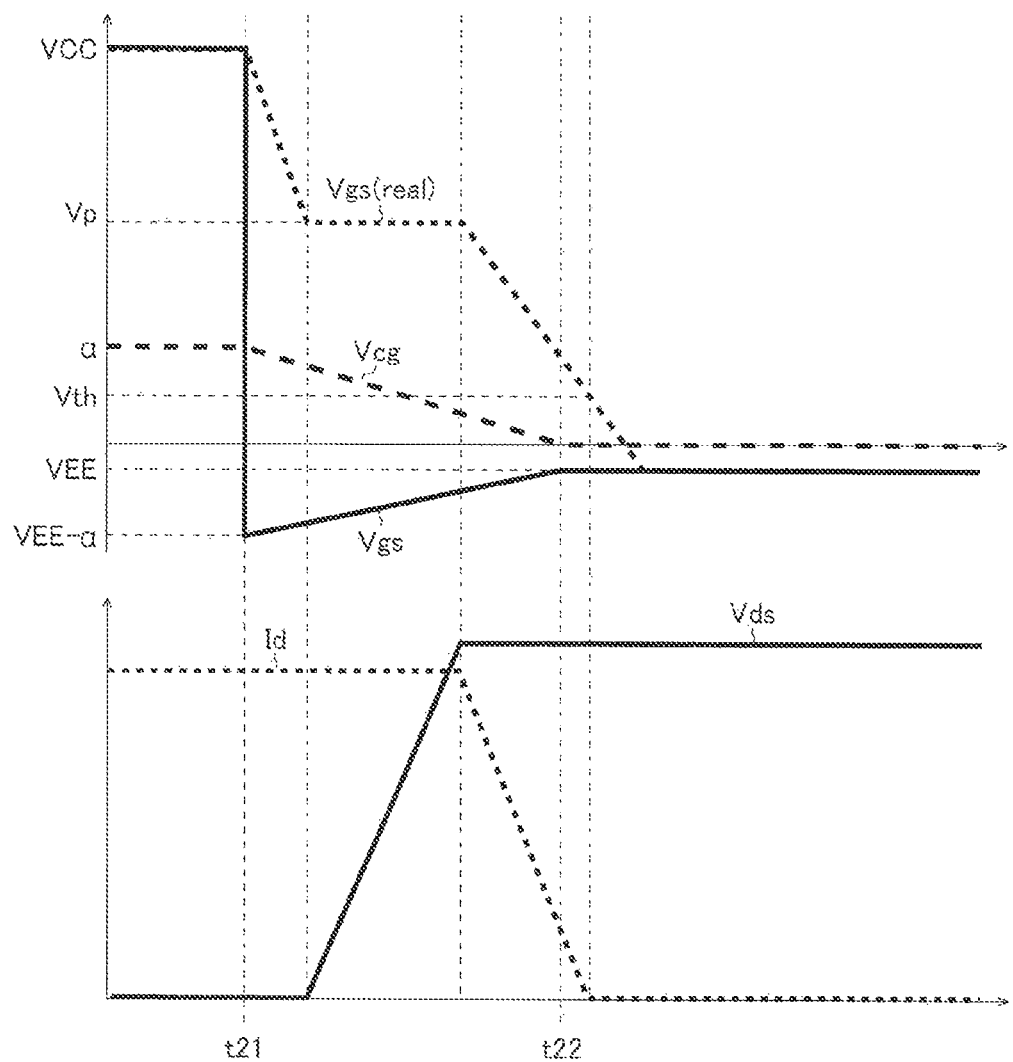
FIG. 29 is a switching waveform diagram showing turn-off transient characteristics in the tenth embodiment.

After that, discharging of the capacitor Cg proceeds, and when Vgs=VEE is satisfied at time t22 in FIG. 29, the diode D2 is forwardly biased, and the current begins to low in a current path indicated by a broken line arrow in FIG. 28 (M1 to Rin to D2 to Q4 to V4). Therefore, in the period after this, discharging of the input capacitance Ciss is continued using the fourth voltage V4 (=VEE).

Further, the gate current Ig does not flow ultimately, and then the gate-source voltage Vgs(real) is fixed to the fourth voltage V4 (=VEE). Then, Vcg=0 holds. In this way, the capacitor Cg can be completely discharged, and hence there is no influence when being turned on next time.

Figure 30:
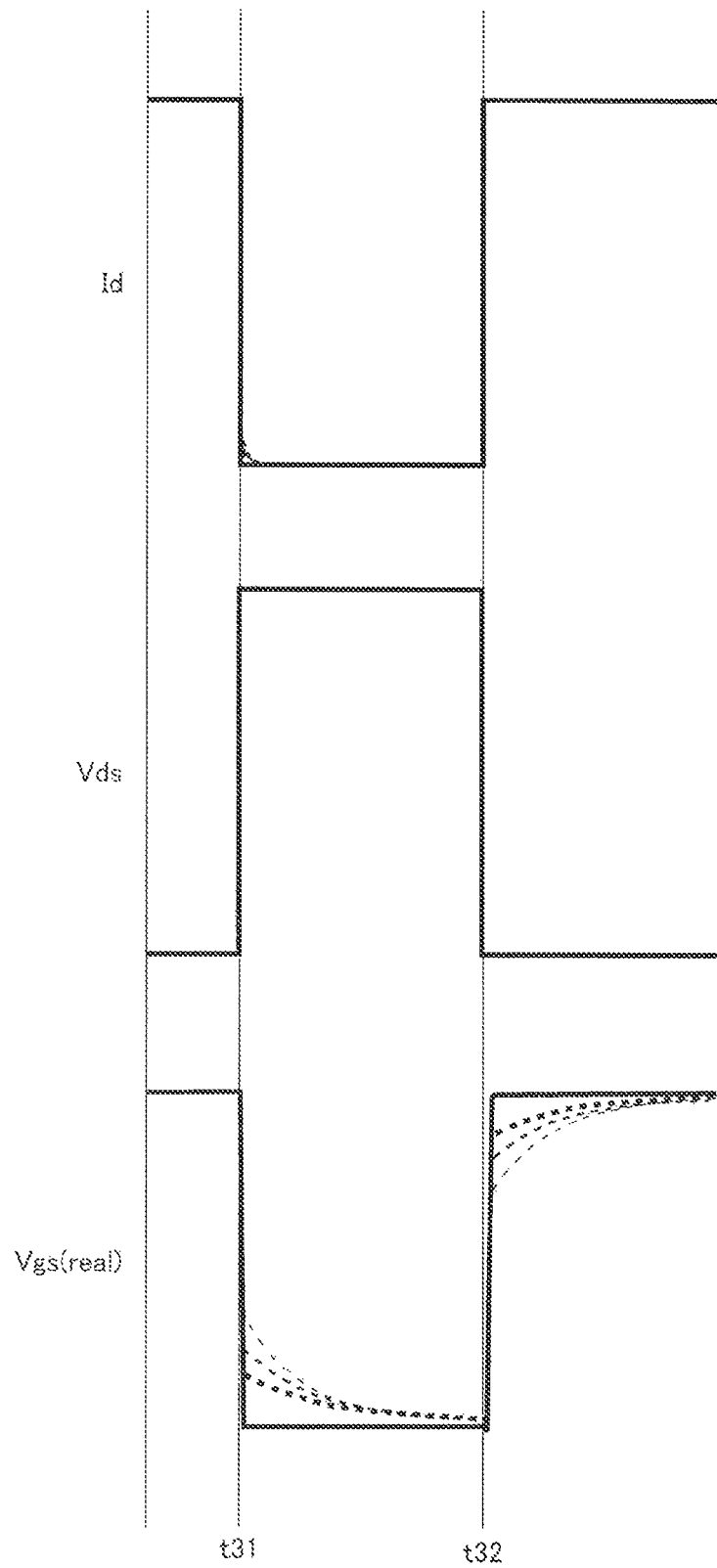
FIG. 30 is a switching waveform diagram for comparatively explaining an influence of capacitance variation.
Figure 31A:
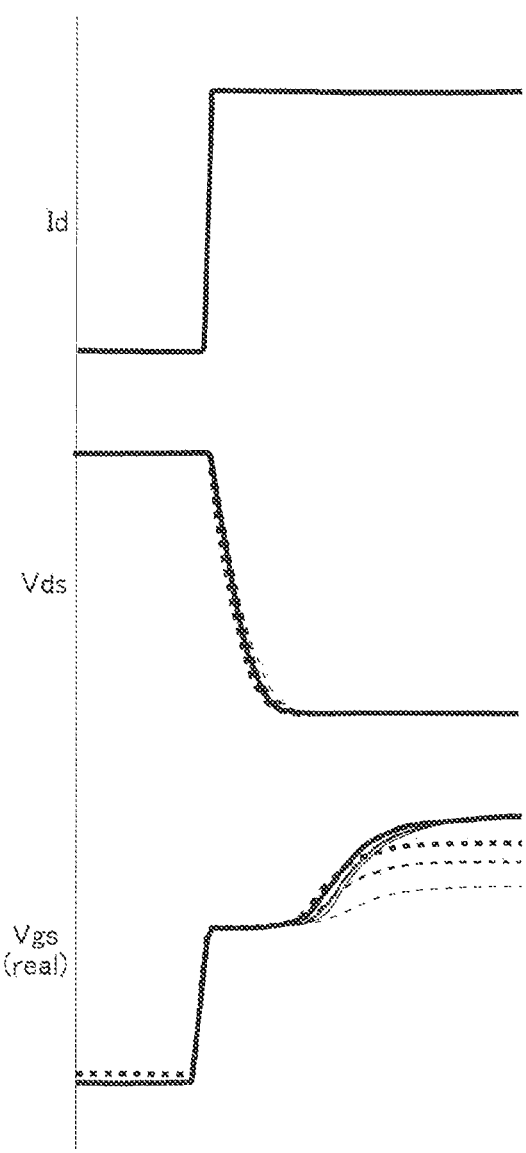
FIG. 31A is a partial enlarged view (when being turned on) of FIG. 20.
Figure 31B:
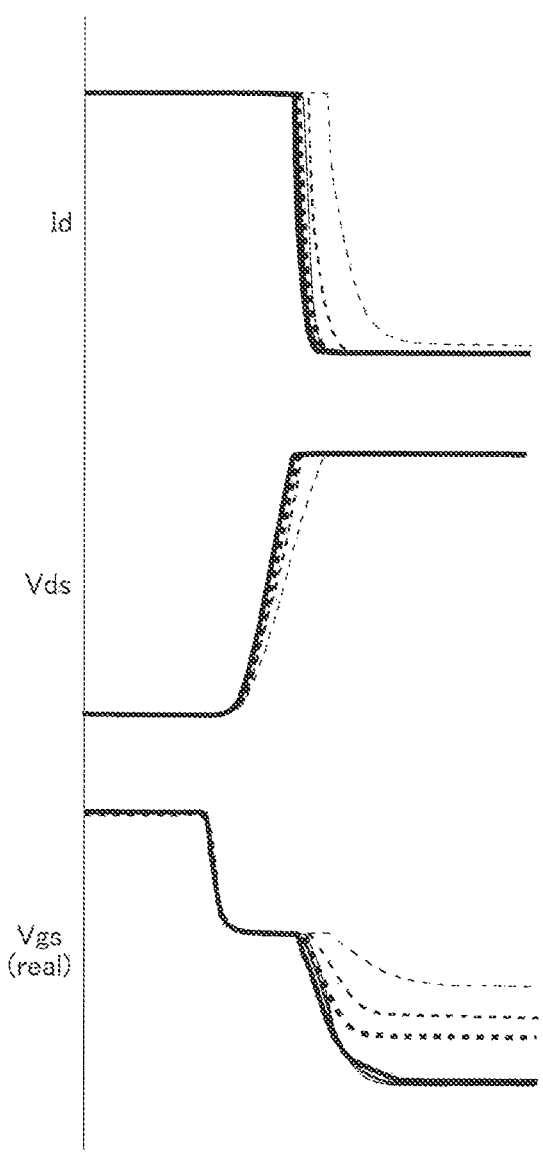
FIG. 31B is a partial enlarged view (when being turned off) of FIG. 20.

FIG. 30 is a simulation waveform diagram for comparatively explaining an influence of capacitance variation, in which the drain current Id, the drain-source voltage Vds, and the gate-source voltage Vgs(real) are shown in order from top to bottom. Further, FIGS. 31A and 31B are partial enlarged view of FIG. 30 when being turned on (before and after time t32) and when being turned off (before and after time t31), respectively.

Note that solid lines in each diagram show behaviors of the tenth embodiment (FIG. 25), and broken lines in each diagram show behaviors of the third embodiment (FIG. 18). Further, the thickness of each line indicates a capacitance variation of the capacitor Cg. More specifically, a thicker line indicates that the capacitance value is larger, while a thinner line indicates that the capacitance value is smaller.

In the third embodiment (FIG. 18), the capacitance variation of the capacitor Cg causes variations in rising time (i.e. time until reaching VCC) and falling time (i.e. time until reaching VEE) of the gate-source voltage Vgs(real). Further, the influence thereof also affects the drain current Id and the drain-source voltage Vds.

In contrast, in the tenth embodiment (FIG. 25), even if the capacitor Cg has a capacitance variation, it hardly affects a behavior of the gate-source voltage Vgs(real). Further, it hardly affects behaviors of the drain current Id and the drain-source voltage Vds, too.

Note that only the capacitance variation of the capacitor Cg is considered in this diagram, but if a capacitance variation of the input capacitance Ciss is also considered, the influence becomes larger. In view of this, it is preferred to adopt the structure of the tenth embodiment (FIG. 25) as a counter measure against a variation of the capacitance values of Cg:Ciss.

<Consideration about SIC Device>

Note that a SiC device (such as a SiC-MOSFET) has a low on threshold voltage Vth and a small transfer conductance gm. Therefore, if rising of the gate-source voltage Vgs(real) is slow, the drain-source voltage Vds is hardly decreased, and hence a switching loss is increased. Also in a steady state, if the variation of the capacitance ratio of Cg:Ciss causes a decrease in Vgs(real) a conduction loss is increased due to an increase in the on-resistance. Further, the SiC device has a large resistance of the internal gate resistor Rin, and hence the gate current Ig is limited to be small. In view of this, it can be said that the gate drive circuit 10 of the tenth embodiment (FIG. 25), in which the gate current Ig is increased in a transient manner so that high speed switching can be realized, is suitable as drive means for the SiC device.

Further, the SiC device has a smaller rated margin of the gate-source voltage Vgs(real) (i.e, a difference between the operation voltage and a maximum rated voltage) compared with a Si device, and when the ratio of Cg:Ciss varies in the third embodiment, an excess of the gate-source voltage Vgs(real) over a rated value occurs easily. In this point, even if the capacitance ratio of Cg:Ciss varies, the gate drive circuit 10 of the tenth embodiment (FIG. 25) can fix the gate-source voltage Vgs(real) immediately after switching to a desired value (i.e, the recommended operation voltage of the switching element 20 (=VCC)). Therefore, in view of this point, too, it can be said that the gate drive circuit 10 of the tenth embodiment (FIG. 25) is suitable as gate drive means for the SiC device.

Eleventh Embodiment

Figure 32:
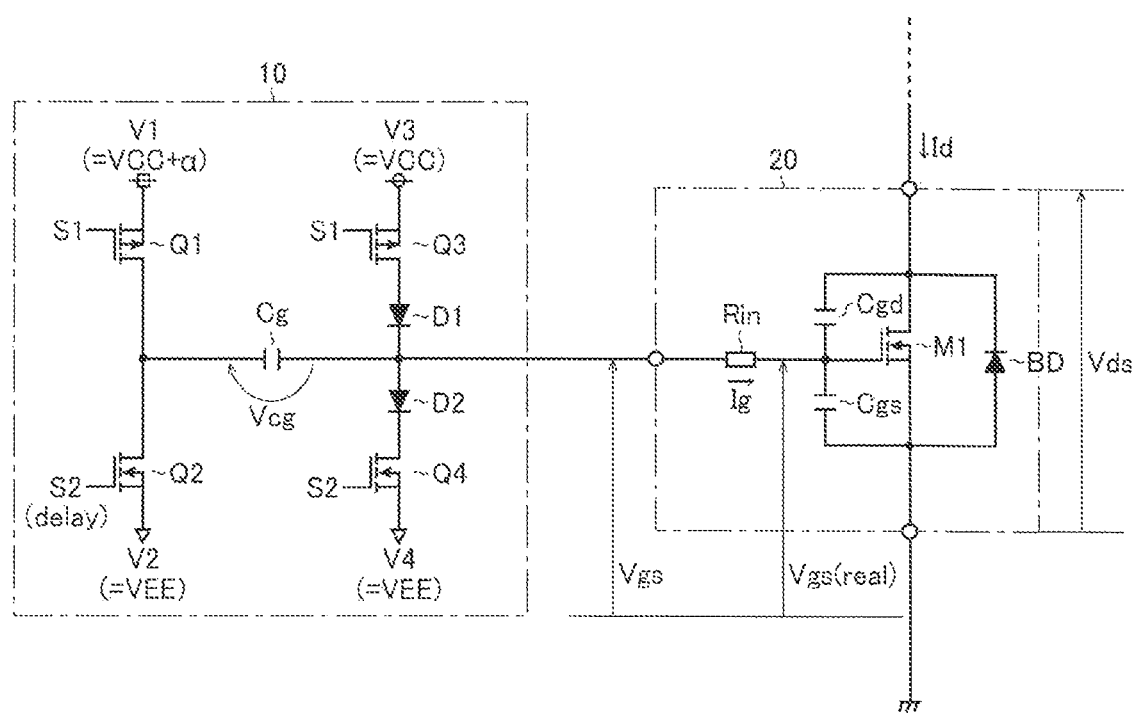
FIG. 32 is an equivalent circuit diagram illustrating an eleventh embodiment of the gate drive circuit.

FIG. 32 is an equivalent circuit diagram illustrating an eleventh embodiment of the gate drive circuit. The gate drive circuit 10 of this embodiment is based on the tenth embodiment (FIG. 25), and when the switching element 20 is turned off, the ON timing of the transistor Q2 is delayed from the ON timing of the transistor Q4 (by 30 ns for example). Note that as means for realizing this embodiment, for example, a delay circuit (not shown) should be provided, which delays only a rising timing of the control signal 32 and outputs the same to the gate of the transistor Q2.

Figure 33:
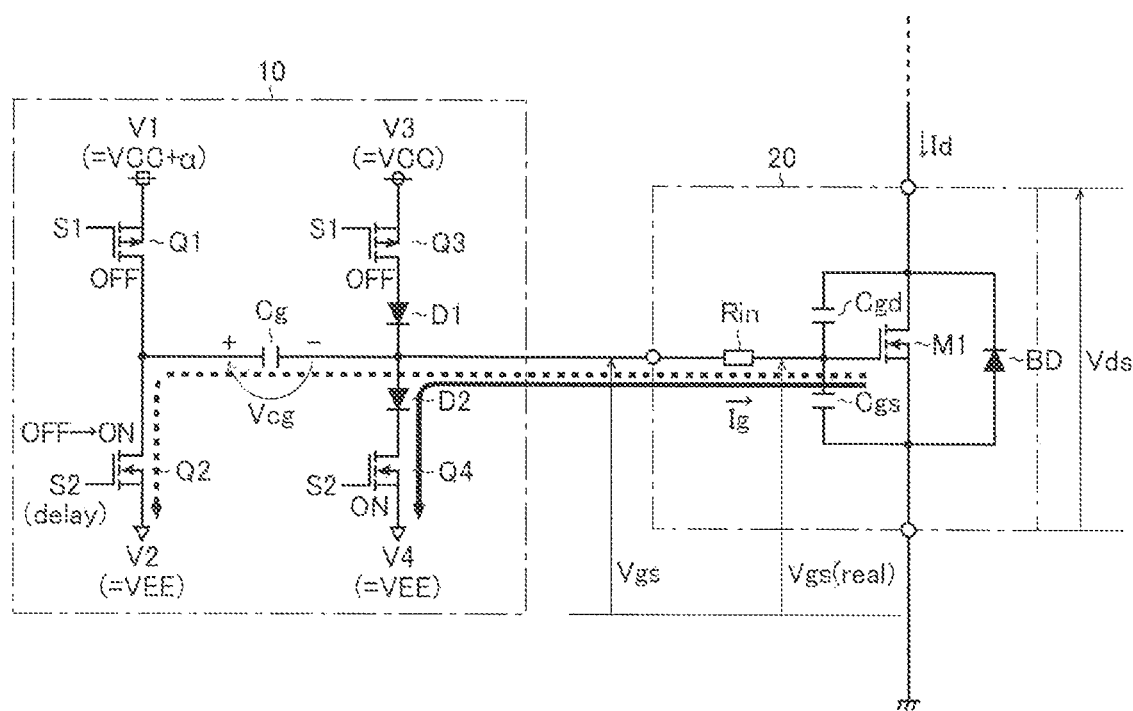
FIG. 33 is a current path diagram for explaining a principle of operation (when being turned off) in the eleventh embodiment.

In the following description, a technical meaning of the delaying process described above is described in detail with reference to FIGS. 33 and 34. FIG. 33 is a current path diagram for explaining a principle of operation of the eleventh embodiment (when being turned off).

Figure 34:
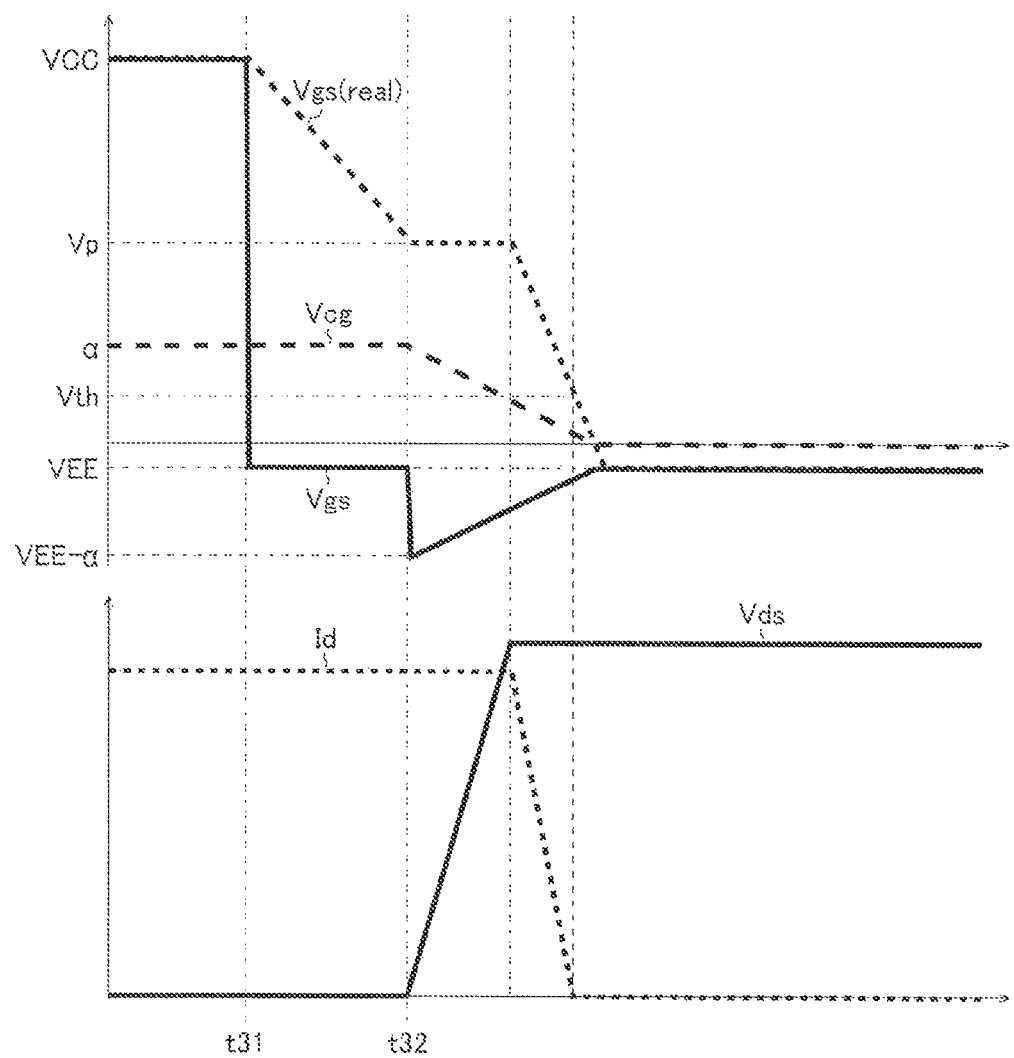
FIG. 34 is a switching waveform diagram of turn-off transient characteristics in the eleventh embodiment.

Further, FIG. 34 is a switching waveform diagram showing turn-off transient characteristics of the eleventh embodiment. Note that in the same manner as in FIG. 29 described above, the upper part of this diagram shows the gate-source voltages Vgs (a solid line) and Vgs(real) (a short dashed line), and the charged voltage Vcg (a long dashed line). On the other hand, the lower part of this diagram shows the drain-source voltage Vds (a solid line) and the drain current Id (broken line).

In the eleventh embodiment, when the switching element 20 is turned off, the transistor Q4 is ON while the transistor Q2 remains off by the delaying process described above. As a result, immediately after the switching element 20 begins to be turned off (from time t31 to time t32 in FIG. 34), the current flows in a current path indicated by a solid line arrow in FIG. 33 (M1 to Rin to D2 to Q4 to V4). Therefore, in this period, without using the charged voltage Vcg of the capacitor Cg charged while the switching element 20 is turned on, the input capacitance Ciss of the transistor M1 is discharged. Note that the time necessary for the gate-source voltage Vgs(real) to decrease from high level (=VCC) to the plateau voltage Vp is longer than that in the tenth embodiment (FIG. 25) described above, due to the delaying process described above, but it hardly affects the switching loss.

After the delaying process described above is finished, the transistor Q2 is turned on at time t32 in FIG. 34. Then, the current begins to flow in a current path indicated by a broken line arrow in FIG. 33 (M1 to Rin to Cg to Q2 to V2). Therefore, after that, using the charged voltage Vcg of the capacitor C charged while the switching element 20 is turned on, the input capacitance Ciss of the transistor M1 is rapidly discharged. In this case, Vgs=VEE−Vcg holds so that the diode D2 is reversely biased, and hence the current that was flowing to the application terminal of the fourth voltage V4 is temporarily turned off.

Note that in order to reduce the switching loss when the switching element 20 is turned off, it is important to shorten not the time necessary for the gate-source voltage Vgs(real) to decrease from high level (=VCC) to the plateau voltage Vp but the time necessary for the gate-source voltage Vgs(real) to decrease from the plateau voltage Vp to the on threshold voltage Vth after that.

In other words, it is important to use the charged voltage Vcg of the capacitor Cg charged while the switching element 20 is turned on for discharge operation after the gate-source voltage Vgs(real) is decreased to the plateau voltage Vp.

Accordingly, in the eleventh embodiment, the ON timing of the transistor Q2 is delayed from the ON timing of the transistor Q4, so that the transistor Q2 is turned on in synchronization with the timing (i.e., the time t32) when the gate-source voltage Vgs(real) is decreased from high level (=VCC) to the plateau voltage Vp.

By this delaying process, it is possible not to decrease but to maintain the charged voltage Vcg of the capacitor Cg charged while the switching element 20 is turned on, until the gate-source voltage Vgs(real) is decreased to the plateau voltage Vp, and to begin the rapid discharge of the input capacitance Ciss using the charged voltage Vcg after the gate-source voltage Vgs(real) is decreased to the plateau voltage Vp.

Therefore, compared with the tenth embodiment (FIG. 25) in which the transistor Q2 is turned on immediately after turning off of the switching element 20, it is possible to shorten the time necessary for the gate-source voltage Vgs (real) to decrease from the plateau voltage Vp to the on threshold voltage Vth, and hence a switching loss when being turned off can be suppressed more effectively.

Note that without adjusting the ON timing of the transistor Q2 exactly to the time t32, the effect can be expected to a certain extent.

After that, discharge of the capacitor Cg proceeds, and when Vgs=VEE is satisfied, the diode D2 is forwardly biased, and the current begins to flow again in the current path indicated by the solid line arrow in FIG. 33 (M1 to Rin to D2 to Q4 to V4). Therefore, in the period after this, discharge of the input capacitance Ciss is continued using the fourth voltage V4 (=VEE).

Further, the gate current Ig does not flow ultimately, and then the gate-source voltage Vgs(real) is fixed to the fourth voltage V4 (=VEE) Then, Vcg=0 holds. In this way, the capacitor Cg can be completely discharged, and hence there is no influence when being turned on next time. These points are the same as in the tenth embodiment (FIG. 25) described above.

Twelfth Embodiment

Figure 35:
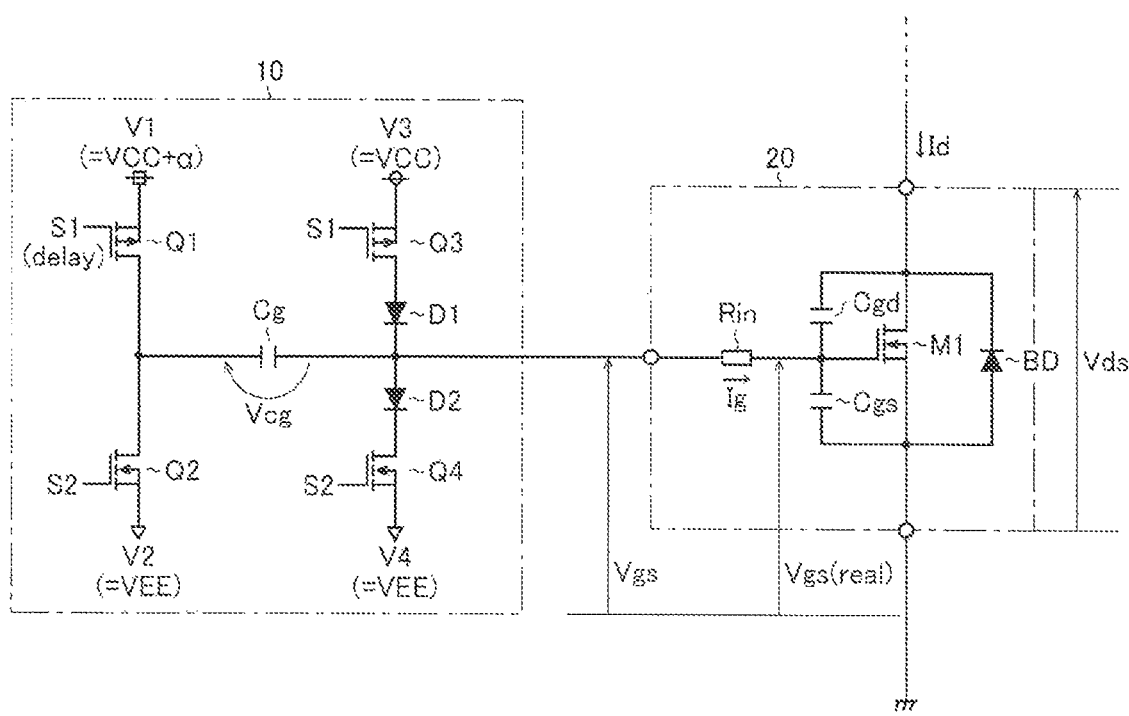
FIG. 35 is an equivalent circuit diagram illustrating a twelfth embodiment of the gate drive circuit.

FIG. 35 is an equivalent circuit diagram illustrating a twelfth embodiment of the gate drive circuit. The gate drive circuit 10 of this embodiment is based on the tenth embodiment (FIG. 25), and when the switching element 20 is turned on, the ON timing of the transistor Q1 is delayed from the ON timing of the transistor Q3 (by 30 ns for example). Note that as means for realizing this embodiment, for example, a delay circuit (not shown) should be provided, which delays only a falling timing of the control signal S1 and outputs the same to the gate of the transistor Q1.

Figure 36:
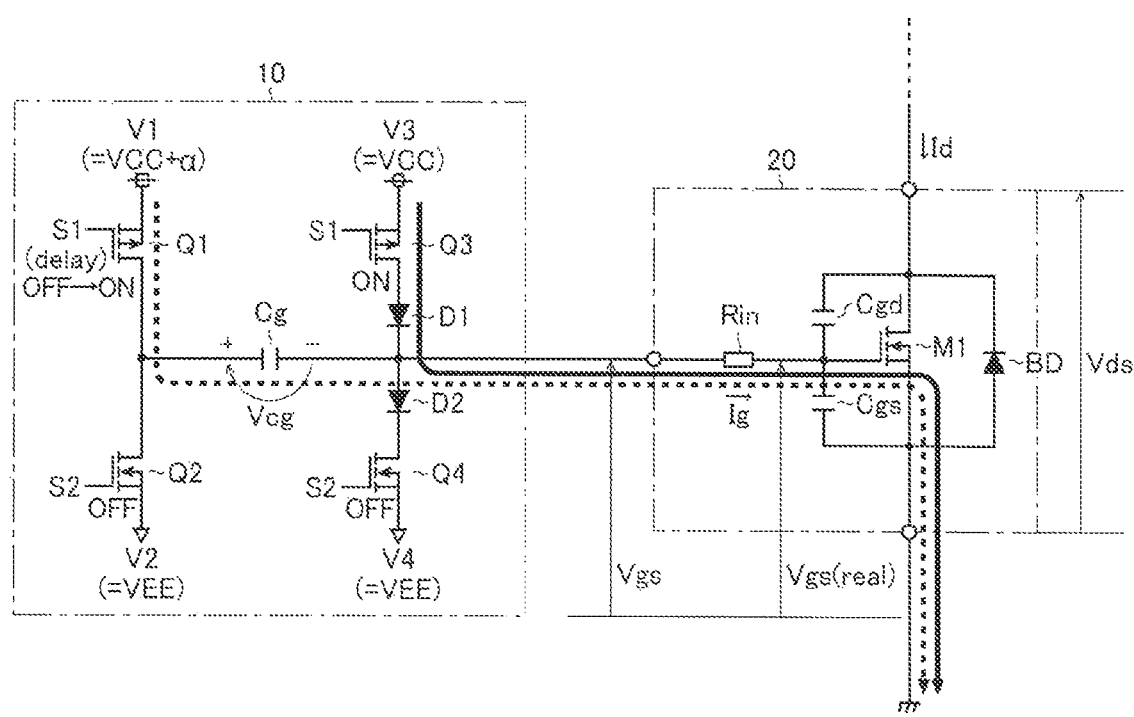
FIG. 36 is a current path diagram for explaining a principle of operation (when being turned on) in the twelfth embodiment.

In the following description a technical meaning of the delaying process described above is described in detail with reference to FIGS. 36 and 37. FIG. 36 is a current path diagram for explaining a principle of operation of the twelfth embodiment (when being turned on).

Figure 37:
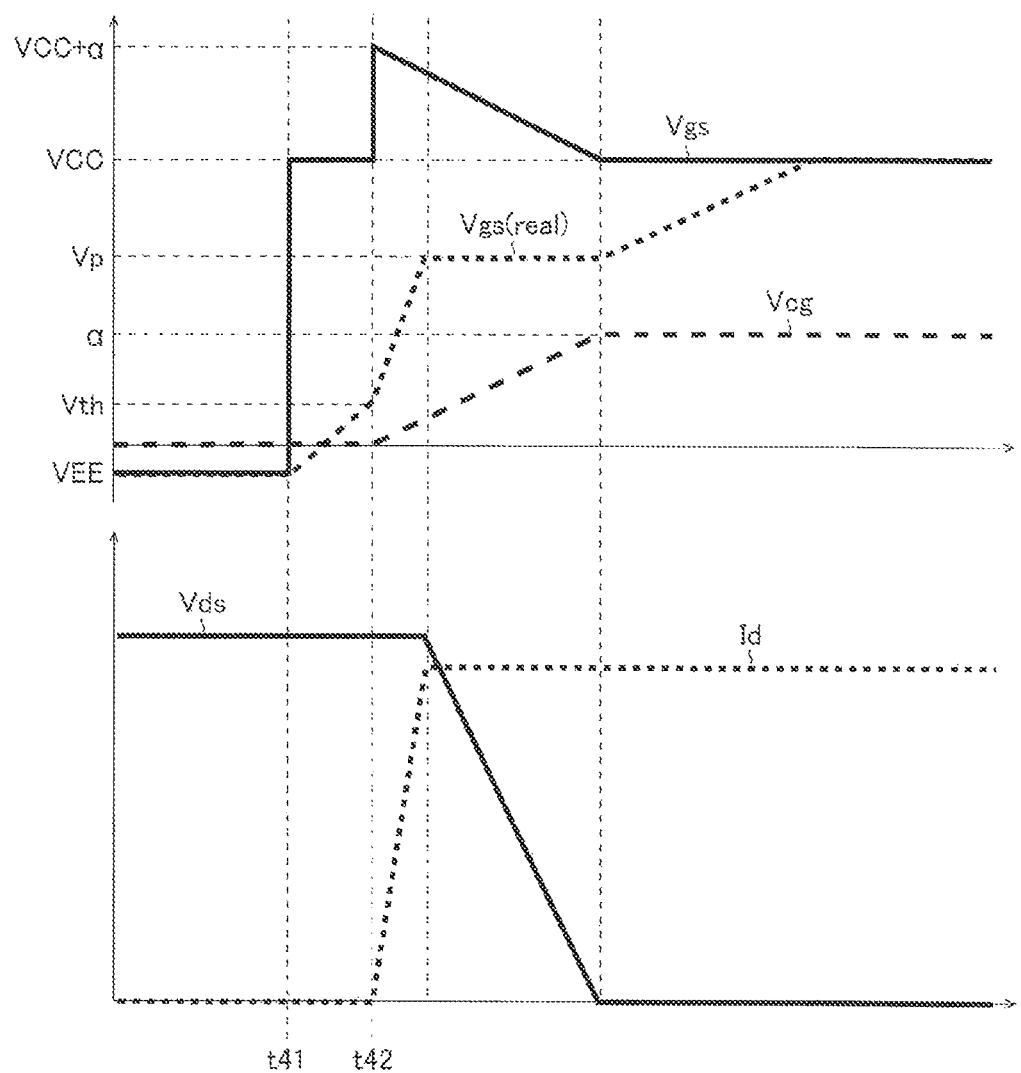
FIG. 37 is a switching waveform diagram of turn-on transient characteristics in the twelfth embodiment.

Further, FIG. 37 is a switching waveform diagram showing turn-on transient characteristics of the twelfth embodiment. Note that, in the same manner as in FIG. 27 described above, the upper part of this diagram shows the gate-source voltages Vgs (a solid line) and Vgs(real) (a short dashed line), and the charged voltage Vcg (a long dashed line). On the other hand, the lower part of this diagram shows the drain-source voltage Vds (a solid line) and the drain current Id (broken line).

In the twelfth embodiment, when the switching element 20 is turned on, the transistor Q3 is tuned ca while the transistor Q1 remains off by the delaying process described above. As a remit, immediately after the turning on of the switching element 20 is started (from time t41 to time t42 in FIG. 37), the current flows in a current path indicated by a solid line arrow in FIG. 36 (V3 to Q3 to D1 to Rin to M1 to GND). Therefore, during this period, without using the first voltage V1 (=VCC+α), the input capacitance Ciss of the transistor M1 is charged. In other words, the charged voltage Vcg of the capacitor Cg is maintained at 0 V. Note that the time necessary for the gate-source voltage Vgs(real) to increase from low level (=0 V) to the on threshold voltage Vth is longer than that in the tenth embodiment (FIG. 25) described above, due to the delaying process described above, but it hardly affects the switching loss.

After the delaying process described above is finished, the transistor Q1 is turned on or at time t42 in FIG. 37. Then, the current begins to flow in a current path indicated by a broken line arrow in FIG. 36 (V1 to Q1 to Cg to Rin to M1 to GND). Therefore, after that, using the first voltage V1 (=VCC+α), the input capacitance Ciss of the transistor M1 is rapidly charged. In this case, Vgs>VCC holds so that the diode D1 is reversely biased, and hence the current that was flowing from the application terminal of the third voltage V3 is temporarily turned off.

Note that in order to reduce the switching loss when the switching element 20 is turned on, it is important to shorten not the time necessary for the gate-source voltage Vgs(real) to increase from low level (=0 V) to the on threshold voltage Vth but the time for the gate-source voltage Vgs(real) to increase from the on threshold voltage Vth to the plateau voltage Vp after that.

In other words, it is important to use the capacitor Cg for the charging operation after the gate-source voltage Vgs (real) is increased to the plateau voltage Vp.

Accordingly, in the twelfth embodiment, the ON timing of the transistor Q1 is delayed from the ON timing of the transistor Q3, so that the transistor Q1 is turned on in synchronization with the timing (i.e., time t42) when the gate-source voltage Vgs(real) increases from low level (=0 V) to the on threshold voltage Vth.

By this delaying process, it is possible to maintain the charged voltage Vcg at 0 V without using the capacitor Cg until the gate-source voltage Vgs(real) increases to the on threshold voltage Vth, and to begin the rapid charging of the input capacitance Ciss using the capacitor Cg after the gate-source voltage Vgs(real) increases to the on threshold voltage Vth.

Therefore, compared with the tenth embodiment (FIG. 23) in which the transistor Q1 is turned on immediately after turning on of the switching element 20, it is possible to shorten the time necessary for the gate-source voltage Vgs (real) to increase from the on threshold voltage Vth to the plateau voltage Vp, and hence a switching loss when being turned on can be suppressed more effectively.

Note that without au sting the ON timing of the transistor Q1 exactly to the time t42, the effect can be expected to a certain extent.

After that, charging of the capacitor Cg proceeds, and when Vgs=VCC is satisfied, the diode D1 is forwardly biased, and the current begins to flow again in the current path indicated by the solid line arrow in FIG. 36 (V3 to Q3 to D1 to Rin to M1 to GND). Therefore, in the period after this, charging of the input capacitance Ciss is continued using the third voltage V3 (=VCC).

Further, the gate current Ig does not flow ultimately, and then gate-source voltage Vgs(real) is fixed to the third voltage V3 (=VCC). Then, Vcg=α holds. These points are the same as in the tenth embodiment (FIG. 23) described above.

Thirteenth Embodiment

FIG. 3 is man equivalent circuit diagram illustrating a thirteenth embodiment of the gate drive circuit. The gate drive circuit 10 of this embodiment is based on the tenth embodiment (FIG. 25), and when the switching element 20 is turned off, the ON timing of the transistor Q2 is delayed from the ON timing of the transistor Q4. In addition, when the switching element 20 is turned on, the ON timing of the transistor Q1 is delayed from the ON timing of the transistor Q3. In other words, this embodiment corresponds to a combination of the eleventh embodiment (FIG. 32) and the twelfth embodiment (FIG. 35) described above. This structure enables to suppress a switching loss more effectively both when being turned on and when being turned off.

Fourteenth Embodiment

Figure 39:
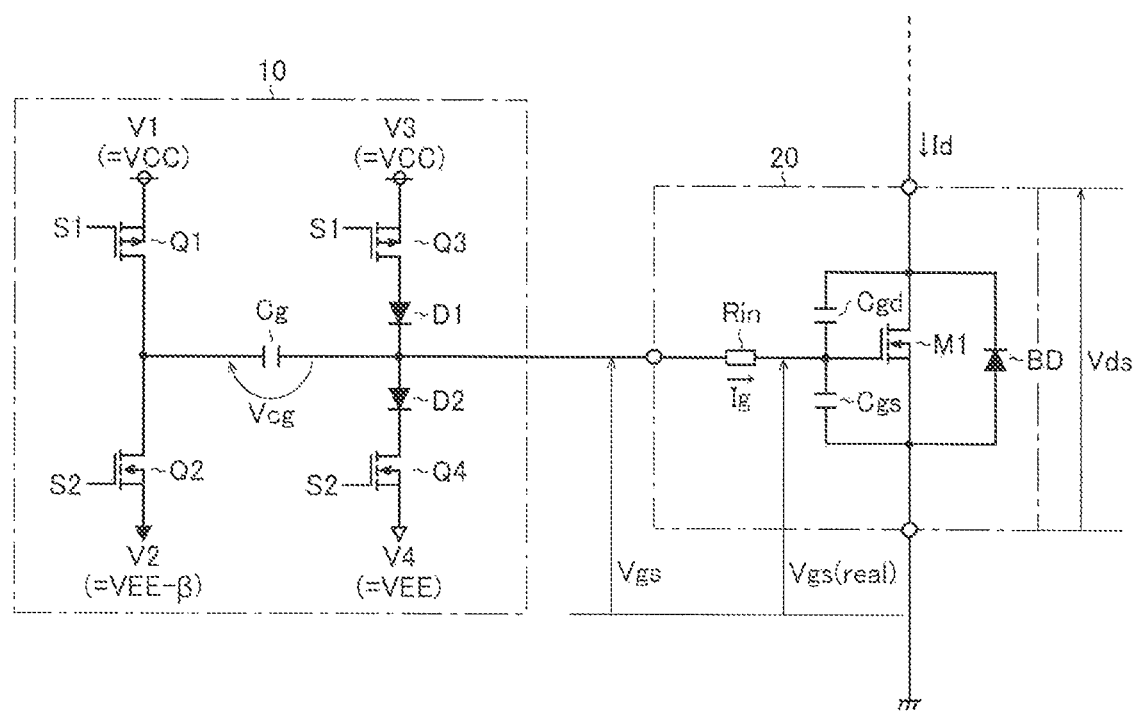
FIG. 39 is an equivalent circuit diagram illustrating a fourteenth embodiment of the gate drive circuit.

FIG. 39 as an equivalent circuit diagram illustrating a fourteenth embodiment of the gate drive circuit. The gate drive circuit 10 of this embodiment is based on the tenth embodiment (FIG. 25), and set values of the voltages V1 to V4 are changed.

More specifically, in the tenth embodiment described above, the voltages V1 to V4 are set so that the first voltage V1 (=VCC+α) is higher than the third voltage V3 (=VCC), and that the second voltage V2 (=VEE) is equal to the fourth voltage V4 (=VEE).

In contrast, in this embodiment, the voltages V1 to V4 are set so that the second voltage V2 (=VEE-β) is lower than the fourth voltage V4 (=VEE), and that the first voltage V1 (=VCC) is equal to the third voltage V3 (=VCC).

Note that the fourth voltage V4 (=VEE) should be generated from the second voltage V2 (=VEE-β). In this case, as the DC voltage conversion means, a regulator may be used or a simpler voltage division resistor circuit or voltage division capacitor circuit may be used.

In the gate drive circuit 10 of this embodiment, when the switching element 20 is turned off the rapid discharge of the input capacitance Cis using the second voltage V2 (=VEE-β) is performed. Further, in this case, the charged voltage Vcg (=β) is stored in the capacitor Cg. In contrast, when the switching element 20 is turned on, the rapid charging of the input capacitance Ciss is performed using the charged voltage Vcg (=β) stored in the capacitor Cg. Therefore, for example the voltages V1 to V4 are set so that β=α holds, and hence the same action and effect as the tenth embodiment can be obtained.

Figure 38:
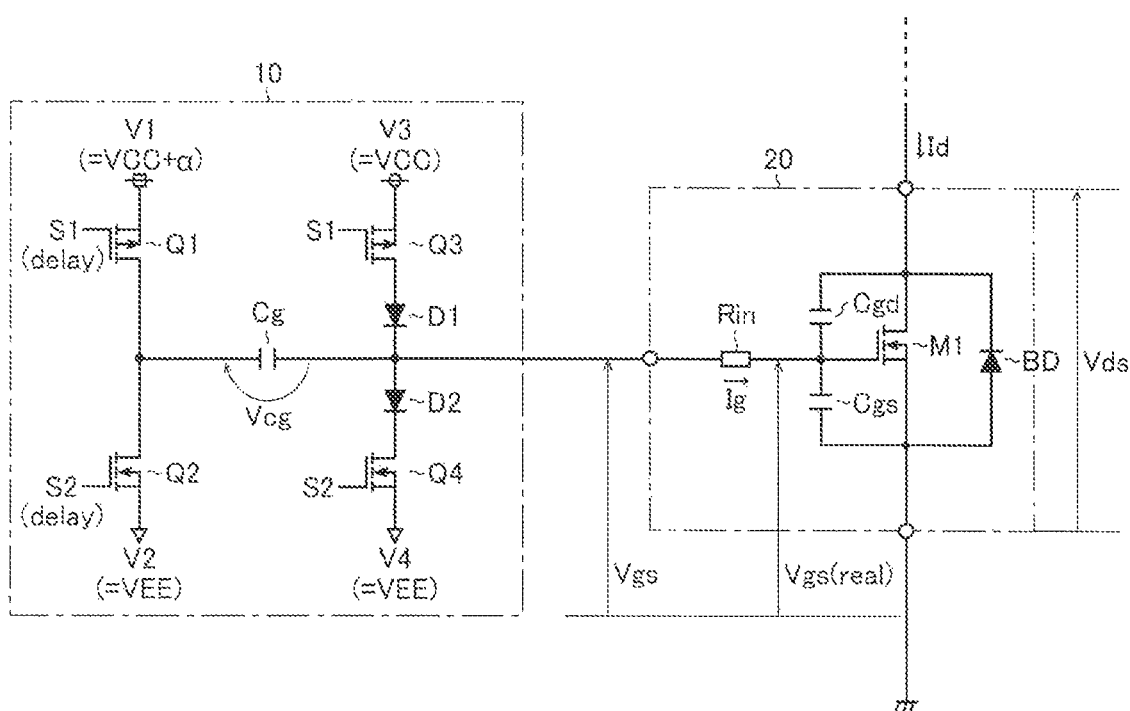
FIG. 38 is an equivalent circuit diagram illustrating a thirteenth embodiment of the gate drive circuit.

Further, although this embodiment is based on the tenth embodiment (FIG. 25), the ON timing of the transistors Q1 and Q2 may be delayed similarly to the eleventh embodiment (FIG. 32), the twelfth embodiment (FIG. 35), or the thirteenth embodiment (FIG. 38).

Fifteenth Embodiment

Figure 40:
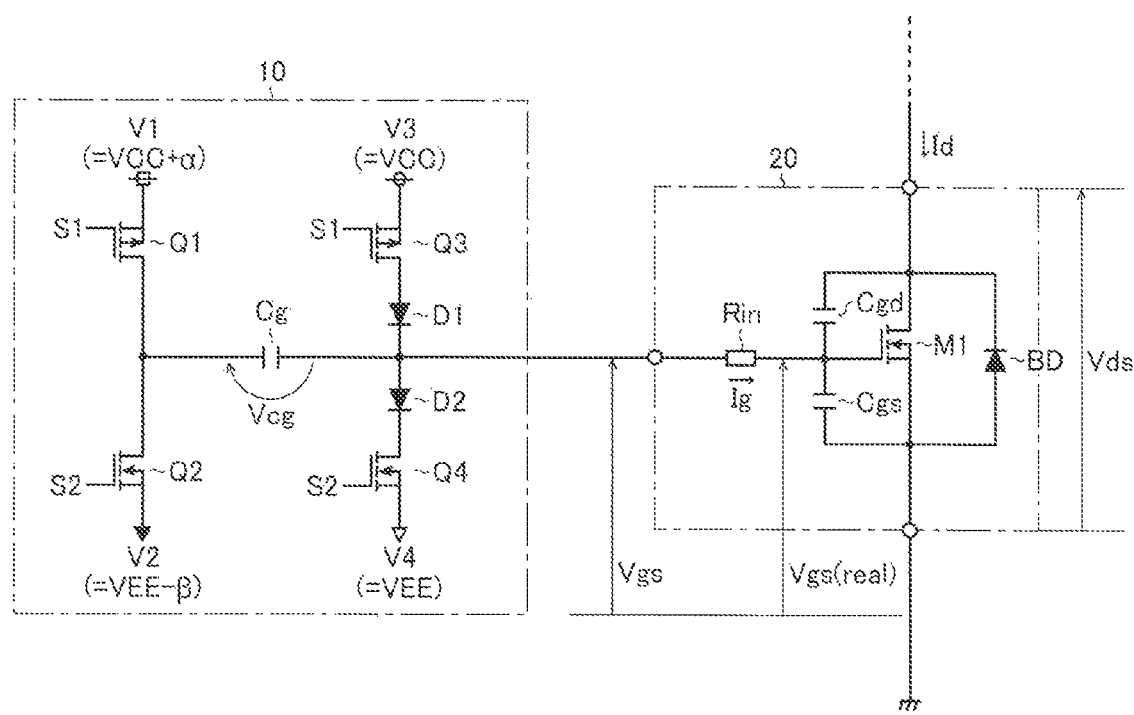
FIG. 40 is an equivalent circuit diagram illustrating a fifteenth embodiment of the gate drive circuit.

FIG. 40 is an equivalent circuit diagram illustrating a fifteenth embodiment of the gate drive circuit. The gate drive circuit 10 of this embodiment is based on the tenth embodiment (FIG. 25), and set values of the voltages V1 to V4 are changed. Specifically, in this embodiment, the voltages V1 to V4 are set so that the first voltage V1 (=VCC+α) is higher than the third voltage V3 (=VCC), and that the second voltage V2 (=VEE-β) is lower than the fourth voltage V4 (=VEE). In other words, this embodiment corresponds to a combination of the tenth embodiment (FIG. 25) and the fourteenth embodiment (FIG. 39) described above.

Adopting this embodiment, when the switching element 20 is tamed on, the rapid charging using the voltage (VCC+α+β) is performed, and when the switching element 20 is turned off, the rapid discharge using the voltage (VEE-α-β) is performed. Therefore, by appropriately setting α and β, the same action and effect as described above can be obtained.

Further, although this embodiment is based on the tenth embodiment (FIG. 25), the ON timing of the transistors Q1 and Q2 may be delayed similarly to the eleventh embodiment (FIG. 32), the twelfth embodiment (FIG. 35), or the thirteenth embodiment (FIG. 38).

Sixteenth Embodiment

Figure 41:
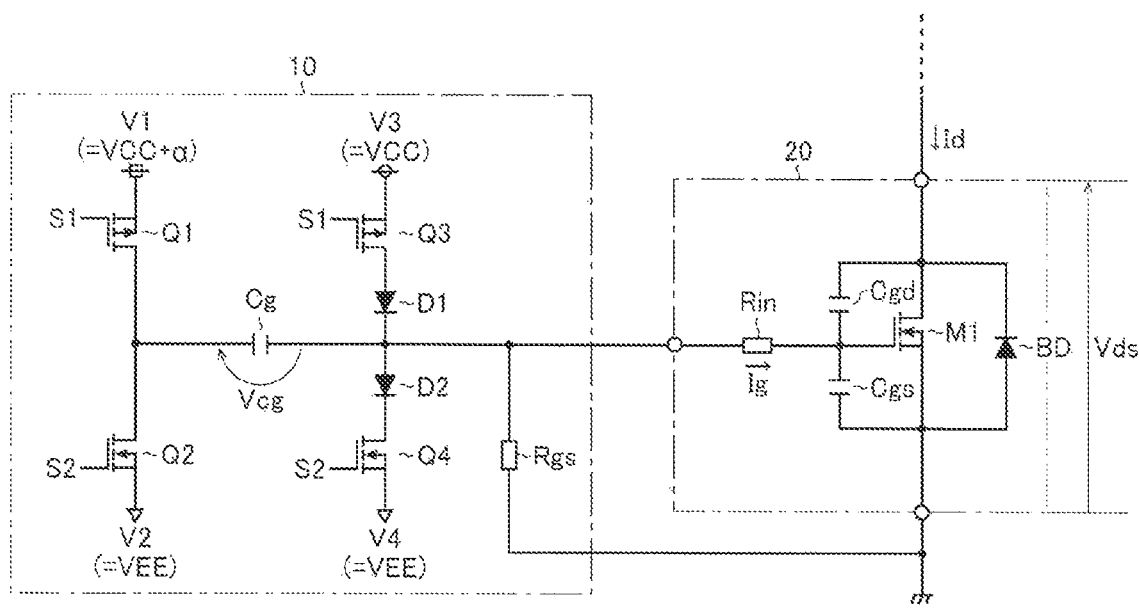
FIG. 41 is an equivalent circuit diagram illustrating a sixteenth embodiment of the gate drive circuit.

FIG. 41 is an equivalent circuit diagram illustrating a sixteenth embodiment of the gate drive circuit. The gale drive circuit 10 of this embodiment is based on the tenth embodiment (FIG. 25), and further includes the resistor Rgs connected between gate and source of the switching element 20. With this structure, the gate of the switching element 20 can be polled down, and hence the switching element 20 can be securely turned off.

Further, although this embodiment is based on the tenth embodiment (FIG. 25), it may be based on any one of the eleventh to fifteenth embodiments (FIGS. 32 to 35, 38, 39, and 40).

<Switching Module>

Next, the switching module using the gate drive circuit 10 and the switching element 20 as described above is considered.

Figure 42:
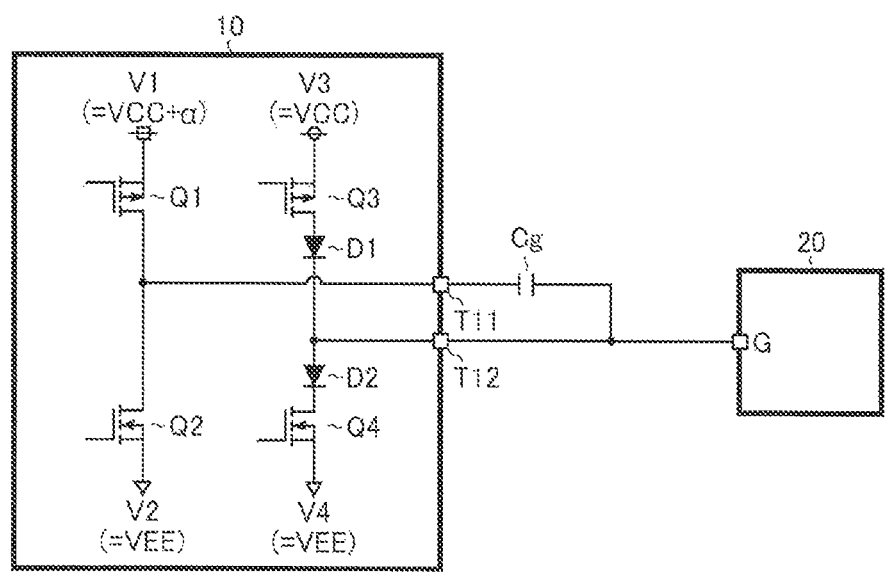
FIG. 42 is a diagram illustrating a first structural example of a switching module.

FIG. 42 is a diagram illustrating a first structural example of the switching module. In the switching module of this structural example, the gate drive circuit 10 can be understood as a semiconductor device in which the transistors Q1 to Q4 and the diodes D1 and D2 are integrated. Therefore, in the description of this diagram, for convenience sake, the gate drive circuit 10 is referred to as "semiconductor device 10".

The semiconductor device 10 has an external terminal T11 connected commonly to drains of the transistors Q1 and Q2, and an external terminal T12 connected commonly to a cathode of the diode D1 and an anode of the diode D2.

Note that when seeing the semiconductor device 10 as a chip, the external terminals T11 and T12 should be understood a pads. In contrast, when seeing the semiconductor device 10 as a package, the external terminals T11 and T12 should be understood as lead pins.

Further, the switching module of this structural example includes the semiconductor device 10, the capacitor Cg connected between the external terminals T11 and T12, and the switching element 20 whose gate is connected to the external terminal T12.

With this structure, the number of external terminals of the semiconductor device 10 is minimized, the capacitor Cg is externally connected, and the capacitance value thereof can be arbitrarily set.

Figure 43:
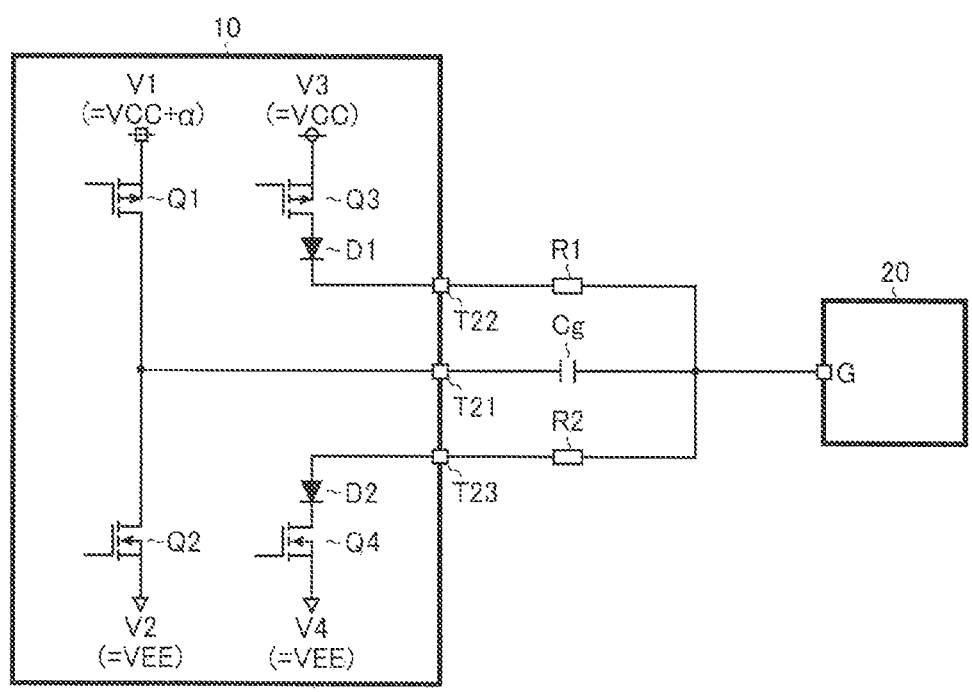
FIG. 43 is a diagram illustrating a second structural example of a switching module.

FIG. 43 is a diagram illustrating a second structural example of the switching module. In the switching module of this structural example, too, the gate drive circuit 10 can be understood as a semiconductor device in which the transistor Q1 to Q4 and the diodes D1 and D2 are integrated. Therefore, in the description of this diagram, too, for convenience sake, the gate drive circuit 10 is referred to as the "semiconductor device 10".

The semiconductor device 10 has an external terminal T21 connected commonly to drains of the transistors Q1 and Q2, an external terminal T22 connected to a cathode of the diode D1, and an external terminal T23 connected to an anode of the diode D2.

Note that when seeing the semiconductor device 10 as a chip, the external terminals T21, T22, and T23 should be understood as pads. In contrast, when seeing the semiconductor device 10 as a package, the external terminals T21, T22, and T23 should be understood as lead pins.

Further, the switching module of this structural example includes the semiconductor device 10, the capacitor Cg having a first terminal connected to the external terminal T21, a resistor R1 having a rust terminal connected to the external terminal T22, a resistor R2 having a first terminal connected to the external terminal T23, and the switching element 20 having a gate connected commonly to second terminals of the capacitor Cg and the resistors R1 and R2.

With this structure, in addition to the capacitor Cg connected externally, the resistors R1 and R2 can be externally connected in series to the diodes D1 and D2, respectively.

<DC/DC Converter>

Next, a DC/DC converter using the gate drive circuit 10 and the switching element 20 described above is considered.

Figure 44:
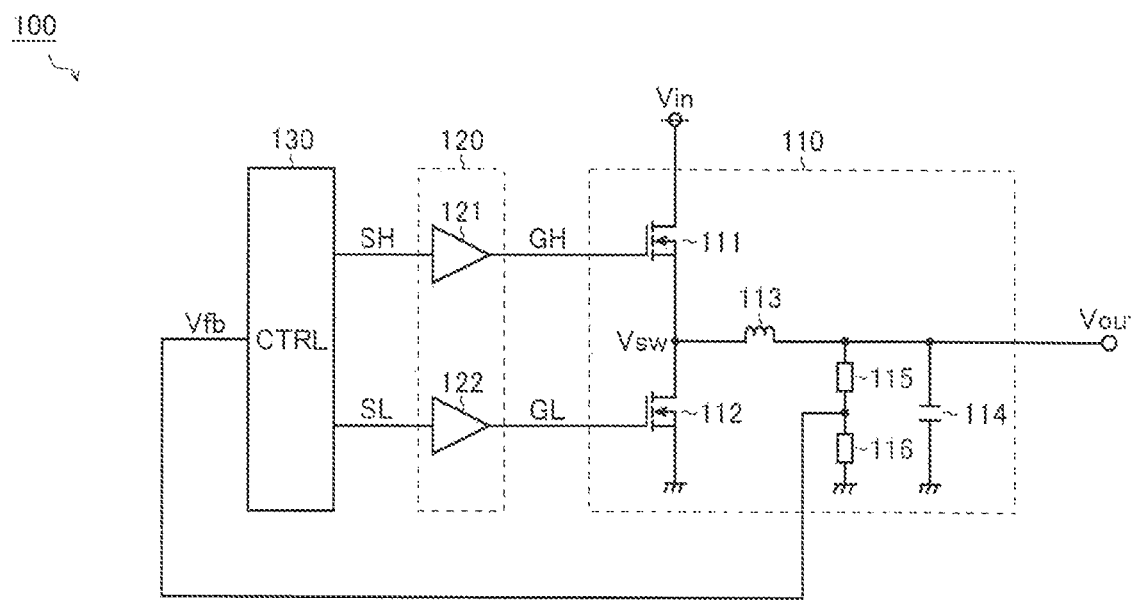
FIG. 44 is a diagram illustrating an application example to a DC/DC converter.

FIG. 44 is a diagram illustrating an application example to a DC/DC converter. A DC/DC converter 100 of this structural example includes a switching output stage 110, a driver 120, and a controller 130.

The switching output stage 110 includes an N-channel type MOS field-effect transistor 111, an N-channel type MOS field-effect transistor 112, an inductor 113, a capacitor 114, and resistors 115 and 116, and it steps down an input voltage Vin so as to generate a desired output voltage Vout.

A drain of the transistor 111 is connected to an input terminal of the input voltage Vin. A source of the transistor 111 and a drain of the transistor 112 are connected to each other, and the connection ode thereof is connected to a first terminal of the inductor 113 as an output terminal of a switch voltage Vsw. A source of the transistor 112 is connected to a ground terminal. A second terminal of the inductor 113 and a first terminal of the capacitor 114 are both connected to an output terminal of the output voltage Vout. The resistors 113 and 116 are connected in series between the output terminal of the output voltage Vout and the ground terminal, and the connection node thereof outputs a feedback voltage Vfb (i.e, a divided voltage of the output voltage Vout), which is fed back and input to the controller 130.

The transistor 111 functions as an upper side switching element (i.e. an output switching element), which is turned on and off according to an upper side gate signal GH supplied from the driver 120 (an upper side driver 121). More specifically, the transistor 111 is ON when the upper side gate signal GH is high level, while it is OFF when the upper side gate signal GH is low level.

In contrast, the transistor 112 functions as a lower side switching element (i.e. a synchronous rectifier element), which is turned on and off according to a lower side gate signal GL supplied from the driver 120 (a lower side driver 122). More specifically, the transistor 112 is ON when the lower side gate signal GL is high level, and it is OFF when the lower side gate signal GL is low level.

Note that the switching output stage 110 is a step-down type in this diagram, but it may be a step-up type or a step-up/down type. Further, without limiting to a synchronous rectification method, a diode rectification method may be adopted. Further, as the upper side switching element, a P-channel type MOS field-effect transistor may be used. Further, the switching element is not limited to the MOS field-effect transistor.

The driver 120 includes the upper side driver 121 and the lower side driver 122. The upper side driver 121 generates the upper side gate signal OH in accordance with an upper side control signal SH supplied from the controller 130, so as to drive the transistor 111. The lower side driver 122 generates the lower side gate signal GL in accordance with a lower side control signal SL supplied from the controller 130, so as to drive the transistor 112.

Note that the gate drive circuit 10 described above can be applied to each of the upper side driver 121 and the lower side driver 122 (details will be described later).

The controller 130 receives a feedback input of the feedback voltage Vfb and generates the upper side control signal SH and the lower side control signal SL so that the output voltage Vout becomes equal to its target value, so as to control the driver 120 (i.e. both the upper side driver 121 and the lower side driver 122). Note that the controller 130 may perform a digital feedback control using a micro controller unit (MCU) or the like, or may perform an analog feedback control using an error amplifier, a PWM comparator, or the like.

Figure 45:
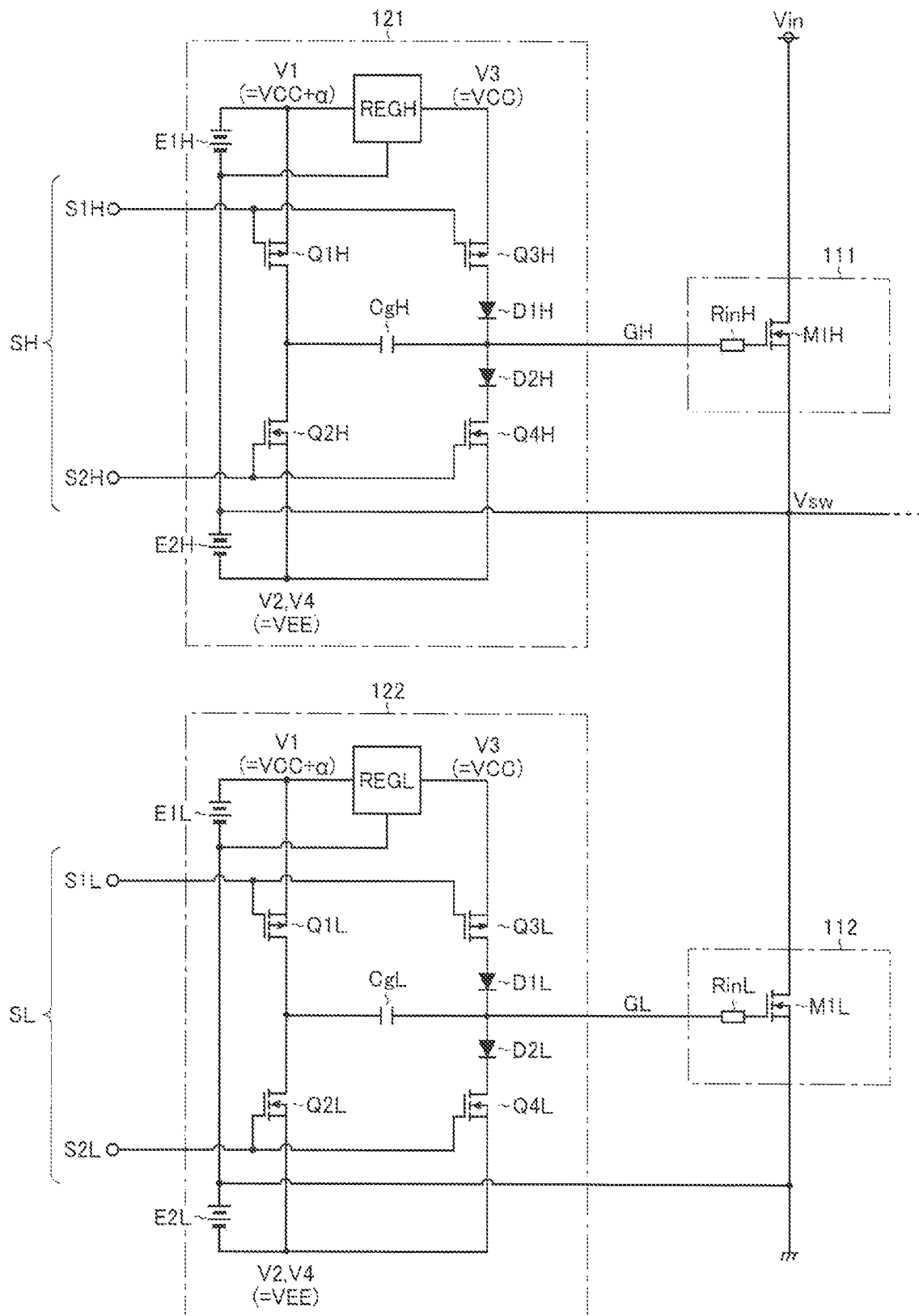
FIG. 45 is a diagram illustrating a structural example of a driver.

FIG. 45 is a diagram illustrating one structural example of the driver 120. In the driver 120 of this diagram, the gate drive circuit 10 of the tenth embodiment (FIG. 25) is applied to each of the upper side driver 121 and the lower side driver 122.

In other words, the upper side driver 121 includes transistors Q1H to Q4H, a capacitor CgH, and diodes D1H and D2H, and it receives input of the control signal SH (i.e. control signals S1H and S2H) so as to generate the gate signal OH.

Further, in the same manner as described above, the lower side driver 122 includes transistors Q1L to Q4L, a capacitor CgL, diodes D1L and D2L, and it receives input of the control signal SL (i.e. control signals S1L and S2L) so as to generate the gate signal GL.

Note that the transistors Q1H to Q4H, and Q1L to Q4L the capacitors CgH and CgL, the diodes D1H, D2H, D1L, and D2L, and the control signals S1H, S2H, S1L, and S2L described above correspond to the transistors Q1 to Q4, the capacitor Cg the diodes D1 and D2, and the control signals S1 and S2 in FIG. 25, respectively. Therefore, overlapping description for the circuit structures and operations thereof is omitted.

Further, the upper side driver 121 clearly shows voltage sources E1H and E2H, and a regulator REGH, as means for generating the voltages V1 to V4. The voltage source E1H generates the first voltage V1 (=VCC+α) with respect to Vsw. The voltage source E2H generates the second voltage V2 and the fourth voltage V4 (both equal to VEE) with respect to Vsw. The regulator REGH generates the third voltage V3 (=VCC) with respect to Vsw from the first voltage V1 (=VCC+α).

In the same manner, the lower side driver 122 clearly shows voltage sources E1L and E2L, and a regulator REGL, as means for generating the voltages V1 to V4. The voltage source E1L generates the first voltage V1 (=VCC+α) with respect to GND. The voltage source E2L generates the second voltage V2 and the fourth voltage V4 (both equal to VEE) with respect to GND. The regulator REGL generates the third voltage V3 (=VCC) with respect to GND from the first voltage V1 (=VCC+α).

Further, the upper side switching element 111 and the lower side switching element 112 are also shown as equivalent circuits including transistors M1H and M1L as well as internal gate resistors RinH and RinL, respectively, similarly to FIG. 25 described above.

Note that this diagram is based on the tenth embodiment (FIG. 25), but it may be based on any one of the eleventh to sixteenth embodiments (FIG. 32, 35, 38, 39, 40, or 41).

For instance, similarly to the eleventh embodiment (FIG. 32), if the ON timing of the transistors Q2H and Q2L are delayed from the ON timing of the transistors Q4H and Q4L, delay circuits that delay only rising timings of the control signals S2H and S2L supplied from the controller 130 should be inserted before gates of the transistors Q2H and Q2L.

Variation

Further, in the tenth to sixteenth embodiments described above, the structure including four transistors Q1 to Q4 is exemplified consistently. However, if the reduction of the number of elements should be prioritized, it is possible, for example, to eliminate the transistor Q4 and the diode D2 from the tenth embodiment (FIG. 25), or to eliminate the transistor Q3 and the diode D1 from the fourteenth embodiment (FIG. 39).

Further, as long as there is no obstruction to the gate drive operation of the switching element 20, it is arbitrary to appropriately incorporate a structural element (such as a discharge resistor) described in the first to ninth embodiments of the former part into the tenth to sixteenth embodiment of the latter part.

Other Variation

Further, in addition to the embodiments described above, various technical features disclosed in this specification can be variously modified within the scope of the technical invention without deviating from the spirit thereof. In other words, the embodiments described above are merely examples in every aspect and should not be understood as limitations. The technical scope of the present invention is defined not by the above description of the embodiments but by the claims, and should be understood to include all modifications within meanings and scopes equivalent to the claims.

INDUSTRIAL APPLICABILITY

The present invention can be used for a gate drive circuit that drives a transistor made of SiC, for example. Further, the gate drive circuit disclosed in this specification is used as means for driving a switching element of a switching power supply, a motor driver, or the like, and can be used widely in various fields of consumer appliances, industrial machinery, and the like.

LIST OF REFERENCE SIGN 1, 101, 102, 103 gate drive circuit
2 transistor
3 control unit
L inductor
C1, C2 capacitor
Q1a, Q1b, Q2, Q3 transistor
D20, D30, D40, D50 diode
E power supply
Rg internal gate resistor
Ciss input capacitance
10 gate drive circuit (semiconductor device)
20 switching element
100 DC/DC converter
110 switching output stage
111 N-channel type MOS field-effect transistor (upper side switching element)
112 N-channel type MOS field-effect transistor (lower side switching element)
113 inductor
114 capacitor
115, 116 resistor
120 driver
121 upper side driver (gale drive circuit)
122 lower side driver (gate drive circuit)
130 controller
BD body diode
Cg, CgH, CgL, Cg2 capacitor
Cgd gate-drain parasitic capacitance
Cgs gate-source parasitic capacitance
D1, D1H, D1L diode
D2, D2H, D2L diode
DCHG1, DCHG2 discharge unit
DRV1, DRV2 drive unit
E1H, E1L voltage source
E2H, E2L voltage source
M1, M1H, M1L N-channel type MOS field-effect transistor
Q1, Q1H, Q1L P-channel type MOS field-effect transistor
Q2, Q2H, Q2L N-channel type MOS field-effect transistor
Q3, Q3H, Q3L P-channel type MOS field-effect transistor
Q4, Q4H, Q4L N-channel type MOS field-effect transistor
R1, R2 resistor
REGH, REGL regulator
Rg(on) external gate resistor
Rin, RinH, RinL internal gate resistor
Rg, Rgs, Rg2 resistor
SW, SW1, SW2 switch
T11, T12, T21, T22, T23 external terminal
V1, V2, V3, V4 gate drive voltage source
S1, S1H, S1H control signal
S2, S2H, S2L control signal
SH, SL control signal
GH upper side gate signal
GL lower side gate signal
Vin input voltage
Vout output voltage
Vsw switch voltage

The invention claimed is:

1. A gate drive circuit comprising:
a first transistor having a first terminal connected to an application terminal of a first voltage and a second terminal connected to a gate of a switching element via a capacitor;
a second transistor having a first terminal connected to the gate of the switching element via the capacitor and a second terminal connected to an application terminal of a second voltage lower than the first voltage, the second transistor being driven in the opposite phase to the first transistor;
a third transistor having a first terminal connected to an application terminal of a third voltage higher than the second voltage and a second terminal connected to the gate of the switching element via a first rectifier element, the third transistor being driven in the same phase as the first transistor; and
a fourth transistor having a first terminal connected to the gate of the switching element via a second rectifier element and a second terminal connected to an application terminal of a fourth voltage lower than the third voltage, the fourth transistor being driven in the same phase as the second transistor, wherein
the first voltage is higher than the third voltage while the second voltage is equal to the fourth voltage, or the second voltage is lower than the fourth voltage while the first voltage is equal to the third voltage, or the first voltage is higher than the third voltage while the second voltage is lower than the fourth voltage.

2. The gate drive circuit according to claim 1, wherein an ON timing of the second transistor is delayed from an ON timing of the fourth transistor.

3. The gate drive circuit according to claim 1, wherein an ON timing of the first transistor is delayed from an ON timing of the third transistor.

4. The gate drive circuit according to claim 1, further comprising a leak resistor connected between gate and source of the switching element.

5. The gate drive circuit according to claim 1, further comprising at least one of a first regulator arranged to generate the third voltage from the first voltage and a second regulator arranged to generate the fourth voltage from the second voltage.

6. A semiconductor device, wherein the gate drive circuit according to claim 1 is integrated.

7. A DC/DC converter comprising:
a switching output stage including an upper side switching element and a lower side switching element;
an upper side driver arranged to drive the upper side switching element;
a lower side driver arranged to drive the lower side switching element; and
a controller arranged to control both the upper side driver and the lower side driver, wherein
the gate drive circuit according to claim 1 is used as at least one of the upper side driver and the lower side driver.

8. The semiconductor device according to claim 6 comprising:
a first external terminal connected commonly to a second terminal of the first transistor and a first terminal of the second transistor; and
a second external terminal connected commonly to one terminal of the first rectifier element and one terminal of the second rectifier element.

9. A switching module comprising:
the semiconductor device according to claim 8;
a capacitor connected between the first external terminal and the second external terminal of the semiconductor device; and
a switching element having a gate connected to the second external terminal of the semiconductor device.

10. The switching module according to claim 9, wherein the switching element is a SiC device.

11. The semiconductor device according to claim 6, comprising:
a first external terminal connected commonly to a second terminal of the first transistor and a first terminal of the second transistor;
a second external terminal connected to one terminal of the first rectifier element; and
a third external terminal connected to one terminal of the second rectifier element.

12. A switching module comprising:
the semiconductor device according to claim 11;
a capacitor having a first terminal connected to the first external terminal of the semiconductor device;
a first resistor having a first terminal connected to the second external terminal of the semiconductor device;
a second resistor having a first terminal connected to the third external terminal of the semiconductor device, and
a switching element having a gate connected commonly to second terminals of the capacitor, the first resistor, and the second resistor.

13. A gate drive circuit comprising:
a first transistor having a first terminal connected to an application terminal of a first voltage and a second terminal connected to a gate of a switching element via a capacitor;
a second transistor having a first terminal connected to the gate of the switching element via the capacitor and a second terminal connected to an application terminal of a second voltage lower than the first voltage, the second transistor being driven in the opposite phase to the first transistor; and
one of a third transistor and a fourth transistor, the third transistor having a first terminal connected to an application terminal of a third voltage lower than the first voltage and higher than the second voltage, and a second terminal connected to the gate of the switching element via a first rectifier element, the third transistor being driven in the same phase as the first transistor, the fourth transistor having a first terminal connected to the gate of the switching element via a second rectifier element, and a second terminal connected to an application terminal of a fourth voltage higher than the second voltage and lower than the first voltage, the fourth transistor being driven in the same phase as the second transistor.

* * * * *